United States Patent
Park et al.

(10) Patent No.: US 11,711,930 B2
(45) Date of Patent: Jul. 25, 2023

(54) PHOTOELECTRIC DEVICES AND IMAGE SENSORS AND ELECTRONIC DEVICES

(71) Applicant: Samsung Electronics Co., Ltd., Suwon-si (KR)

(72) Inventors: Kyung Bae Park, Hwaseong-si (KR); Takkyun Ro, Hwaseong-si (KR); Kiyohiko Tsutsumi, Suwon-si (KR); Chul Joon Heo, Busan (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 147 days.

(21) Appl. No.: 17/306,116

(22) Filed: May 3, 2021

(65) Prior Publication Data

US 2021/0273186 A1 Sep. 2, 2021

Related U.S. Application Data

(63) Continuation of application No. 16/178,691, filed on Nov. 2, 2018, now Pat. No. 10,998,514.

(30) Foreign Application Priority Data

Dec. 1, 2017 (KR) .......................... 10-2017-0164147

(51) Int. Cl.
*H01L 27/146* (2006.01)
*H10K 30/10* (2023.01)
(Continued)

(52) U.S. Cl.
CPC ....... *H10K 30/10* (2023.02); *H01L 27/14647* (2013.01); *H01L 27/14665* (2013.01);
(Continued)

(58) Field of Classification Search
CPC ........ H10K 30/10; H10K 30/81; H10K 39/32; H10K 85/211; H01L 27/14647; H01L 27/14665; H01L 27/14621
See application file for complete search history.

(56) References Cited

U.S. PATENT DOCUMENTS 7,667,391 B2 2/2010 Duarte et al.
8,519,258 B2 8/2013 Forrest et al.
(Continued)

FOREIGN PATENT DOCUMENTS

EP 2385556 A1 11/2011
EP 2978023 A2 1/2016
(Continued)

OTHER PUBLICATIONS

Efficient Synthesis of 2-Iodo and 2-Dicyanomethyl Derivatives of Thiophene, Selenophene, Tellurophene and Thieno[3,2-b]thiophene, Takahashi, K.; Tarutani, S. Heterocycles 1996, 43, 1927-1935.
(Continued)

*Primary Examiner* — David Vu
*Assistant Examiner* — Brandon C Fox
(74) *Attorney, Agent, or Firm* — Harness, Dickey & Pierce, P.L.C.

(57) ABSTRACT

A photoelectric device includes a first photoelectric conversion layer including a heterojunction that includes a first p-type semiconductor and a first n-type semiconductor, a second photoelectric conversion layer on the first photoelectric conversion layer and including a heterojunction that includes a second p-type semiconductor and a second n-type semiconductor. A peak absorption wavelength ($\lambda_{max1}$) of the first photoelectric conversion layer and a peak absorption wavelength ($\lambda_{max2}$) of the second photoelectric conversion layer are included in a common wavelength spectrum of
(Continued)

light that is one wavelength spectrum of light of a red wavelength spectrum of light, a green wavelength spectrum of light, a blue wavelength spectrum of light, a near infrared wavelength spectrum of light, or an ultraviolet wavelength spectrum of light, and a light-absorption full width at half maximum (FWHM) of the second photoelectric conversion layer is narrower than an FWHM of the first photoelectric conversion layer.

21 Claims, 19 Drawing Sheets

(51) Int. Cl.
  H10K 39/32     (2023.01)
  H10K 30/81     (2023.01)
  H10K 85/20     (2023.01)
  H10K 85/60     (2023.01)
  H10K 30/30     (2023.01)
  H10K 30/57     (2023.01)
  H10K 102/10    (2023.01)
(52) U.S. Cl.
  CPC ............ H10K 30/81 (2023.02); H10K 39/32 (2023.02); H10K 85/211 (2023.02); H10K 85/636 (2023.02); H10K 85/657 (2023.02); H01L 27/14621 (2013.01); H10K 30/30 (2023.02); H10K 30/57 (2023.02); H10K 85/633 (2023.02); H10K 85/652 (2023.02); H10K 85/6572 (2023.02); H10K 85/6576 (2023.02); H10K 2102/103 (2023.02)

(56) References Cited

U.S. PATENT DOCUMENTS

| | | | |
|---|---|---|---|
| 8,766,280 | B2 | 7/2014 | Thoumazet et al. |
| 9,159,753 | B2 | 10/2015 | Hynecek |
| 9,508,945 | B2 | 11/2016 | Holmes et al. |
| 9,735,365 | B2 | 8/2017 | Kim et al. |
| 2009/0165850 | A1 | 7/2009 | Saita et al. |
| 2009/0179291 | A1 | 7/2009 | Nam et al. |
| 2010/0276670 | A1 | 11/2010 | Shen et al. |
| 2011/0214736 | A1 | 9/2011 | Lee et al. |
| 2013/0104968 | A1 | 5/2013 | Pfeiffer et al. |
| 2015/0311470 | A1 | 10/2015 | Guimard et al. |
| 2016/0020258 | A1 | 1/2016 | Park et al. |
| 2016/0233448 | A1 | 8/2016 | Yang et al. |
| 2016/0260920 | A1 | 9/2016 | Rausch et al. |
| 2016/0343966 | A1 | 11/2016 | Forrest et al. |
| 2017/0054089 | A1* | 2/2017 | Obana ............... H10K 85/311 |
| 2017/0250227 | A1 | 8/2017 | Park et al. |

FOREIGN PATENT DOCUMENTS

| | | | |
|---|---|---|---|
| EP | 2978023 | A3 | 2/2016 |
| KR | 20150054550 | A | 5/2015 |
| KR | 101514207 | B1 | 6/2015 |
| KR | 101636687 | B1 | 7/2016 |
| WO | WO-2015150120 | A2 | 10/2015 |

OTHER PUBLICATIONS

Preparation and Some Reactions of Phenoxazine and Phenoselenazine, Paulette Muller, N. P. Buu-HI and R. Rips, J. Org. Chem., 1959, 24 1, pp. 37-39.
Synthesis of 1-Aryl-1H-PYRROLO[2,3-b]PYRIDINES (1-Aryl-7-Azaindoles) by a Thermal Dehydration-Cyclization-Dehydrogenation Sequence of 2-Arylamino-3-(1-Hydroxyalkyl)Pyridines, Heterocycles vol. 75, 11, 2735-2744 (2008).
Meisel et al., Pharmazie 39, H. 10 (1984).
Ingmar Burder et al., "Efficient organic tandem cell combining a solid state dye-sensitized and a vacuum deposited bulk heterojunction solar cell", Solar Energy Materials & Solar Cells 93 (Oct. 1, 2009) p. 1896-1899, doi:10.1016/j.solmat.2009.05.020.
Partial European Search Report dated Apr. 25, 2019 for corresponding European Application No. 18207585.3.
Extended European Search Report dated Oct. 9, 2019 for corresponding European Application No. 18207585.3.
Steinmann V. et al., "An efficient merocyanine/zinc phthalocyanine tandem solar cell", Organic Electronics, vol. 14, No. 8, Apr. 20, 2013, pp. 2029-2033.
European Communication pursuant to Article 94(3) EPC dated Nov. 17, 2021 for corresponding European Application No. 18207585.3.
Gilot Jan et al., "Double and triple junction polymer solar cells processed from solution", Applied Physics Letters, American Institute of Physics, vol. 90, No. 15, Apr. 5, 2007, pp. 143512-1-143512-3, XP012094011, ISSN: 0003-6951, DOI: 10.1063/1.2719668.
Adebanjo Olusegun et al., "Triple junction polymer solar cells", Energy & Environmental Science, vol. 6, No. 11, Jan. 1, 2013, pp. 3150-3170, XP055860016, ISSN: 1754-5692, DOI: 10.1039/c3ee42257g.
Harald Hoppe et al., "Organic solar cells: An overview", Journal of Materials Research, vol. 19, No. 7, Jul. 1, 2004, pp. 1924-1945, XP055000317, ISSN: 0884-2914, DOI: 10.1557/JMR.2004.0252.
Farajamtalab Iman et al., "Current density of anodes, recombination rate and luminance in MEH-PPV, MDMO-PPV, and P3HT polymers in polymer light-emitting diodes", Polymer Science, vol. 58, No. 5, Sep. 1, 2016, pp. 726-731, XP055860017, ISSN: 0995-545X, DOI: 10-1134/S0965545X16050059, Retrieved from the Internet: URL:http://link.springer.com/content/pdf/10.1134/S0965545X16050059.pdf.
Chinese Office Action dated Apr. 27, 2023 for corresponding Chinese Application No. 201811423995.7, and English-language translation thereof.

* cited by examiner

PHOTOELECTRIC DEVICES AND IMAGE SENSORS AND ELECTRONIC DEVICES

CROSS-REFERENCE TO RELATED APPLICATIONS

This application is a continuation of U.S. application Ser. No. 16/178,691, filed on Nov. 2, 2018, which claims priority to and the benefit, under 35 U.S.C. § 119, of Korean Patent Application No. 10-2017-0164147 filed in the Korean Intellectual Property Office on Dec. 1, 2017, the entire contents of each of which are incorporated herein by reference.

BACKGROUND

1. Field

Photoelectric devices, image sensors, and electronic devices are disclosed.

2. Description of the Related Art

Photoelectric devices convert light into electrical signals using photoelectric effects. A given photoelectric device may include a photodiode, a phototransistor, and the like, and may be applied to ("included in") an image sensor, a solar cell, an organic light emitting diode, and the like.

Image sensors including photo-sensing devices ("photodiodes") may require high resolution and thus a small pixel.

At present, silicon photodiodes are widely used, but silicon photodiodes have a problem of deteriorated sensitivity, due to silicon photodiodes having a small absorption area due to small pixels.

Accordingly, an organic material that is capable of replacing silicon has been researched.

An organic material has a high extinction coefficient and may selectively absorb light in a particular wavelength spectrum of light depending on a molecular structure, and thus may simultaneously replace a photodiode and a color filter and resultantly improve sensitivity and contribute to high integration.

However, since the organic material exhibits different characteristics from those of silicon due to high binding energy and a recombination behavior, the characteristics of the organic material are difficult to precisely predict, and thus required properties of a photoelectric device may not be easily controlled.

SUMMARY

Some example embodiments provide a photoelectric device configured to simultaneously satisfy optical properties, electrical characteristics, and thermal resistance properties.

Some example embodiments provide an image sensor including the photoelectric device.

Yet some example embodiments provide an electronic device including the image sensor.

According to some example embodiments, a photoelectric device may include a first electrode, a first photoelectric conversion layer on the first electrode, a second photoelectric conversion layer on the first photoelectric conversion layer, and a second electrode on the second photoelectric conversion layer. The first photoelectric conversion layer may include a first heterojunction that includes a first p-type semiconductor and a first n-type semiconductor. The second photoelectric conversion layer may include a second heterojunction that includes a second p-type semiconductor and a second n-type semiconductor. The first photoelectric conversion layer may be associated with a first peak absorption wavelength ($\lambda_{max1}$). The second photoelectric conversion layer may be associated with a second peak absorption wavelength ($\lambda_{max2}$). Both of the first peak absorption wavelength and the second peak absorption wavelength may be included in a common wavelength spectrum of light, the common wavelength spectrum of light being one wavelength spectrum of light of a red wavelength spectrum of light, a green wavelength spectrum of light, a blue wavelength spectrum of light, a near infrared wavelength spectrum of light, or an ultraviolet wavelength spectrum of light. A light-absorption full width at half maximum (FWHM) of the second photoelectric conversion layer may be narrower than an FWHM of the first photoelectric conversion layer.

An extinction coefficient at the second peak absorption wavelength ($\lambda_{max2}$) may be equal to or greater than an extinction coefficient at the first peak absorption wavelength ($\lambda_{max1}$).

External quantum efficiency at the second peak absorption wavelength ($\lambda_{max2}$) may be equal to or greater than external quantum efficiency at the first peak absorption wavelength ($\lambda_{max1}$).

An FWHM of the second p-type semiconductor may be narrower than an FWHM of the first p-type semiconductor.

The FWHM of the second photoelectric conversion layer may be about 50 nm to about 110 nm, and the FWHM of the first photoelectric conversion layer may be about 100 nm to about 130 nm.

Charge mobility of the first photoelectric conversion layer may be greater than charge mobility of the second photoelectric conversion layer.

Charge mobility of the first p-type semiconductor may be greater than charge mobility of the second p-type semiconductor.

A HOMO energy level of the first p-type semiconductor may be shallower than a HOMO energy level of the second p-type semiconductor.

The first n-type semiconductor and the second n-type semiconductor may each separately include fullerene or a fullerene derivative.

The common wavelength spectrum of light may be one wavelength spectrum of light of about 410 nm to about 480 nm, about 510 nm to about 560 nm, about 620 nm to about 670 nm, or about 780 nm to about 1200 nm.

A thickness of the second photoelectric conversion layer may be equal to or greater than a thickness of the first photoelectric conversion layer.

A thickness ratio of the first photoelectric conversion layer and the second photoelectric conversion layer may be about 50:50 to about 5:95.

The common wavelength spectrum of light may be one wavelength spectrum of light of about 510 nm to about 560 nm, and the FWHM of the second photoelectric conversion layer may be less than or equal to about 110 nm.

The second peak absorption wavelength ($\lambda_{max2}$) may be in a wavelength spectrum of light of about 530 nm to about 550 nm.

External quantum efficiency at the first peak absorption wavelength and external quantum efficiency at 450 nm of the first photoelectric conversion layer and the second photoelectric conversion layer may satisfy Relationship Equation 1, $EQE(2)_{\lambda max2}/EQE(2)_{450\ nm} > EQE(1)_{\lambda max1}/EQE(1)_{450\ nm}$, wherein, in Relationship Equation 1, $EQE(2)_{\lambda max2}$ is external quantum efficiency at the second peak absorption wavelength ($\lambda_{max2}$) $EQE(2)_{450\ nm}$ is external quantum efficiency at a wavelength of 450 nm of the second photoelectric conversion layer, $EQE(1)_{\lambda max1}$ is external quantum efficiency at the first peak absorption wavelength ($\lambda_{max1}$) and $EQE(1)_{450\ nm}$ is external quantum efficiency at a wavelength of 450 nm of the first photoelectric conversion layer. The second electrode may be at a light incidence side of the photoelectric device. The photoelectric device may further include a charge auxiliary layer at at least one of between the first electrode and the first photoelectric conversion layer, or between the second electrode and the second photoelectric conversion layer. The charge auxiliary layer may be configured to not substantially absorb light in a visible wavelength spectrum of light.

According to some example embodiments, a photoelectric device may include a first electrode and a second electrode facing each other; and a first photoelectric conversion layer and a second photoelectric conversion layer. Each of the first and second photoelectric conversion layers may be between the first electrode and the second electrode. Each photoelectric conversion layer of the first photoelectric conversion layer and the second photoelectric conversion layer may be configured to selectively absorb light in a green wavelength spectrum of light. External quantum efficiency at a peak absorption wavelength and external quantum efficiency at a wavelength of 450 nm of the first photoelectric conversion layer and the second photoelectric conversion layer may satisfy Relationship Equation 1, $EQE(2)_{\lambda max2}/EQE(2)_{450\ nm} > EQE(1)_{\lambda max1}/EQE(1)_{450\ nm}$, wherein in Relationship Equation 1, $EQE(2)_{\lambda max2}$ is external quantum efficiency at the second peak absorption wavelength ($\lambda_{max2}$) $EQE(2)_{450\ nm}$ is external quantum efficiency at a wavelength of 450 nm of the second photoelectric conversion layer, $EQE(1)_{\lambda max1}$ is external quantum efficiency at the first peak absorption wavelength ($\lambda_{max1}$), and $EQE(1)_{450\ nm}$ is external quantum efficiency at a wavelength of 450 nm of the first photoelectric conversion layer.

The second peak absorption wavelength ($\lambda_{max2}$) may be in a wavelength spectrum of light of about 530 nm to about 550 nm.

The first peak absorption wavelength ($\lambda_{max1}$) may be in a wavelength spectrum of light of about 510 nm to about 560 nm.

Charge mobility of the first photoelectric conversion layer may be greater than charge mobility of the second photoelectric conversion layer.

The first photoelectric conversion layer may include a first p-type semiconductor and a first n-type semiconductor, the second photoelectric conversion layer may include a second p-type semiconductor and a second n-type semiconductor, and the first p-type semiconductor and the second p-type semiconductor may be a different material each other and are configured to selectively absorb light in a green wavelength spectrum of light.

External quantum efficiency at the second peak absorption wavelength ($\lambda_{max2}$) may be equal to or greater than external quantum efficiency at the first peak absorption wavelength ($\lambda_{max1}$).

A light-absorption full width at half maximum (FWHM) of the second photoelectric conversion layer may be narrower than an FWHM of the first photoelectric conversion layer.

Charge mobility of the first p-type semiconductor may be greater than charge mobility of the second p-type semiconductor.

A HOMO energy level of the first p-type semiconductor may be shallower than a HOMO energy level of the second p-type semiconductor.

The first n-type semiconductor and the second n-type semiconductor may each separately include fullerene or a fullerene derivative.

An image sensor may include the photoelectric device.

An electronic device may include the image sensor.

According to some example embodiments, a photoelectric device may include a first photoelectric conversion layer including a first heterojunction that includes a first p-type semiconductor and a first n-type semiconductor, and a second photoelectric conversion layer on the first photoelectric conversion layer, the second photoelectric conversion layer including a second heterojunction that includes a second p-type semiconductor and a second n-type semiconductor. The first photoelectric conversion layer may be associated with a first peak absorption wavelength ($\lambda_{max1}$), the second photoelectric conversion layer may be associated with a second peak absorption wavelength ($\lambda_{max2}$), both of the first peak absorption wavelength and the second peak absorption wavelength may be included in a common wavelength spectrum of light, the common wavelength spectrum of light being one wavelength spectrum of light of a red wavelength spectrum of light, a green wavelength spectrum of light, a blue wavelength spectrum of light, a near infrared wavelength spectrum of light, or an ultraviolet wavelength spectrum of light. A light-absorption full width at half maximum (FWHM) of the second photoelectric conversion layer may be narrower than an FWHM of the first photoelectric conversion layer.

An extinction coefficient at the second peak absorption wavelength ($\lambda_{max2}$) may be equal to or greater than an extinction coefficient at the first peak absorption wavelength ($\lambda_{max1}$).

External quantum efficiency at the second peak absorption wavelength ($\lambda_{max2}$) may be equal to or greater than external quantum efficiency at the first peak absorption wavelength ($\lambda_{max1}$).

An FWHM of the second p-type semiconductor may be narrower than an FWHM of the first p-type semiconductor.

The FWHM of the second photoelectric conversion layer may be about 50 nm to about 110 nm, and the FWHM of the first photoelectric conversion layer may be about 100 nm to about 130 nm.

Charge mobility of the first photoelectric conversion layer may be greater than charge mobility of the second photoelectric conversion layer.

The first n-type semiconductor and the second n-type semiconductor may each separately include fullerene or a fullerene derivative.

The common wavelength spectrum of light is one wavelength spectrum of light of about 410 nm to about 480 nm, about 510 nm to about 560 nm, about 620 nm to about 670 nm, or about 780 nm to about 1200 nm.

The common wavelength spectrum of light may be one wavelength spectrum of light of about 510 nm to about 560 nm, and the FWHM of the second photoelectric conversion layer may be less than or equal to about 110 nm.

External quantum efficiency at the first peak absorption wavelength and external quantum efficiency at 450 nm of the first photoelectric conversion layer and the second photoelectric conversion layer satisfy Relationship Equation 1, [Relationship Equation 1], $EQE(2)_{\lambda max2}/EQE(2)_{450\ nm} > EQE(1)_{\lambda max1}/EQE(1)_{450\ nm}$, wherein, in Relationship Equation 1, $EQE(2)_{\lambda max2}$ is external quantum efficiency at the second peak absorption wavelength ($\lambda_{max2}$), $EQE(2)_{450\ nm}$ is external quantum efficiency at a wavelength of 450 nm of the second photoelectric conversion layer, $EQE(1)_{\lambda max1}$ is external quantum efficiency at the first peak absorption wavelength ($\lambda_{max1}$), and $EQE(1)_{450\ nm}$ is external quantum efficiency at a wavelength of 450 nm of the first photoelectric conversion layer.

The photoelectric device may further include a charge auxiliary layer at at least one of between the first electrode and the first photoelectric conversion layer, or between the second electrode and the second photoelectric conversion layer. The charge auxiliary layer may be configured to not substantially absorb light in a visible wavelength spectrum of light.

According to some example embodiments, an image sensor may include a semiconductor substrate and a plurality of photoelectric devices on the semiconductor substrate. The plurality of photoelectric devices may be configured to convert different ones of blue light, green light, or red light into electric signals, respectively. Each photoelectric device of the plurality of photoelectric devices may include a first electrode, a first photoelectric conversion layer on the first electrode, the first photoelectric conversion layer including a first heterojunction that includes a first p-type semiconductor and a first n-type semiconductor, a second photoelectric conversion layer on the first photoelectric conversion layer, the second photoelectric conversion layer including a second heterojunction that includes a second p-type semiconductor and a second n-type semiconductor, and a second electrode on the second photoelectric conversion layer. The first photoelectric conversion layer may be associated with a first peak absorption wavelength ($\lambda_{max1}$), the second photoelectric conversion layer may be associated with a second peak absorption wavelength ($\lambda_{max2}$), both of the first peak absorption wavelength and the second peak absorption wavelength may be included in a common wavelength spectrum of light, the common wavelength spectrum of light may be one wavelength spectrum of light of a red wavelength spectrum of light, a green wavelength spectrum of light, a blue wavelength spectrum of light, a near infrared wavelength spectrum of light, or an ultra-violet wavelength spectrum of light. A light-absorption full width at half maximum (FWHM) of the second photoelectric conversion layer may be narrower than an FWHM of the first photoelectric conversion layer.

The image sensor may further include an infrared photoelectric device on the semiconductor substrate, where the infrared photoelectric device may be configured to convert infrared light into electric signals.

The infrared photoelectric device may be on the plurality of photoelectric devices.

The infrared photoelectric device may be between the plurality of photoelectric devices and the semiconductor substrate.

DETAILED DESCRIPTION

Figure 1:
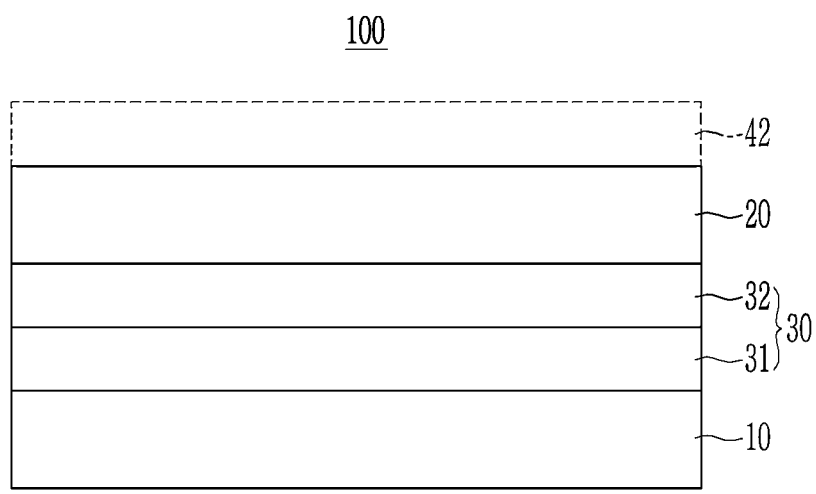
FIG. 1 is a cross-sectional view showing a photoelectric device according to some example embodiments.

Hereinafter, example embodiments of the present disclosure will be described in detail so that a person skilled in the art would understand the same.

This disclosure may, however, be embodied in many different forms and is not construed as limited to the example embodiments set forth herein.

In the drawings, the thickness of layers, films, panels, regions, etc., are exaggerated for clarity.

Like reference numerals designate like elements throughout the specification.

It will be understood that when an element such as a layer, film, region, or substrate is referred to as being "on" another element (e.g., above or beneath the other element), it can be directly on the other element or intervening elements may also be present.

In contrast, when an element is referred to as being "directly on" another element, there are no intervening elements present.

In the drawings, parts having no relationship with the description are omitted for clarity of the embodiments, and the same or similar constituent elements are indicated by the same reference numeral throughout the specification.

Hereinafter, 'combination' refers to a mixture of two or more and a stack structure of two or more.

As used herein, when a definition is not otherwise provided, "substituted" refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to inclusion of one to three heteroatoms selected from O, S, P, and Si.

Hereinafter, a highest occupied molecular orbital (HOMO) energy level is expressed as an absolute value from a vacuum level.

In addition, when the HOMO energy level is said to be "deep," "high," or "large," the HOMO energy level has a large absolute value based on "0 eV" of the vacuum level, while when the HOMO energy level is "shallow," "low," or "small," the HOMO energy level has a small absolute value based on "0 eV" of the vacuum level.

Hereinafter, as used herein, when a definition is not otherwise provided, each characteristic is measured in state of a thin film (deposition thin film).

Hereinafter, a photoelectric device according to some example embodiments is described with reference to the drawings.

FIG. 1 is a cross-sectional view showing a photoelectric device according to some example embodiments.

Referring to FIG. 1, a photoelectric device 100 according to some example embodiments includes a first electrode 10 (also referred to herein as a lower electrode) and a second electrode 20 (also referred to herein as an upper electrode) facing each other and a photoelectric conversion layer 30 (also referred to herein as a photoelectric conversion device) between the first electrode 10 and the second electrode 20.

A substrate (not shown) may be disposed on a surface of the first electrode 10 or a surface of the second electrode 20.

The substrate may be for example made of an inorganic material such as glass, an organic material such as polycarbonate, polymethylmethacrylate, polyethyleneterephthalate, polyethylenenaphthalate, polyamide, polyethersulfone, or a combination thereof, or a silicon wafer.

One of the first electrode 10 and the second electrode 20 may be an anode and the other may be a cathode.

For example, the first electrode 10 may be an anode and the second electrode 20 may be a cathode.

At least one of the first electrode 10 and the second electrode 20 may be a light-transmitting electrode and the light-transmitting electrode may be for example made of a conductive oxide such as an indium tin oxide (ITO), indium zinc oxide (IZO), zinc oxide (ZnO), tin oxide (SnO), aluminum tin oxide (AlTO), and fluorine doped tin oxide (FTO), or a metal thin layer of a single layer or a multilayer.

When one of the first electrode 10 and the second electrode 20 is a non-light-transmitting electrode, it may be made of for example an opaque conductor such as aluminum (Al), silver (Ag), or gold (Au).

For example, the first electrode 10 and the second electrode 20 may be all light-transmitting electrodes.

For example, the second electrode 20 may be a light receiving electrode disposed at a light receiving side.

The photoelectric conversion layer 30 includes a first photoelectric conversion layer 31 and a second photoelectric conversion layer 32.

The first photoelectric conversion layer 31 may be near to the first electrode 10 and the second photoelectric conversion layer 32 may be near to the second electrode 20. For example, in FIG. 1, the first photoelectric conversion layer 31 is on the first electrode 10, the second photoelectric conversion layer 32 is on the first photoelectric conversion layer 31, and the second electrode 20 is on the second photoelectric conversion layer 32.

The second photoelectric conversion layer 32 may be disposed to be nearer to a light receiving side than the first photoelectric conversion layer 31.

Each of the first photoelectric conversion layer 31 and the second photoelectric conversion layer 32 may be configured to commonly absorb light in a part of a wavelength spectrum of light of a visible wavelength spectrum of light (e.g., a particular portion of a visible wavelength spectrum of light) or a near infrared wavelength spectrum of light, and may for example commonly absorb a part of light in a green wavelength spectrum of light, light in a blue wavelength spectrum of light, light in a red wavelength spectrum of light, or light in a near infrared wavelength spectrum of light. Restated, the first photoelectric conversion layer 31 and the second photoelectric conversion layer 32 may have a first peak absorption wavelength and a second peak absorption wavelength, respectively, that are both included in a common wavelength spectrum of light that may be one wavelength spectrum of light a visible ray wavelength spectrum of light or a near infrared wavelength spectrum of light, and may for example one wavelength spectrum of light of a green wavelength spectrum of light, a blue wavelength spectrum of light, a red wavelength spectrum of light, or a near infrared wavelength spectrum of light. The common wavelength spectrum of light may be one wavelength spectrum of light of about 410 nm to about 480 nm, about 510 nm to about 560 nm, about 620 nm to about 670 nm, or about 780 nm to about 1200 nm.

For example, a peak absorption wavelength ($\lambda_{max1}$) of the first photoelectric conversion layer 31 and a peak absorption wavelength ($\lambda_{max2}$) of the second photoelectric conversion layer 32 may commonly exist in one region selected from a red wavelength spectrum of light, a green wavelength spectrum of light, a blue wavelength spectrum of light, a near infrared wavelength spectrum of light, and an ultraviolet wavelength spectrum of light.

For example, each of the first photoelectric conversion layer 31 and the second photoelectric conversion layer 32 may selectively absorb light in a green wavelength spectrum of light.

Herein, the green wavelength spectrum of light may be for example about 500 nm to about 600 nm, and each of the peak absorption wavelength ($\lambda_{max1}$) of the first photoelectric conversion layer 31 and the peak absorption wavelength ($\lambda_{max2}$) of the second photoelectric conversion layer 32 may commonly exist in about 510 nm to about 560 nm, for example about 520 nm to about 550 nm, or about 530 nm to about 550 nm. Restated, the aforementioned wavelength spectrum of light may be one wavelength spectrum of light of about 510 nm to about 560 nm. The second peak absorption wavelength ($\lambda_{max2}$) may be in a wavelength spectrum of light of about 530 nm to about 550 nm.

For example, each of the first photoelectric conversion layer 31 and the second photoelectric conversion layer 32 may selectively absorb light in a blue wavelength spectrum of light.

Herein, the blue wavelength spectrum of light may be for example about greater than or equal to about 380 nm and less than about 500 nm, and each of the peak absorption wavelength ($\lambda_{max1}$) of the first photoelectric conversion layer 31 and the peak absorption wavelength ($\lambda_{max2}$) of the second photoelectric conversion layer 32 may commonly exist in about 410 nm to about 480 nm, for example about 420 nm to about 470 nm, or about 430 nm to about 460 nm.

For example, each of the first photoelectric conversion layer 31 and the second photoelectric conversion layer 32 may selectively absorb light in a red wavelength spectrum of light.

Herein, the red wavelength spectrum of light may be for example greater than about 600 nm and less than or equal to about 700 nm, and each of the peak absorption wavelength ($\lambda_{max1}$) of the first photoelectric conversion layer 31 and the peak absorption wavelength ($\lambda_{max2}$) of the second photoelectric conversion layer 32 may commonly exist in about 620 nm to about 670 nm, for example about 630 nm to about 660 nm, or about 640 nm to about 660 nm.

For example, each of the first photoelectric conversion layer 31 and the second photoelectric conversion layer 32 may selectively absorb light in a near infrared wavelength spectrum of light.

Herein, the near infrared wavelength spectrum of light may be for example greater than about 700 nm and less than or equal to about 3000 nm, and each of the peak absorption wavelength ($\lambda_{max1}$) of the first photoelectric conversion layer 31 and the peak absorption wavelength ($\lambda_{max2}$) of the second photoelectric conversion layer 32 may commonly exist in about 780 nm to about 1200 nm, for example about 790 nm to about 1100 nm, or about 800 nm to about 1000 nm.

The first photoelectric conversion layer 31 and the second photoelectric conversion layer 32 may independently include at least one p-type semiconductor and at least one n-type semiconductor to provide a heterojunction. Restated, the first photoelectric conversion layer 31 may include a first heterojunction that includes at least one first p-type semiconductor 33 and at least one first n-type semiconductor 35, and the second photoelectric conversion layer 32 may include a second heterojunction (which may be separate from the first heterojunction of the first photoelectric conversion layer 31) that includes at least one second p-type semiconductor 37 and at least one second n-type semiconductor 39.

For example, the first photoelectric conversion layer 31 may include at least one first p-type semiconductor and at least one first n-type semiconductor to form a heterojunction and the second photoelectric conversion layer 32 may include at least one second p-type semiconductor and at least one second n-type semiconductor to form a heterojunction.

The first p-type semiconductor and the second p-type semiconductor may be the same or different and the first n-type semiconductor and the second n-type semiconductor may be the same or different.

The first photoelectric conversion layer 31 and the second photoelectric conversion layer 32 may independently form a pn junction, the first p-type semiconductor and the first n-type semiconductor form a pn junction, may be configured to generate excitons by ("based on") receiving light from outside ("an external environment that is external to the photoelectric device 100), and separate the generated excitons into holes and electrons, and the second p-type semiconductor and the second n-type semiconductor form a pn junction, generate excitons by receiving light from outside, and separate the generated excitons into holes and electrons.

For example, the first p-type semiconductor may be included in the same as the amount of the first n-type semiconductor or in a larger amount than the first n-type semiconductor, and for example the second p-type semiconductor may be included in the same as the amount of the second n-type semiconductor or in a larger amount than the second n-type semiconductor.

At least one of the first p-type semiconductor and the first n-type semiconductor may selectively absorb a part of a wavelength spectrum of light of a visible ray wavelength spectrum of light or light in a near infrared wavelength spectrum of light, and may for example selectively absorb a part of light in a green wavelength spectrum of light, light in a blue wavelength spectrum of light, light in a red wavelength spectrum of light and light in a near infrared wavelength spectrum of light.

For example, the first p-type semiconductor may selectively absorb a part of a wavelength spectrum of light of a visible ray wavelength spectrum of light or light in a near infrared wavelength spectrum of light, and may for example selectively absorb a part of light in a green wavelength spectrum of light, light in a blue wavelength spectrum of light, light in a red wavelength spectrum of light, light in a near infrared wavelength spectrum of light, and light in an ultraviolet wavelength spectrum of light.

For example, the first p-type semiconductor may selectively absorb light in a green wavelength spectrum of light.

At least one of the second p-type semiconductor and the second n-type semiconductor may selectively absorb a part of a wavelength spectrum of light of a visible wavelength spectrum of light or light in a near infrared wavelength spectrum of light, and may for example selectively absorb a part of light in a green wavelength spectrum of light, light in a blue wavelength spectrum of light, light in a red wavelength spectrum of light and light in a near infrared wavelength spectrum of light.

For example, the second p-type semiconductor may selectively absorb a part of a wavelength spectrum of light of a visible ray wavelength spectrum of light or light in a near infrared wavelength spectrum of light, and may for example selectively absorb a part of light in a green wavelength spectrum of light, light in a blue wavelength spectrum of light, light in a red wavelength spectrum of light, and light in a near infrared wavelength spectrum of light.

For example, the second p-type semiconductor may selectively absorb light in a green wavelength spectrum of light.

For example, the first p-type semiconductor and the second p-type semiconductor may be different from each other, and may commonly absorb a part of a wavelength spectrum of light of a visible wavelength spectrum of light, or light in a near infrared wavelength spectrum of light, and may for example commonly absorb a part of light in a green wavelength spectrum of light, light in a blue wavelength spectrum of light, light in a red wavelength spectrum of light, and light in a near infrared wavelength spectrum of light.

For example, a peak absorption wavelength ($\lambda_{max,p1}$) of the first p-type semiconductor (e.g., a first peak absorption wavelength with which the first photoelectric conversion layer 31 is associated) and a peak absorption wavelength ($\lambda_{max,p2}$) of the second p-type semiconductor (e.g., a second peak absorption wavelength with which the second photoelectric conversion layer 32 is associated) may commonly exist in one region of a red wavelength spectrum of light, a green wavelength spectrum of light, a blue wavelength spectrum of light, and a near infrared wavelength spectrum of light. Restated, both of the first peak absorption wavelength and the second peak absorption wavelength may be included in a common wavelength spectrum of light, where the common wavelength spectrum of light is one wavelength spectrum of light of a red wavelength spectrum of light, a green wavelength spectrum of light, a blue wavelength spectrum of light, a near infrared wavelength spectrum of light, or an ultra-violet wavelength spectrum of light.

For example, the first p-type semiconductor and the second p-type semiconductor may be different from each other (e.g., may include different materials) and may be configured to selectively absorb light in a green wavelength spectrum of light, respectively (e.g., may each be configured to selectively absorb light in the green wavelength spectrum of light).

Herein, the green wavelength spectrum of light may be for example about 500 nm to about 600 nm and each of the peak absorption wavelength ($\lambda_{max1,p1}$) of the first p-type semiconductor and the peak absorption wavelength ($\lambda_{max2,p2}$) of the second p-type semiconductor may for example exist in about 510 nm to about 560 nm or for example about 520 nm to about 550 nm.

For example, the first p-type semiconductor and the second p-type semiconductor may be different from each other and may selectively absorb light in a blue wavelength spectrum of light.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Herein, the blue wavelength spectrum of light may be for example greater than or equal to about 380 nm and less than about 500 nm and each of the peak absorption wavelength ($\lambda_{max1,p1}$) of the first p-type semiconductor and the peak absorption wavelength ($\lambda_{max2,p2}$) of the second p-type semiconductor may for example exist in about 410 nm to about 480 nm.

For example, the first p-type semiconductor and the second p-type semiconductor may be different from each other and may selectively absorb light in a red wavelength spectrum of light.

Herein, the red wavelength spectrum of light may be for example greater than about 600 nm and less than or equal to about 700 nm, and each of the peak absorption wavelength ($\lambda_{max1,p1}$) of the first p-type semiconductor and the peak absorption wavelength ($\lambda_{max2,p2}$) of the second p-type semiconductor may for example exist in about 620 nm to about 670 nm.

For example, the first p-type semiconductor and the second p-type semiconductor may be different from each other and may selectively absorb light in a near infrared wavelength spectrum of light.

Herein, the near infrared wavelength spectrum of light may be for example about greater than 700 nm and less than or equal to about 3000 nm, and each of the peak absorption wavelength ($\lambda_{max1,p1}$) of the first p-type semiconductor and the peak absorption wavelength ($\lambda_{max2,p2}$) of the second p-type semiconductor may for example exist in about 780 nm to about 1200 nm.

For example, the first n-type semiconductor and the second n-type semiconductor may be the same or different and may each separately include, for example, fullerene or a fullerene derivative, respectively, but are not limited thereto. For example, the first n-type semiconductor may include fullerene and the second n-type semiconductor may include a fullerene derivative.

The first photoelectric conversion layer 31 and the second photoelectric conversion layer 32 may have different optical properties, thermal resistance properties, and/or electrical characteristics.

For example, optical properties, thermal resistance properties and/or electrical characteristics of the first photoelectric conversion layer 31 and the second photoelectric conversion layer 32 may be determined by the p-type semiconductor and/or the n-type semiconductor or may be for example determined by the p-type semiconductor.

For example, the second photoelectric conversion layer 32 may have a higher light absorption characteristics and light-absorption selectivity than the first photoelectric conversion layer 31.

For example, a light-absorption full width at half maximum (FWHM) of the second photoelectric conversion layer 32 may be narrower than an FWHM of the first photoelectric conversion layer 31. An FWHM of the second p-type semiconductor 37 may be narrower than an FWHM of the first p-type semiconductor 33.

Herein, the light-absorption full width at half maximum (FWHM) is a width of a wavelength corresponding to a half of a peak absorption point and may be defined with a reference to an absorbance measured with a UV-Vis spectroscope meter, unless specific definition is otherwise provided.

When the light-absorption full width at half maximum (FWHM) is narrow, light in a narrow wavelength spectrum of light is selectively absorbed, which means that wavelength selectivity is high.

For example, the light-absorption full width at half maximum (FWHM) of the second p-type semiconductor may be narrower than the light-absorption full width at half maximum (FWHM) of the first p-type semiconductor.

The FWHM of the second photoelectric conversion layer 32 may be for example less than or equal to about 110 nm and the FWHM of the first photoelectric conversion layer 31 may be larger than the FWHM of the second photoelectric conversion layer 32 and may be for example greater than or equal to about 100 nm.

Within the ranges, the FWHM of the second photoelectric conversion layer 32 may be for example about 50 nm to about 110 nm, about 60 nm to about 110 nm, about 70 nm to about 110 nm, about 70 nm to about 105 nm, and/or about 70 nm to about 100 nm and the FWHM of the first photoelectric conversion layer 31 may be for example about 100 nm to about 130 nm, about 105 nm to about 130 nm, about 110 nm to about 130 nm, and/or about 112 nm to about 130 nm.

For example, an extinction coefficient at the peak absorption wavelength ($\lambda_{max2}$) of the second photoelectric conversion layer 32 (e.g., an extinction coefficient at the second peak absorption wavelength) may be the same as or higher than ("equal to or greater than") an extinction coefficient at the peak absorption wavelength ($\lambda_{max1}$) of the first photoelectric conversion layer 31 (e.g., an extinction coefficient at the first peak absorption wavelength).

For example, an extinction coefficient at the peak absorption wavelength ($\lambda_{max2,p2}$) of the second p-type semiconductor may be the same as or higher than an extinction coefficient at the peak absorption wavelength ($\lambda_{max1,p1}$) of the first p-type semiconductor.

For example, the extinction coefficient at the peak absorption wavelength ($\lambda_{max2,p2}$) of the second p-type semiconductor may be for example greater than or equal to about $6.5 \times 10^4$ cm$^{-1}$, greater than or equal to about $6.6 \times 10^4$ cm$^{-1}$, about $6.5 \times 10^4$ cm$^{-1}$ to about $1.5 \times 10^5$ cm$^{-1}$, about $6.6 \times 10^4$ cm$^{-1}$ to about 1.5×10$^5$ cm$^{-1}$, about 6.6×10$^4$ cm$^{-1}$ to about 1.2×10$^5$ cm$^{-1}$, or about 6.6×10$^4$ cm$^{-1}$ to about 1.0×10$^5$ cm$^{-1}$.

For example, external quantum efficiency (EQE) at the peak absorption wavelength ($\lambda_{max2}$) of the second photoelectric conversion layer 32 (e.g., an external quantum efficiency at the second peak absorption wavelength) may be the same as or higher than ("equal or greater than") an external quantum efficiency (EQE) at the peak absorption wavelength ($\lambda_{max1}$) of the first photoelectric conversion layer 31 (e.g., an external quantum efficiency at the first peak absorption wavelength).

For example, external quantum efficiency (EQE) at the peak absorption wavelength ($\lambda_{max2,p2}$) of the second p-type semiconductor may be the same as or higher than external quantum efficiency (EQE) at the peak absorption wavelength ($\lambda_{max1,p1}$) of the first p-type semiconductor.

The external quantum efficiency (EQE) at the peak absorption wavelength ($\lambda_{max2}$) of the second photoelectric conversion layer 32 may be for example greater than or equal to about 60%, for example greater than or equal to about 62%, greater than or equal to about 65%, greater than or equal to about 66%, or greater than or equal to about 67%.

On the other hand, the external quantum efficiency (EQE) except the peak absorption wavelength ($\lambda_{max2}$) of the second photoelectric conversion layer 32 may be lower than the external quantum efficiency (EQE) except the peak absorption wavelength ($\lambda_{max1}$) of the first photoelectric conversion layer 31.

For example, when each of the peak absorption wavelengths ($\lambda_{max1}$, $\lambda_{max2}$) of the first photoelectric conversion layer 31 and the second photoelectric conversion layer 32 exists in a green wavelength spectrum of light, external quantum efficiency (EQE) at a wavelength of 450 nm of the second photoelectric conversion layer 32 may be less than or equal to about 25%, less than or equal to about 22%, less than or equal to about 20%, or less than or equal to about 19% and external quantum efficiency (EQE) at a wavelength of 450 nm of the first photoelectric conversion layer 31 may be less than or equal to about 40%, about 20% to about 40%, about 22% to about 38 about %, or about 25% to about 35%.

Accordingly, a ratio of the external quantum efficiency at the peak absorption wavelength ($\lambda_{max2}$) and in other wavelengths of the second photoelectric conversion layer 32 may be higher than a ratio of the external quantum efficiency at the peak absorption wavelength ($\lambda_{max1}$) and in other wavelengths of the first photoelectric conversion layer 31.

That is, light-absorption wavelength selectivity of the second photoelectric conversion layer 32 may be higher than light-absorption wavelength selectivity of the first photoelectric conversion layer 31.

For example, when each of the peak absorption wavelengths ($\lambda_{max1}$, $\lambda_{max2}$) of the first photoelectric conversion layer 31 and the second photoelectric conversion layer 32 exists in a green wavelength spectrum of light, external quantum efficiency(EQE) at the peak absorption wavelengths ($\lambda_{max1}$, $\lambda_{max2}$) and external quantum efficiency (EQE) at 450 nm (blue region) of the first photoelectric conversion layer 31 and the second photoelectric conversion layer 32 may for example satisfy Relationship Equation 1.

$$EQE(2)_{\lambda max2}/EQE(2)_{450\ nm} > EQE(1)_{\lambda max1}/EQE(1)_{450\ nm}$$ [Relationship Equation 1]

In Relationship Equation 1,

EQE(2)$_{\lambda max2}$ is external quantum efficiency at the peak absorption wavelength ($\lambda_{max2}$) of the second photoelectric conversion layer, EQE(2)$_{450\ nm}$ is external quantum efficiency at a wavelength of 450 nm of the second photoelectric conversion layer, EQE(1)$_{\lambda max1}$ is external quantum efficiency at the peak absorption wavelength ($\lambda_{max1}$) of the first photoelectric conversion layer, and EQE(1)$_{450\ nm}$ is external quantum efficiency at a wavelength of 450 nm of the first photoelectric conversion layer.

According to Relationship Equation 1, light-absorption wavelength selectivity of the second photoelectric conversion layer 32 may be higher than light-absorption wavelength selectivity of the first photoelectric conversion layer 31.

For example, the first photoelectric conversion layer 31 may have higher thermal resistance properties and/or electrical characteristics than the second photoelectric conversion layer 32.

For example, the thermal resistance properties of the first photoelectric conversion layer 31 may be better than the thermal resistance properties of the second photoelectric conversion layer 32.

For example, melting points of the first p-type semiconductor and/or the first n-type semiconductor included in the first photoelectric conversion layer 31 may be higher than melting points (Tm) of the second p-type semiconductor and/or the second n-type semiconductor included in the second photoelectric conversion layer 32, and for example the melting point of the first p-type semiconductor may be higher than the melting point (Tm) of the second p-type semiconductor.

For example, the melting point of the first p-type semiconductor may be higher than the melting point of the second p-type semiconductor by greater than or equal to about 5° C., greater than or equal to about 7° C., greater than or equal to about 10° C., greater than or equal to about 12° C. or greater than or equal to about 15° C.

Charge mobility of the first photoelectric conversion layer 31 may be higher ("greater") than charge mobility of the second photoelectric conversion layer 32.

For example, charge mobility of the first p-type semiconductor and/or the first n-type semiconductor may be higher ("greater") than charge mobility of the second p-type semiconductor and/or the second n-type semiconductor, and for example the charge mobility of the first p-type semiconductor may be higher than the charge mobility of the second p-type semiconductor.

For example, the charge mobility of the first p-type semiconductor may be higher than the charge mobility of the second p-type semiconductor by for example greater than or equal to about 3%, greater than or equal to about 5%, greater than or equal to about 7%, greater than or equal to about 10%, greater than or equal to about 15%, or greater than or equal to about 20%.

For example, a HOMO energy level of the first photoelectric conversion layer 31 may be shallower than a HOMO energy level of the second photoelectric conversion layer second p-type semiconductor 32.

For example, HOMO energy levels of the first p-type semiconductor and/or the first n-type semiconductor included in the first photoelectric conversion layer 31 may be shallower than HOMO energy levels of the second p-type semiconductor and/or the second n-type semiconductor included in the second photoelectric conversion layer 32, and for example the HOMO energy level of the first p-type semiconductor may be shallower than the HOMO energy level of the second p-type semiconductor.

For example, each of the HOMO energy level of the first p-type semiconductor and the second p-type semiconductor may be for example about 5.30 eV to about 5.80 eV, within the range, the HOMO energy level of the first p-type semiconductor may be shallower than the HOMO energy level of the second p-type semiconductor by about 0.01 eV, for example about 0.02 eV, about 0.04 eV, about 0.05 eV, about 0.07 eV, or about 0.1 eV.

Each of the first photoelectric conversion layer 31 and the second photoelectric conversion layer 32 may have a thickness of about 10 nm to about 150 nm, and for example a thickness of the second photoelectric conversion layer 32 may be the same as or larger than ("equal to or greater than") the thickness of the first photoelectric conversion layer 31.

For example, a thickness ratio of the first photoelectric conversion layer 31 and the second photoelectric conversion layer 32 may be about 50:50 to about 5:95, for example about 45:55 to about 5:95, about 40:60 to about 5:95, about 30:70 to about 5:95, about 20:80 to about 5:95, or about 10:90 to about 5:95, but is not limited thereto.

In this way, the photoelectric conversion layer 30 includes the first photoelectric conversion layer 31 and the second photoelectric conversion layer 32 having different optical properties, electrical characteristics, and/or thermal resistance properties, and thereby it may satisfy characteristics required for the photoelectric device and simultaneously the first photoelectric conversion layer 31 and the second photoelectric conversion layer 32 may be controlled in accordance with required characteristics so that a photoelectric device having desirable properties may be manufactured easily.

As described above, properties of the first photoelectric conversion layer 31 and the second photoelectric conversion layer 32 may be for example controlled by the first p-type semiconductor and/or the first n-type semiconductor and the second p-type semiconductor and/or the second n-type semiconductor, and may be for example controlled by the first p-type semiconductor and the second p-type semiconductor.

The first p-type semiconductor and the second p-type semiconductor may be for example organic compounds having a different structure, and may be independently for example an organic compound including an electron donating group and an electron accepting group as substituents which are bound to a pi-conjugation core having semiconductor characteristics.

For example, the first p-type semiconductor and the second p-type semiconductor may independently for example be represented by Chemical Formula 1, but is not limited thereto.

EDG-HA-EAG [Chemical Formula 1]

In Chemical Formula 1,

HA is a C2 to C30 heterocyclic group including at least one of Se, Te, S, and Si, EDG is an electron donating group, and EAG is an electron accepting group.

For example, the first p-type semiconductor may be represented by Chemical Formula 1a, but is not limited thereto.

[Chemical Formula 1a]

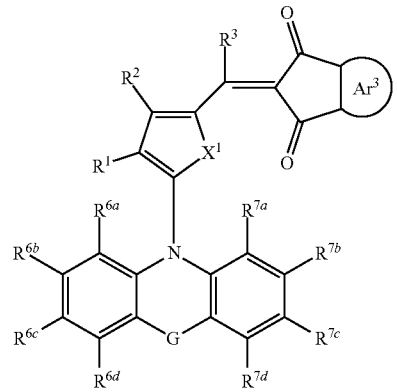

In Chemical Formula 1a, $X^1$ is Se, Te, O, S, SO, or $SO_2$, $Ar^3$ is a substituted or unsubstituted C6 to C30 arylene group, a substituted or unsubstituted C3 to C30 heterocyclic group, or a fused ring of the foregoing two or more, $R^1$ to $R^3$ are independently one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G is one of a single bond, —O—, —S—, —Se—, —N=, —($CR^fR^g)_k$—, —$NR^h$—, —$SiR^iR^j$—, —$GeR^kR^l$—, —(C($R^m$)=C($R^n$))—, and $SnR^oR^p$, wherein $R^f$, $R^g$, $R^h$, $R^i$, $R^j$, $R^k$, $R^l$, $R^m$, $R^n$, $R^o$, and $R^p$ are independently one of hydrogen, a halogen, a substituted or unsubstituted C1 to C10 alkyl group, a substituted or unsubstituted C1 to C10 alkoxy group, and a substituted or unsubstituted C6 to C12 aryl group, $R^f$ and $R^g$, $R^i$ and $R^j$, $R^k$ and $R^l$, $R^m$ and $R^n$, and $R^o$ and $R^p$ are independently present alone or linked with each other to provide a ring, and k is 1 or 2, $R^{6a}$ to $R^{6d}$ and $R^{7a}$ to $R^{7d}$ are independently one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, $R^{6a}$ to $R^{6d}$ are independently present alone or adjacent two thereof are linked with each other to form a fused ring, and $R^{7a}$ to $R^{7d}$ are independently present alone or adjacent two thereof are linked with each other to form a fused ring.

For example, $Ar^3$ of Chemical Formula 1a may be benzene, naphthylene, anthracene, thiophene, selenophene, tellurophene, pyridine, pyrimidine, or a fused ring of the foregoing two or more.

For example, the first p-type semiconductor may be one of compounds of Group 1, but is not limited thereto.

[Group 1]
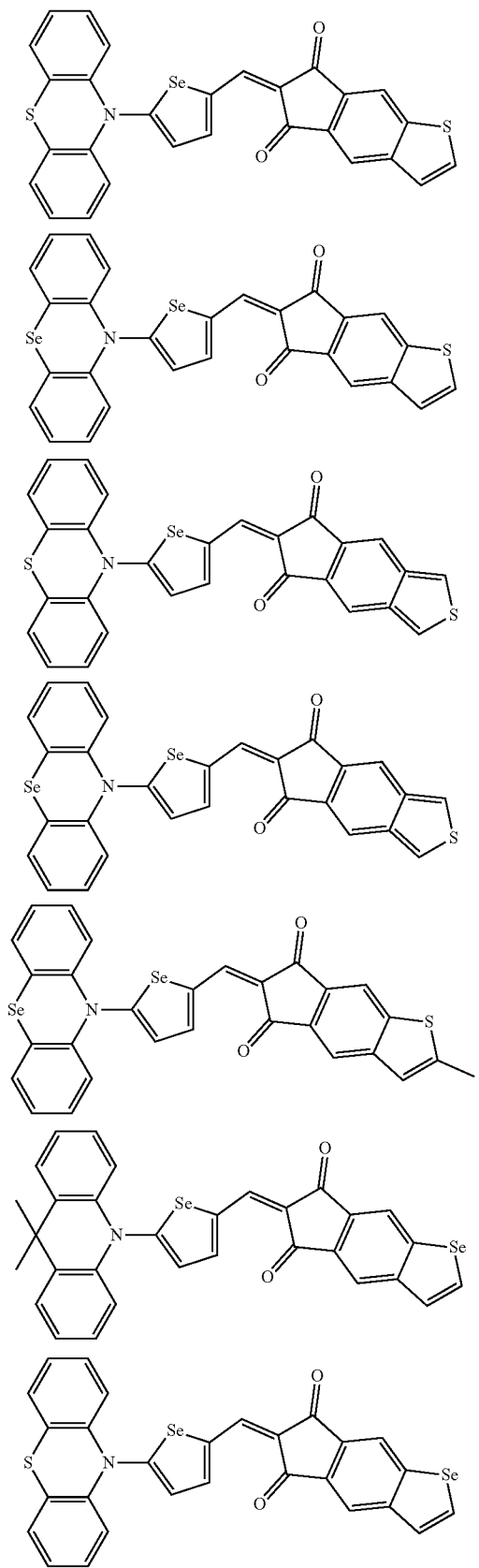
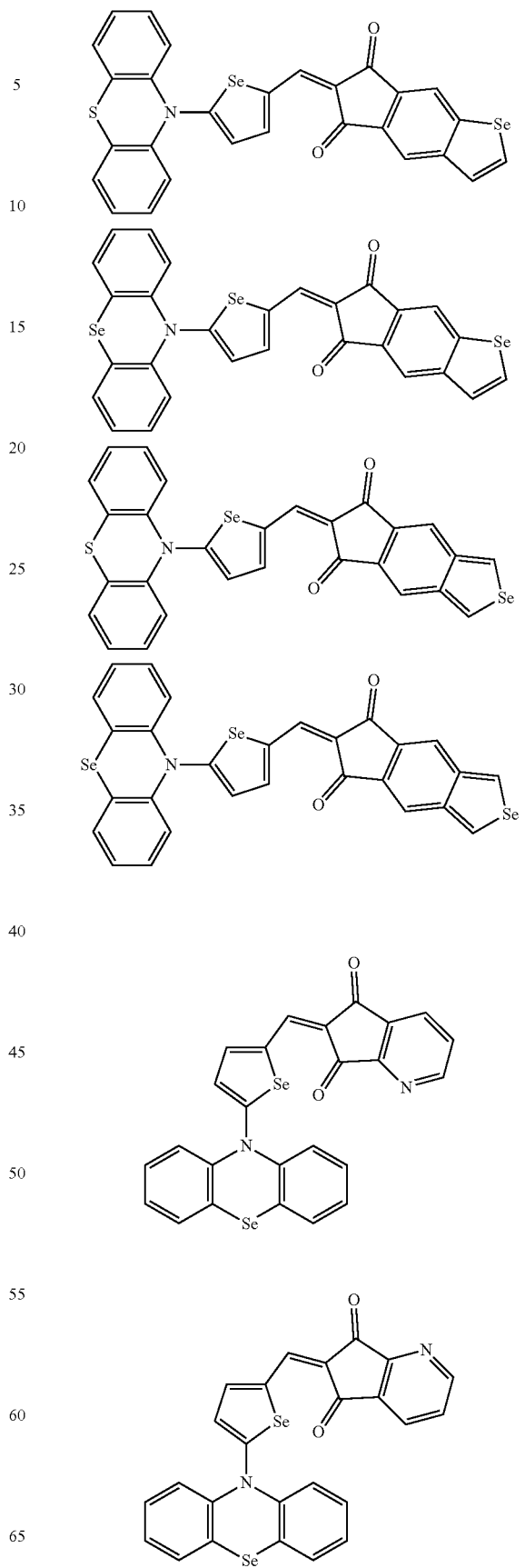

-continued
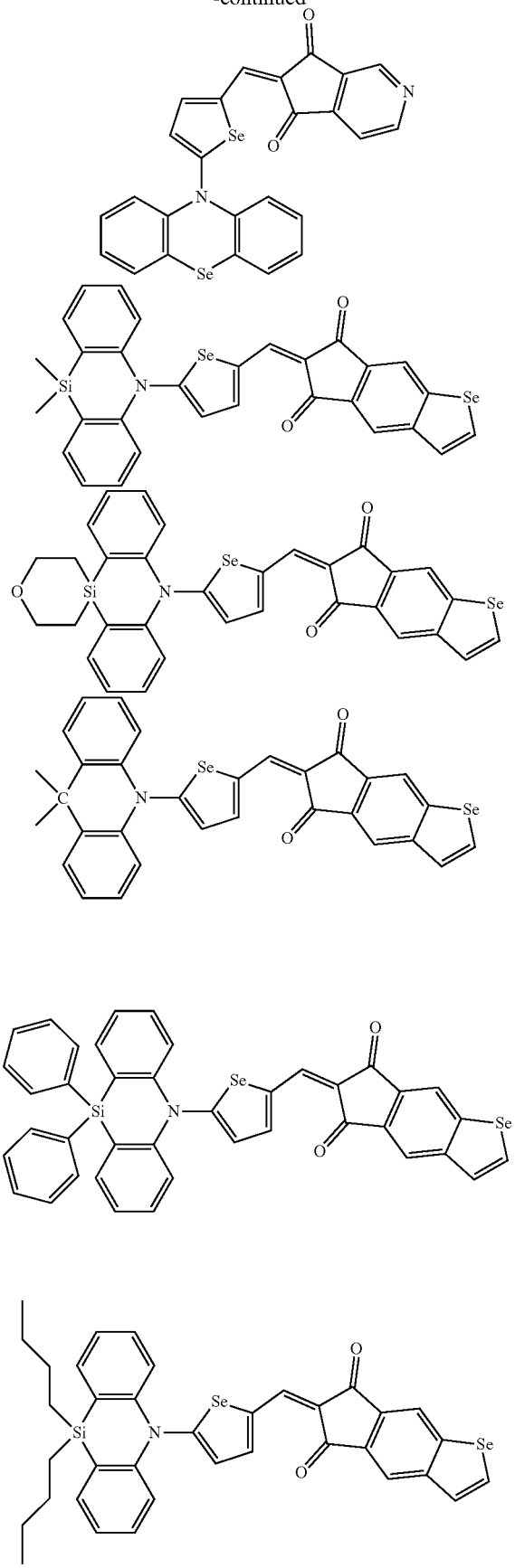
-continued
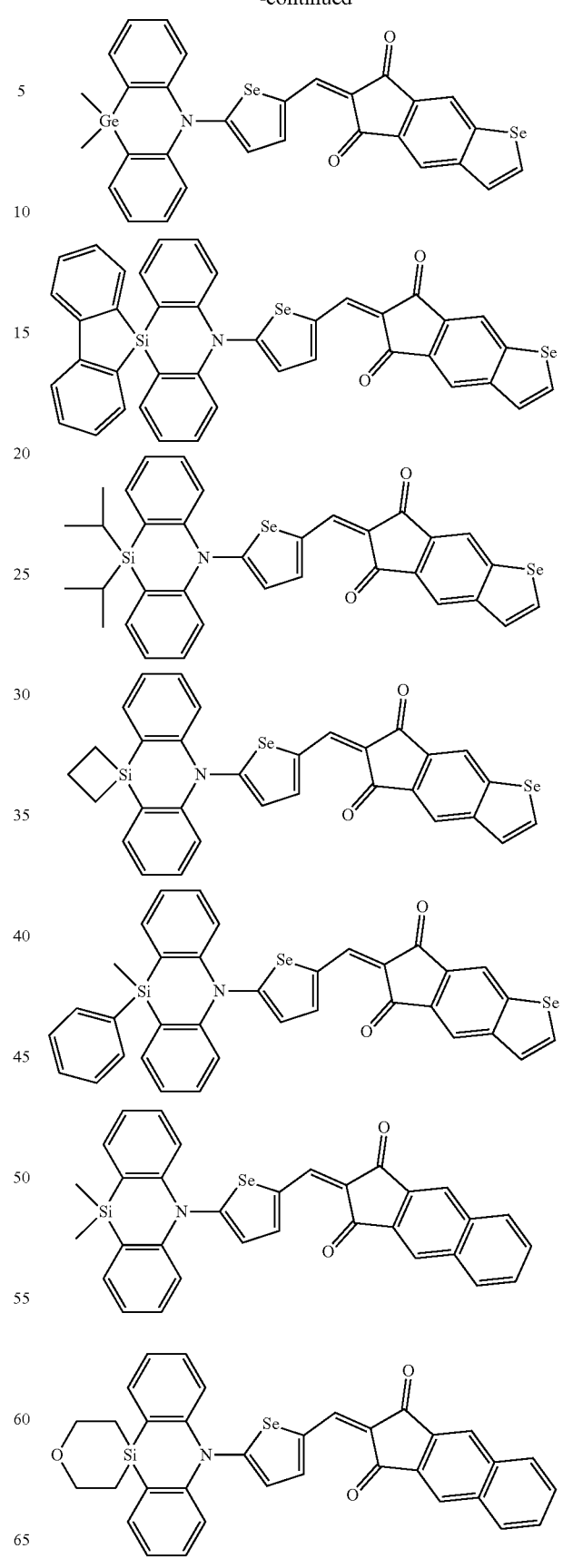

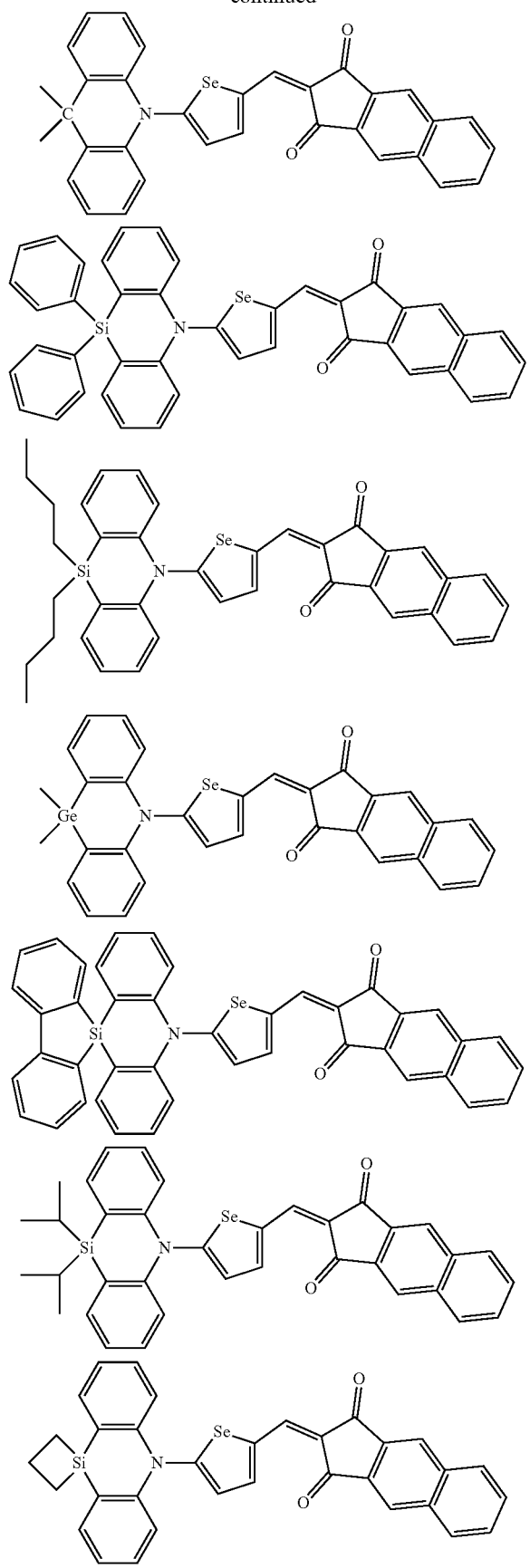
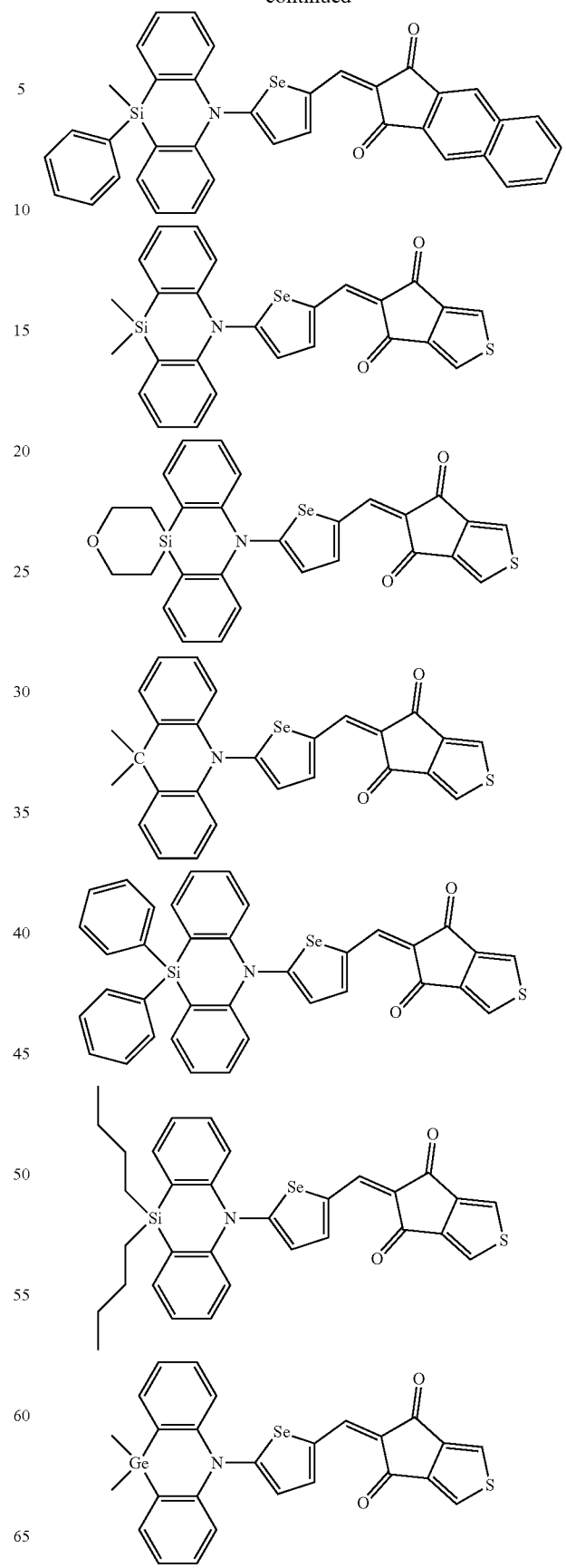

23
-continued
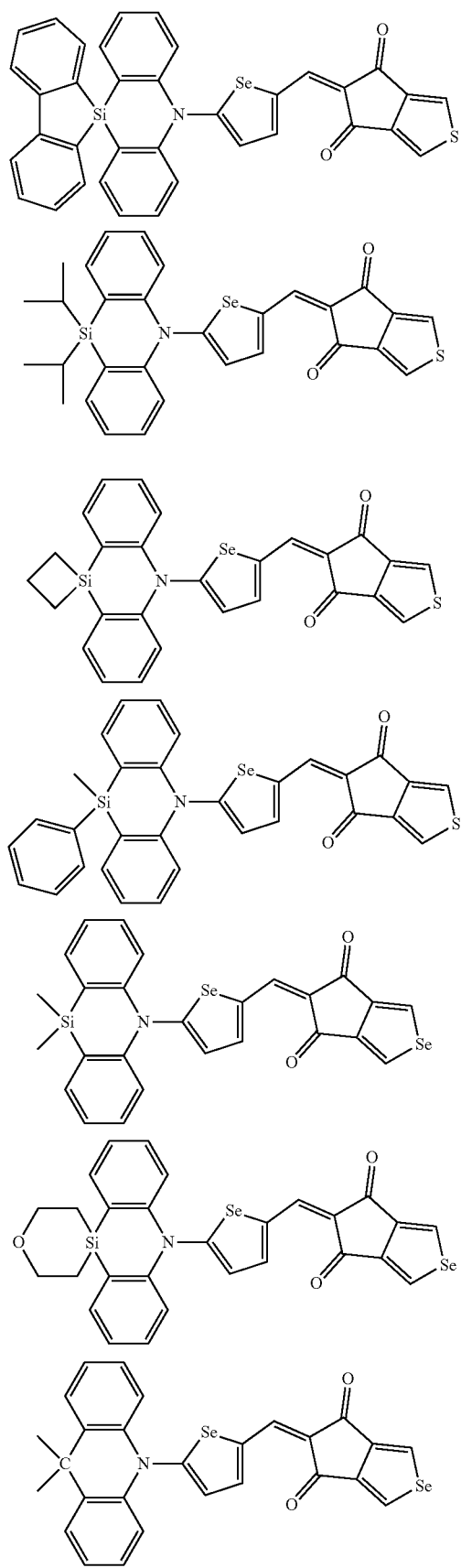
24
-continued
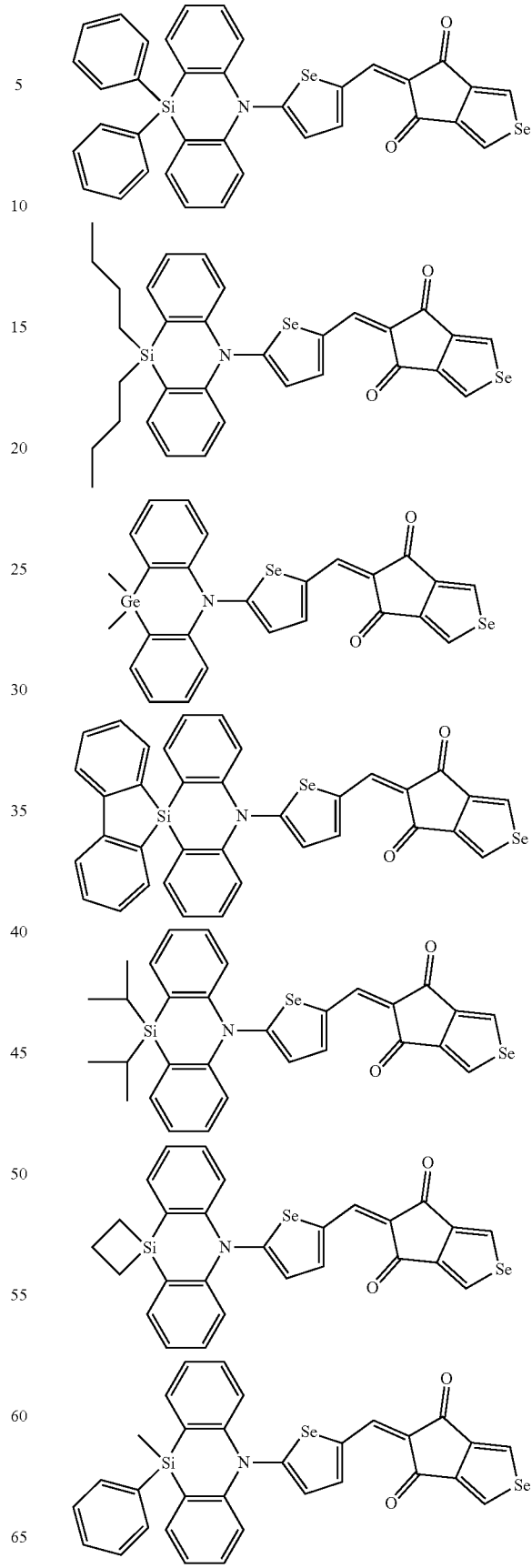

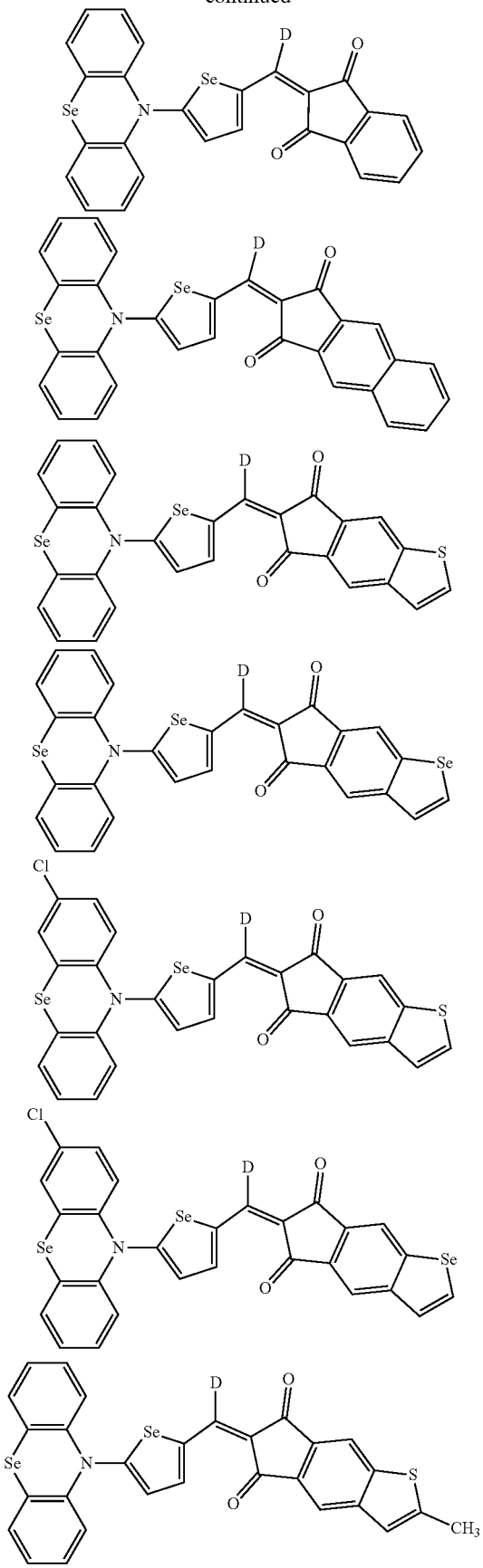

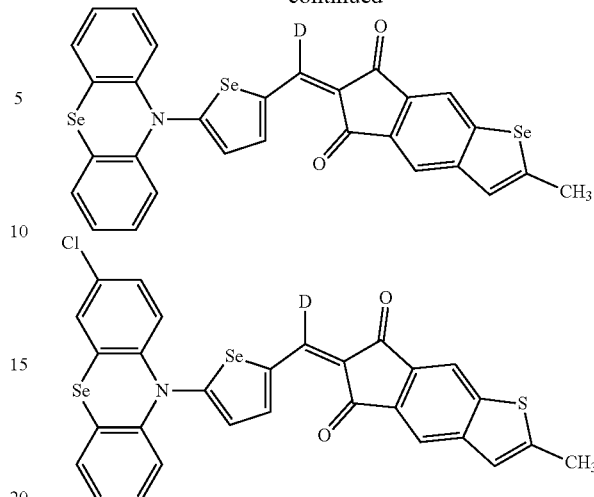

For example, the second p-type semiconductor may be represented by Chemical Formula 1b, but is not limited thereto.

[Chemical Formula 1b]

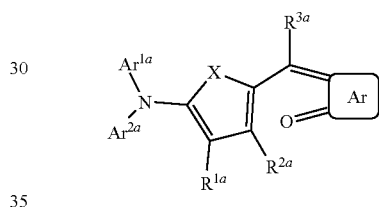

In Chemical Formula 1b,

X is S, Se, Te, SO, $SO_2$, or $SiR^aR^b$,

Ar is a substituted or unsubstituted C6 to C30 arylene group, a substituted or unsubstituted C3 to C30 heterocyclic group, or a fused ring of the foregoing two or more, $Ar^{1a}$ and $Ar^{2a}$ are independently a substituted or unsubstituted C6 to C30 aryl group or a substituted or unsubstituted C3 to C30 heteroaryl group, $Ar^{1a}$ and $Ar^{2a}$ are independently present alone or are linked with each other to form a fused ring, and $R^{1a}$ to $R^{3a}$, $R^a$, and $R^b$ are independently hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen or cyano group.

For example, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

For example, $Ar^{1a}$ and $Ar^{2a}$ may be linked with each other to form a ring or for example, $Ar^{1a}$ and $Ar^{2a}$ may be linked with each other by one of a single bond, $-(CR^gR^h)_{n2}-$ (n2 is 1 or 2), $-O-$, $-S-$, $-Se-$, $-N=$, $-NR^i-$, $-SiR^jR^k-$, and $-GeR^lR^m-$ to form a ring.

Herein, $R^g$ to $R^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the second p-type semiconductor may be represented by one of Chemical Formulae 1bb-1 to 1bb-4, but is not limited thereto.

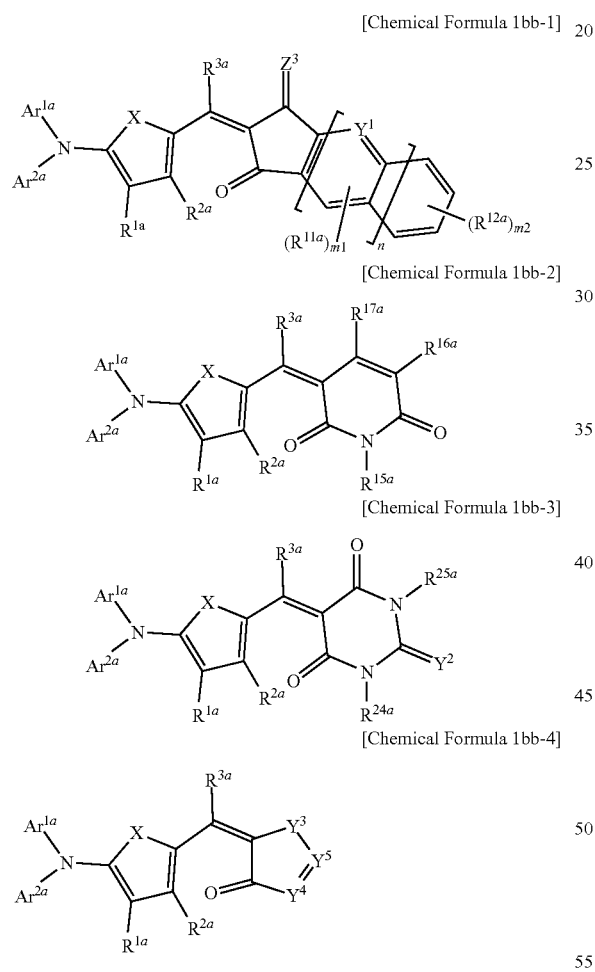

[Chemical Formula 1bb-1]

[Chemical Formula 1bb-2]

[Chemical Formula 1bb-3]

[Chemical Formula 1bb-4]

In Chemical Formulae 1bb-1 to 1bb-4,

X, $Ar^{1a}$, $Ar^{2a}$, and $R^{1a}$ to $R^{3a}$ are the same as described above, $Z^1$ is O or $CR^cR^d$, $Y^1$ is N or $CR^e$, $Y^2$ is one of O, S, Se, Te, and $C(R^f)(CN)$, $Y^3$ is O, S, Se, or Te, $Y^4$ is N or $NR^{18a}$, $Y^5$ is $CR^{19a}$ or $C=CR^{20a}(CN)$, $R^{11a}$, $R^{12a}$, $R^{15a}$ to $R^{20a}$, $R^{24a}$, $R^{25a}$, and $R^a$ to $R^f$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen or cyano group, n1 is 0 or 1, m1 is 0 or 1, and m2 is an integer ranging from 0 to 4.

For example, the second p-type semiconductor may be one of compounds of Group 2, but is not limited thereto.

[Group 2]

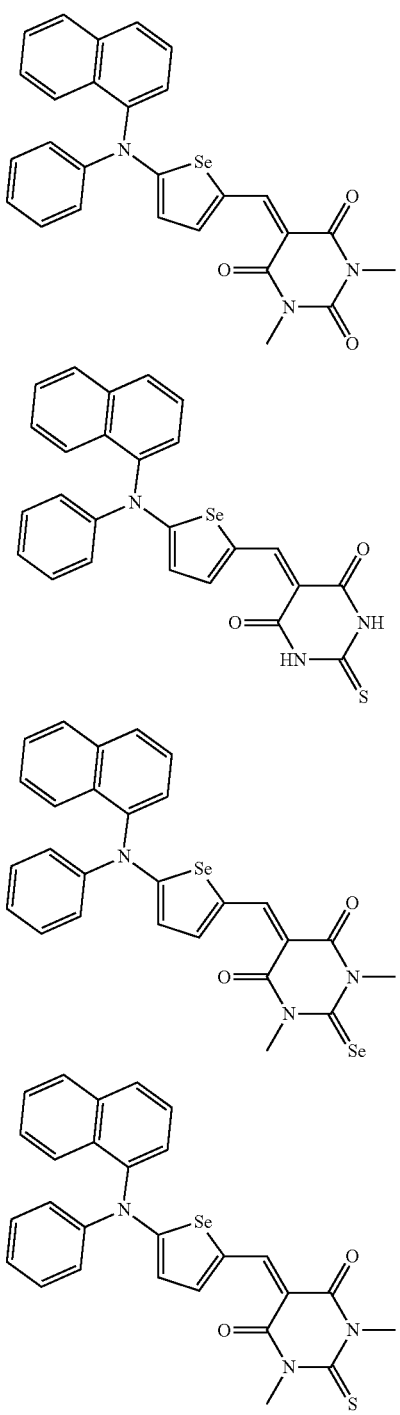

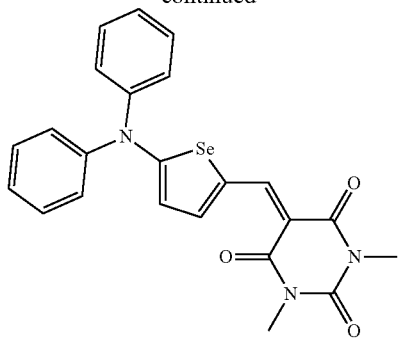
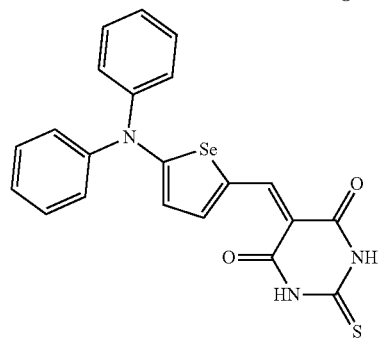
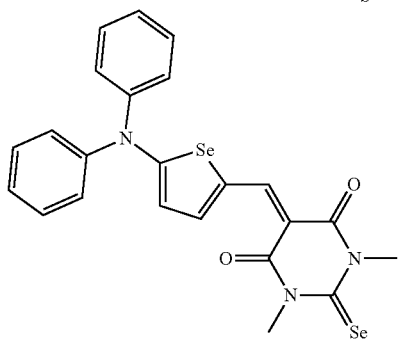
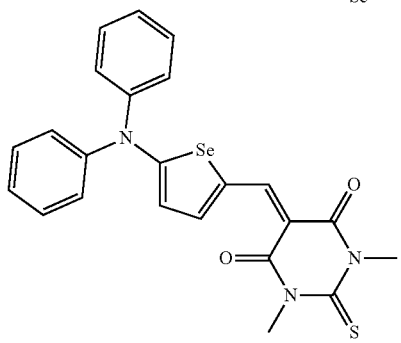
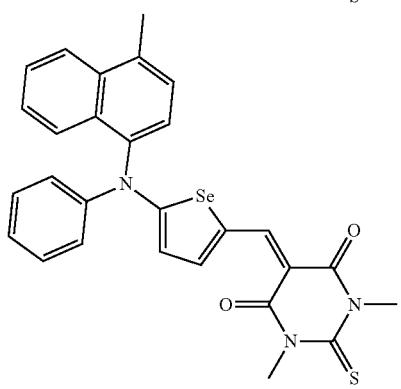
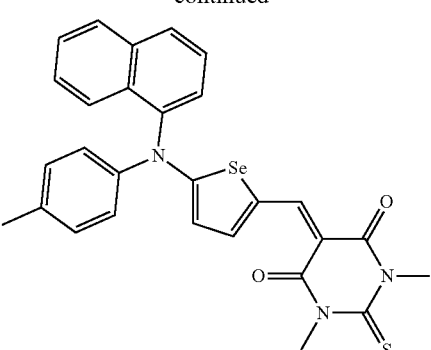
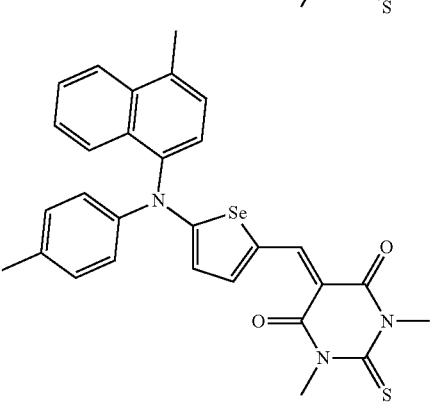
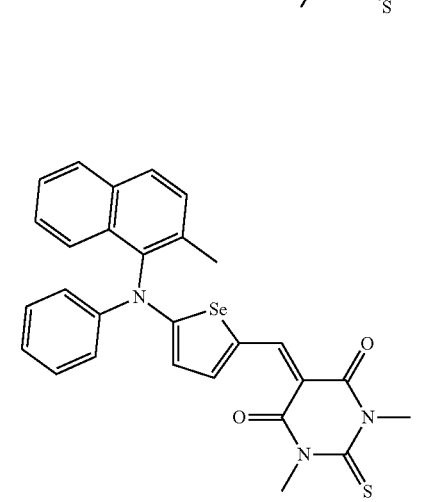
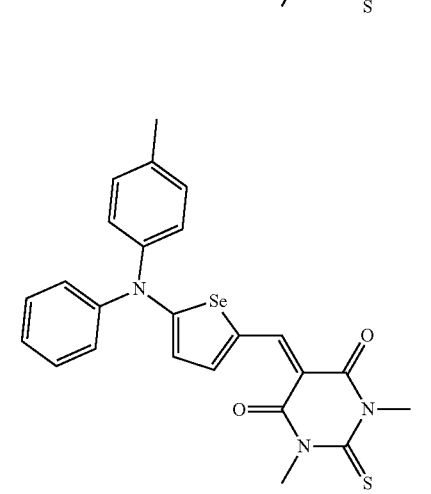

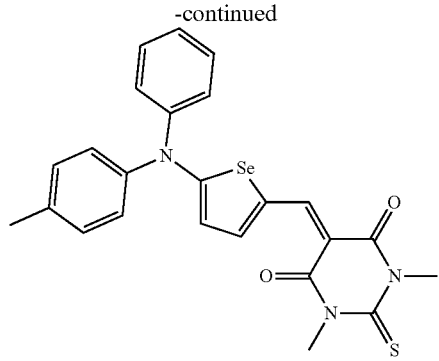
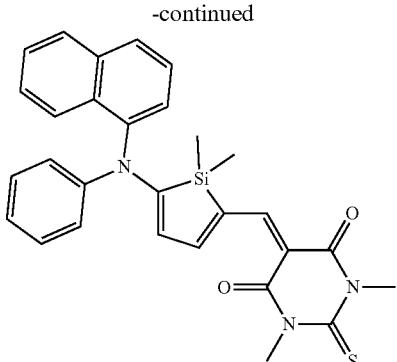
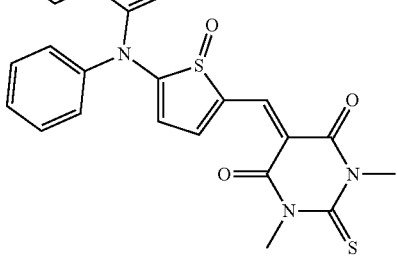
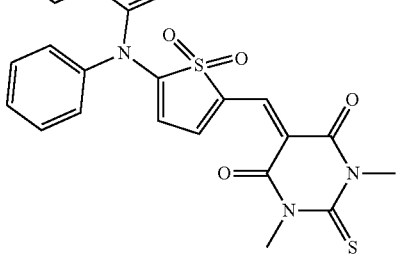
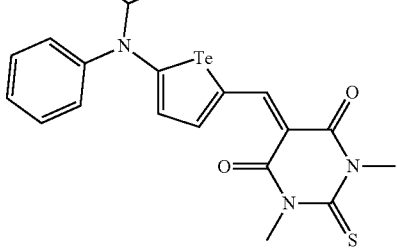
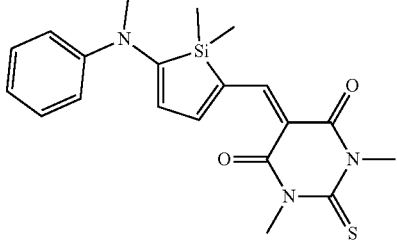

33
-continued
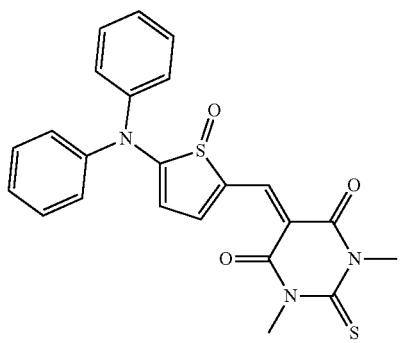
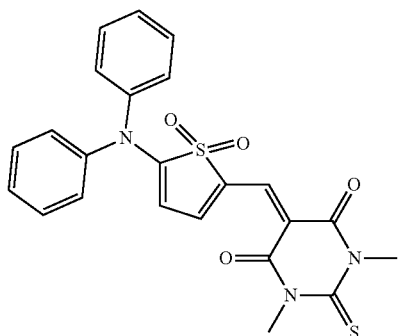
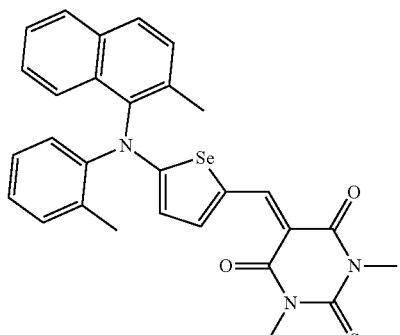
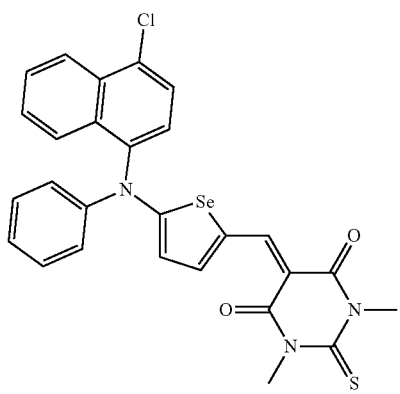
34
-continued
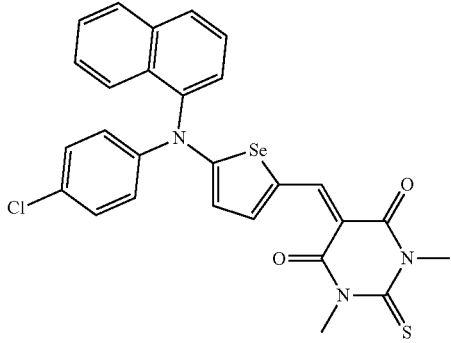
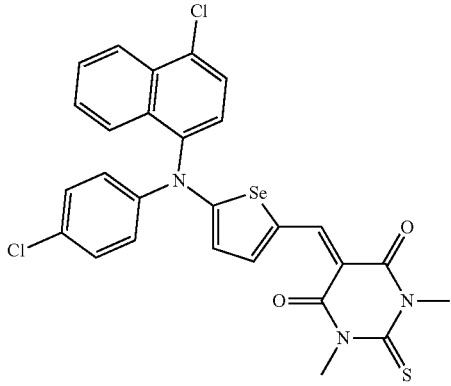
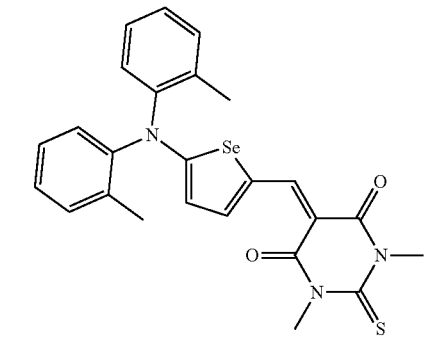
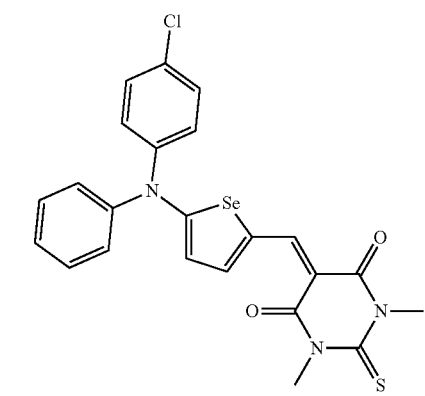

35
-continued
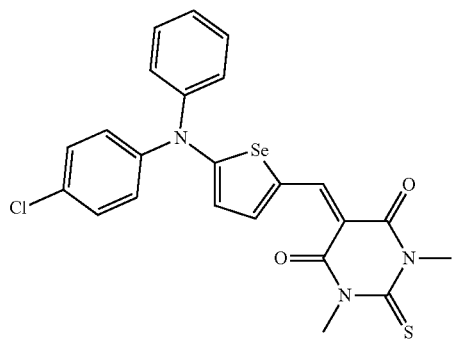
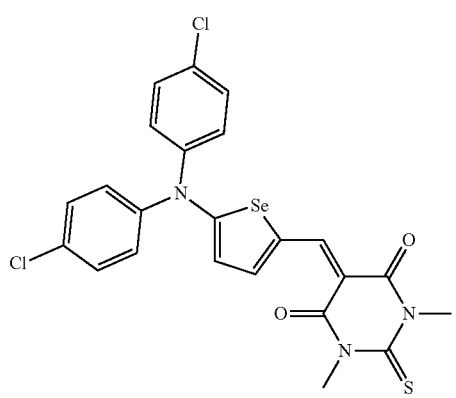
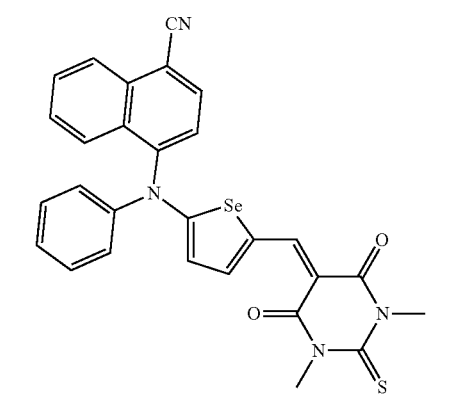
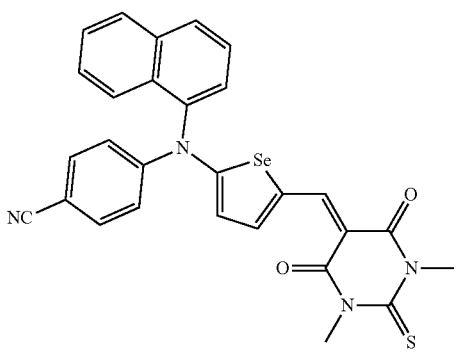
36
-continued
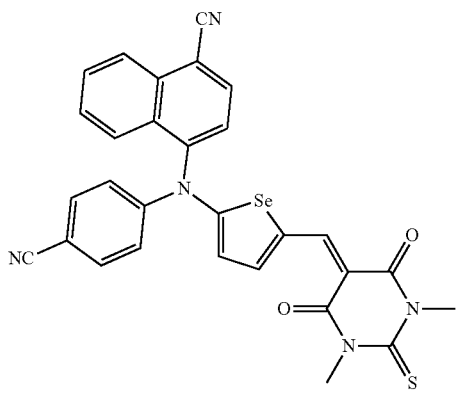
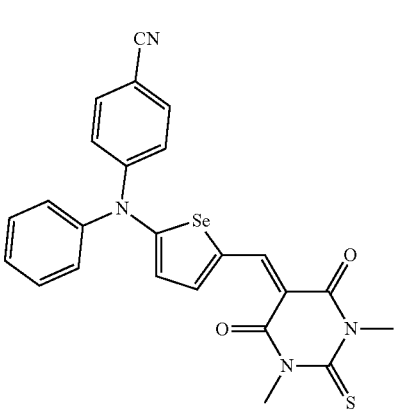
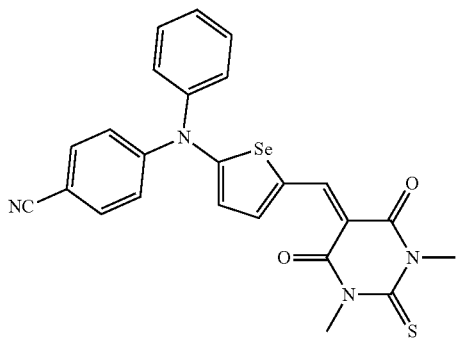
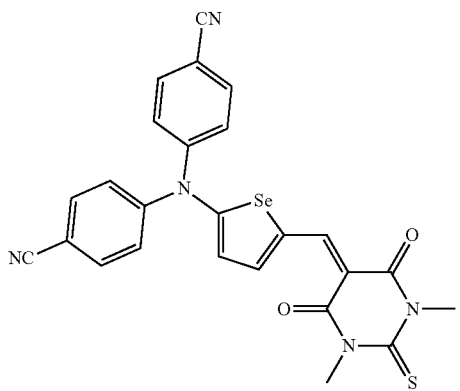

37
-continued
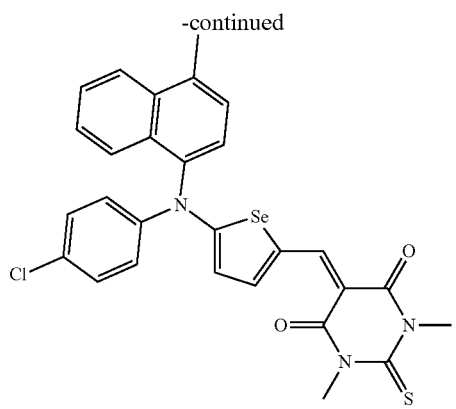
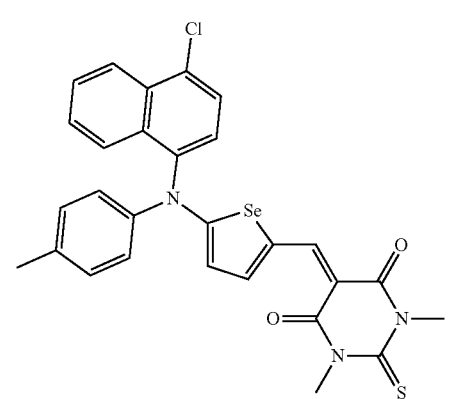
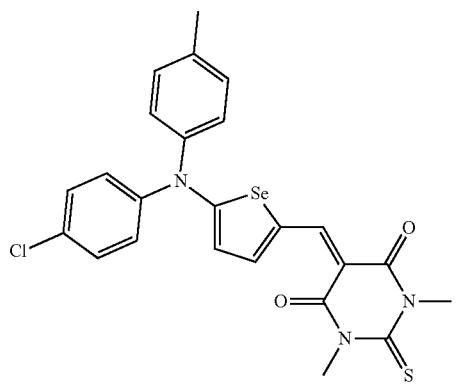
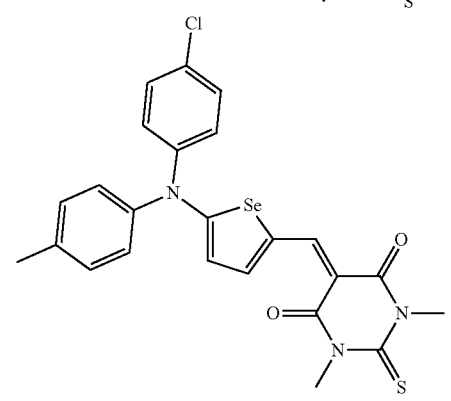
38
-continued
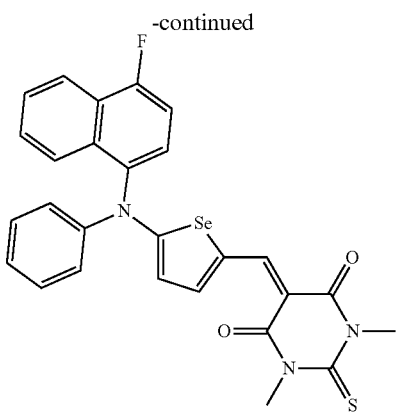
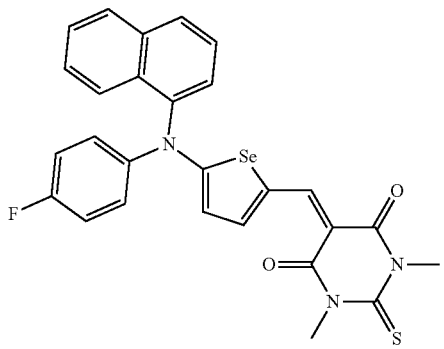
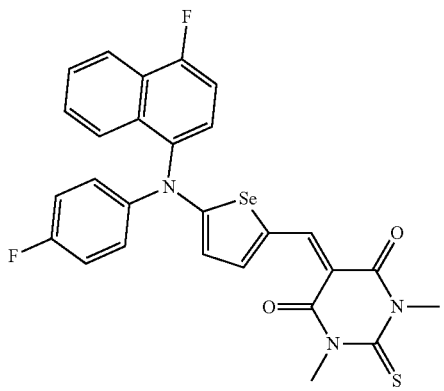
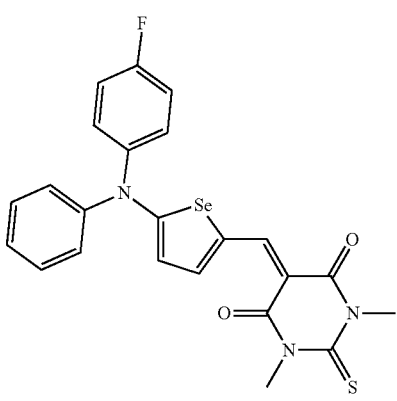

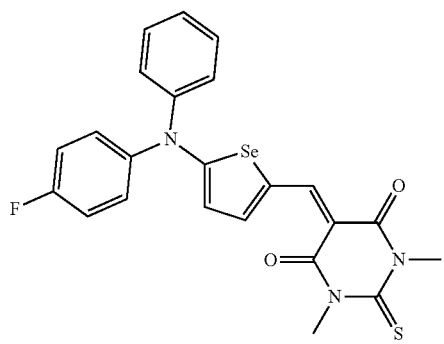
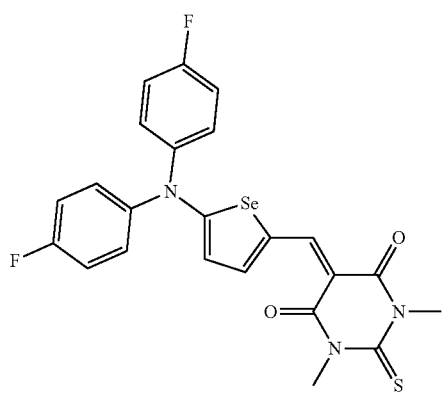
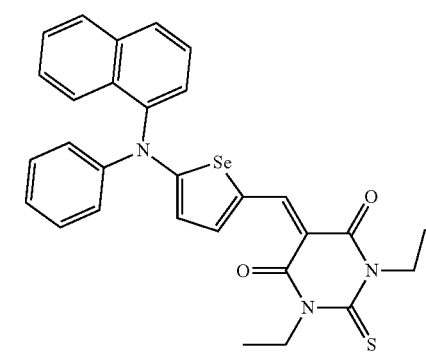
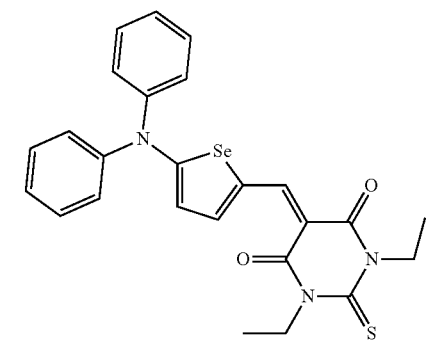
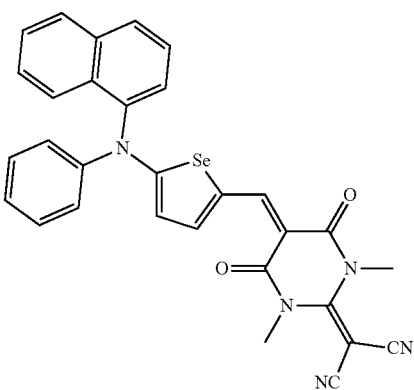
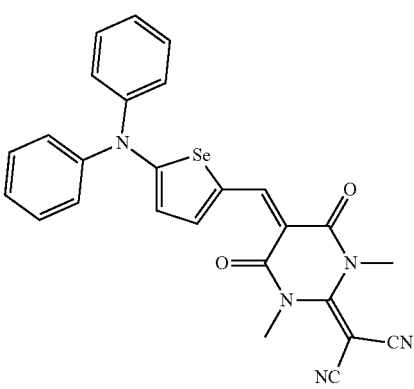
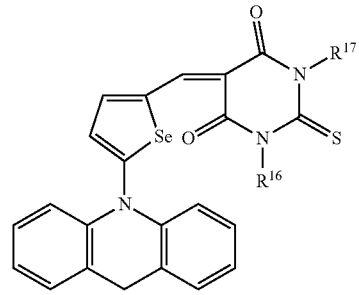
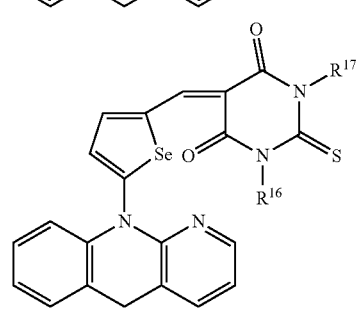
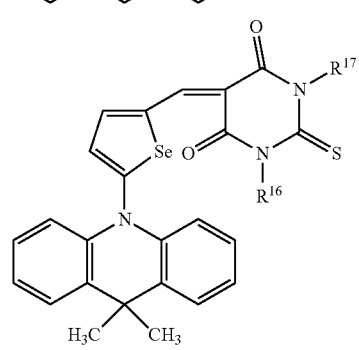

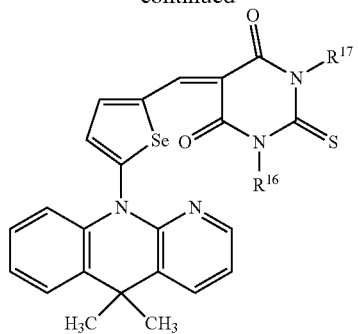
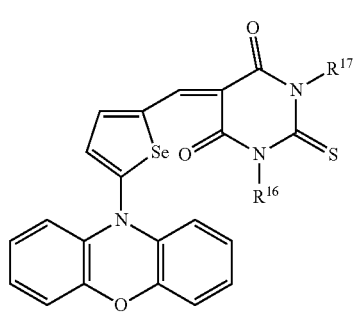
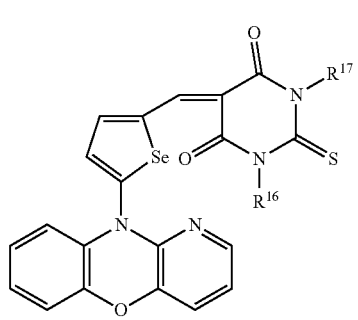
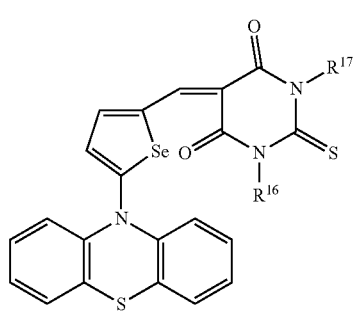
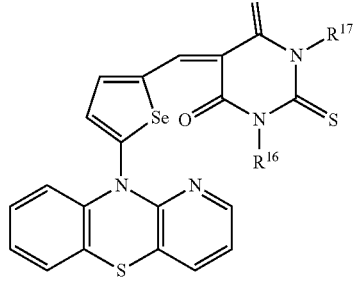
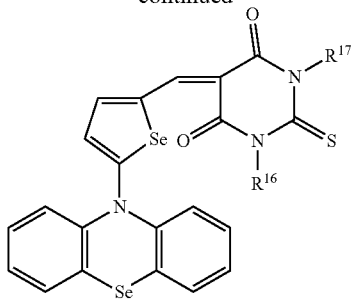
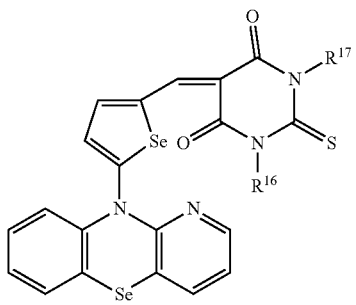
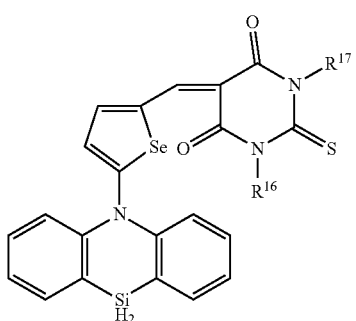
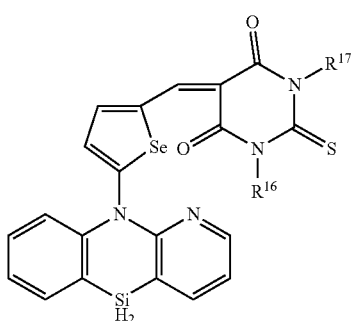
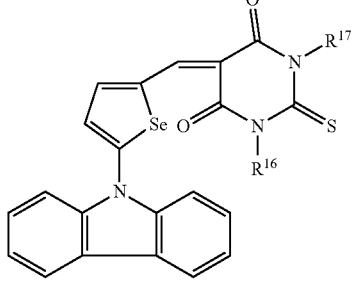

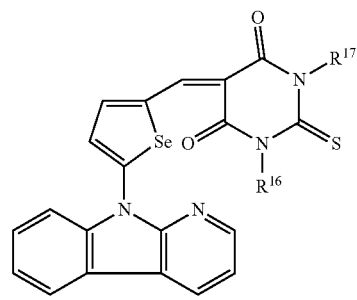
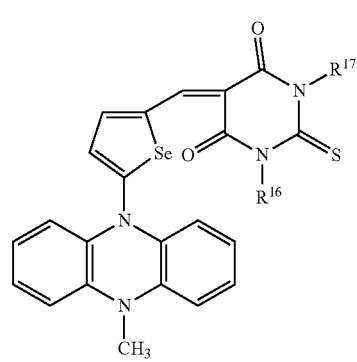
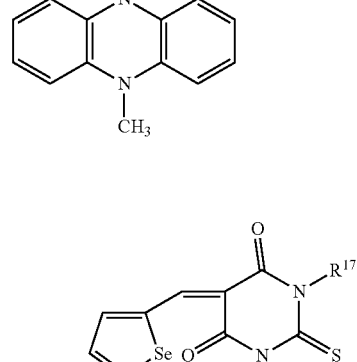
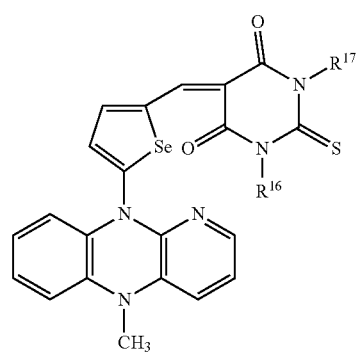
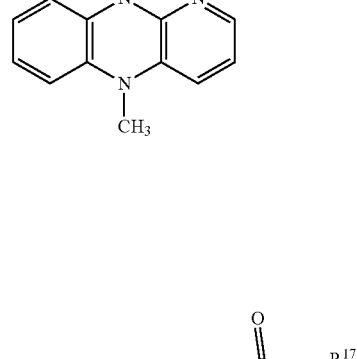
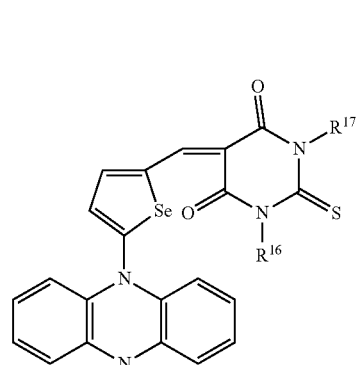
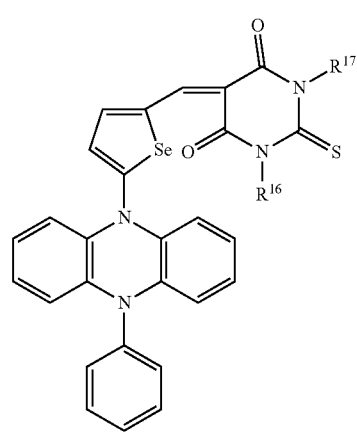
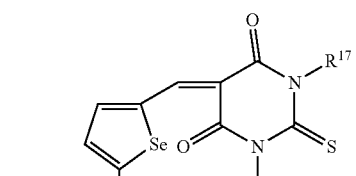
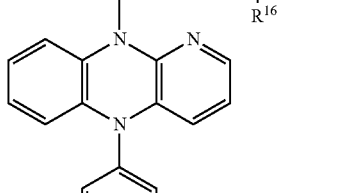
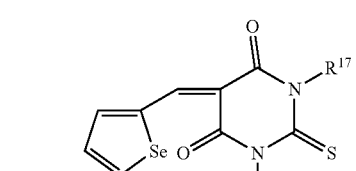
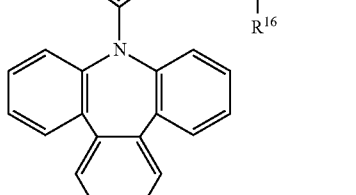
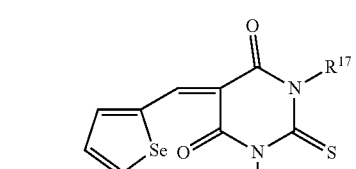
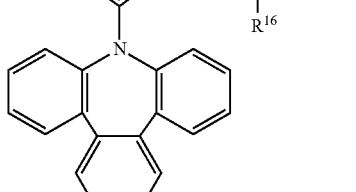
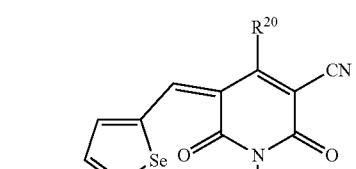
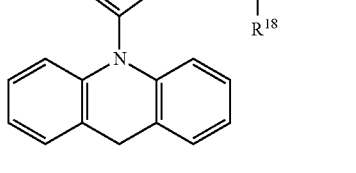

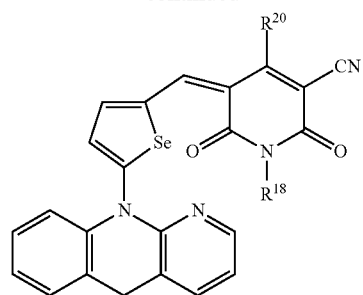
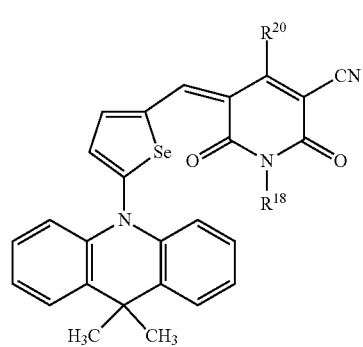
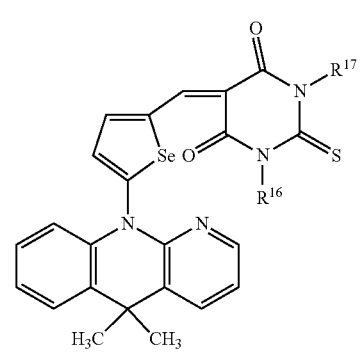
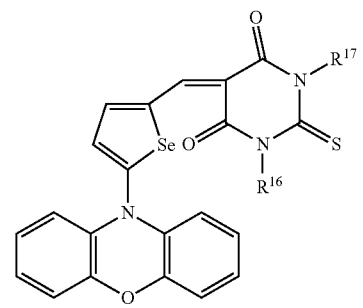
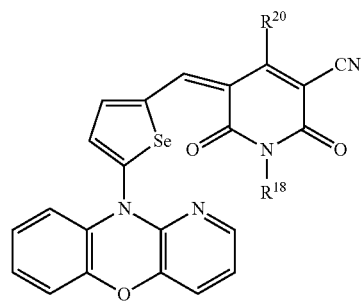
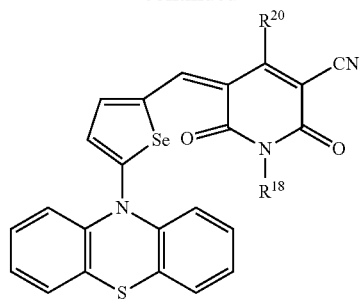
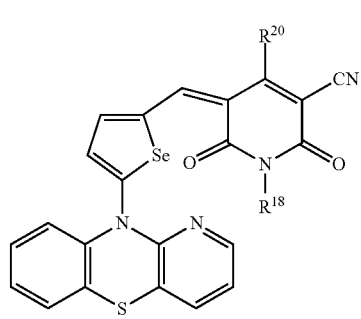
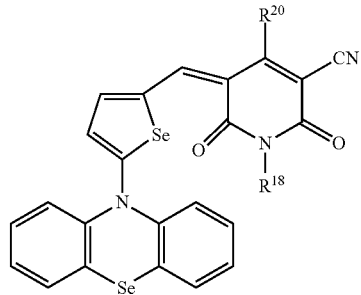
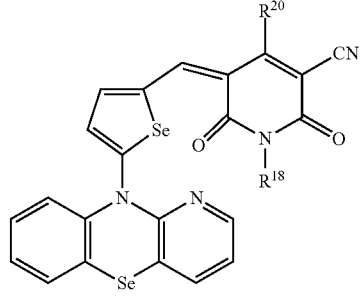
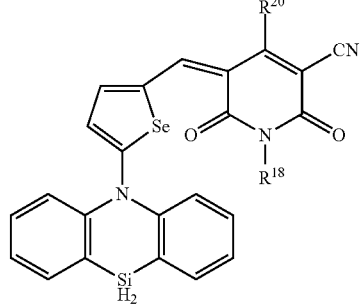

-continued
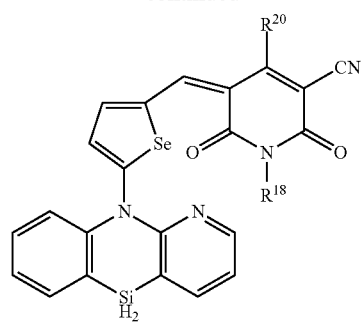
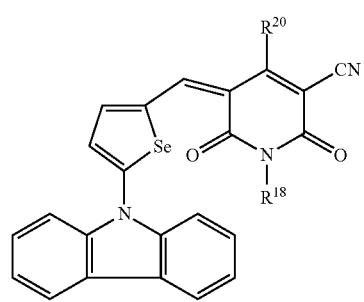
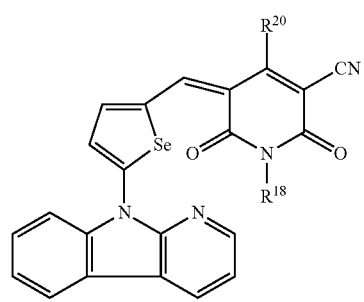
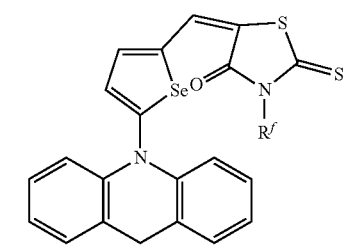
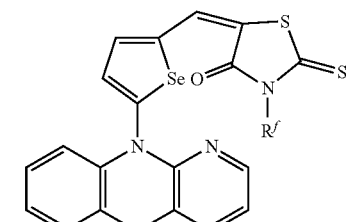
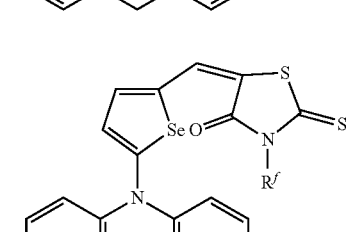
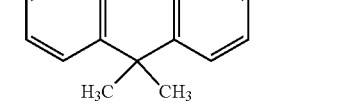
-continued
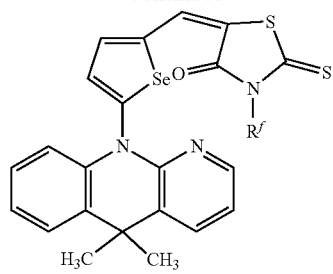
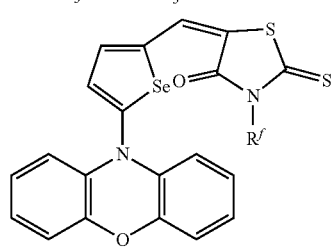
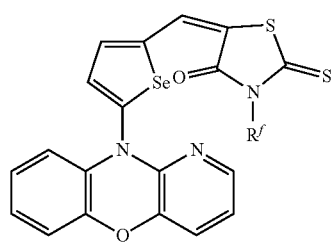
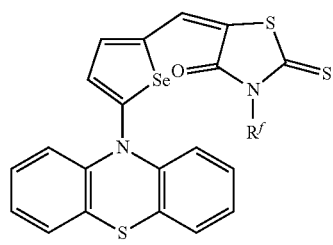
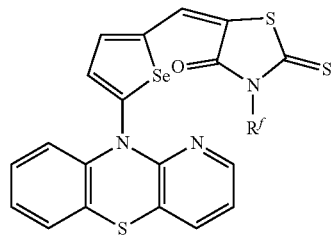
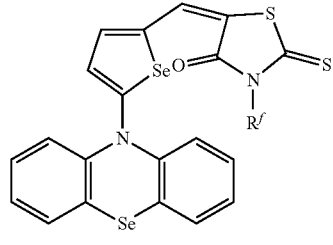
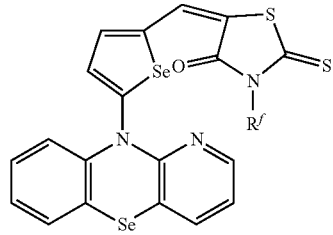

-continued

51
-continued
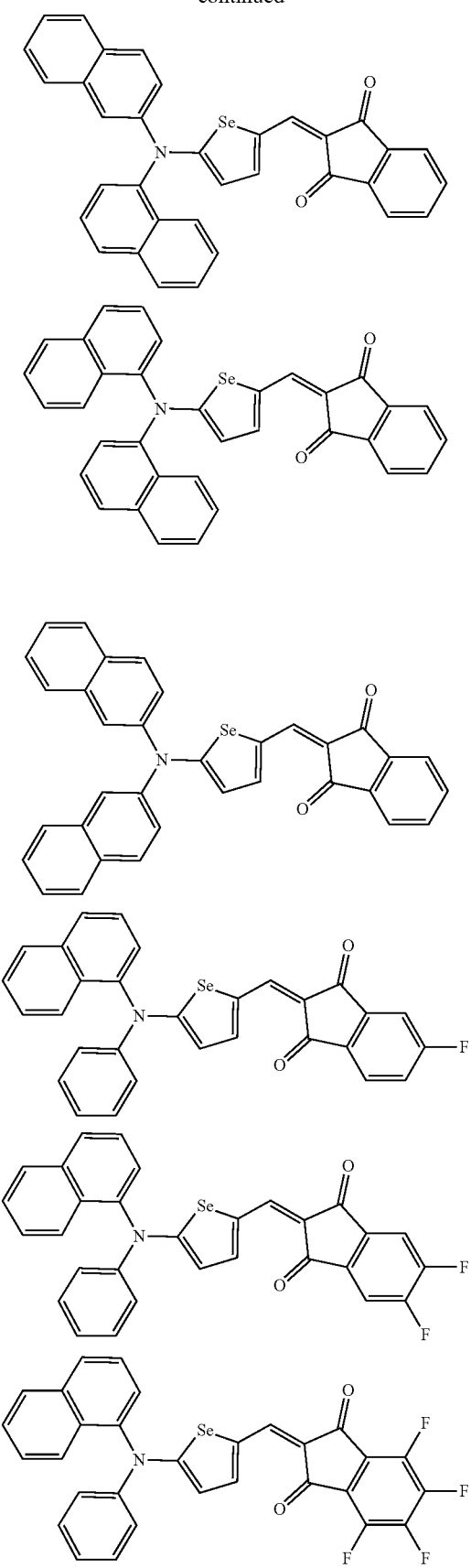
52
-continued
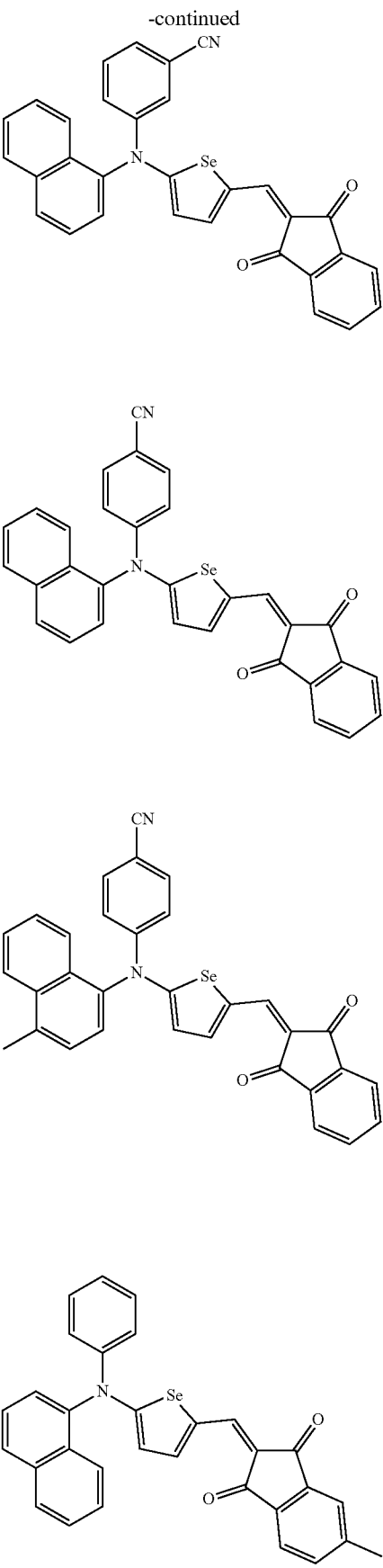

53
-continued
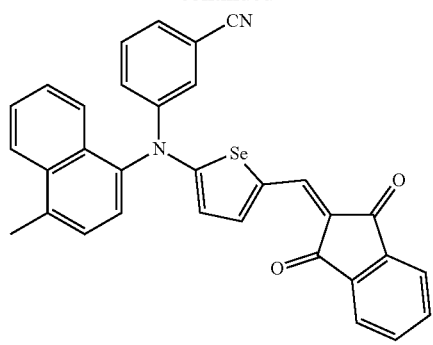
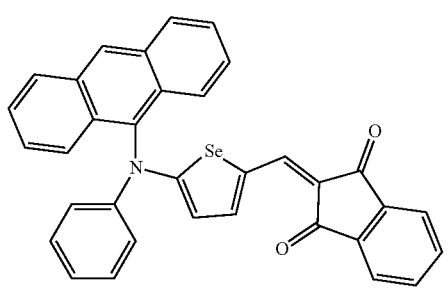
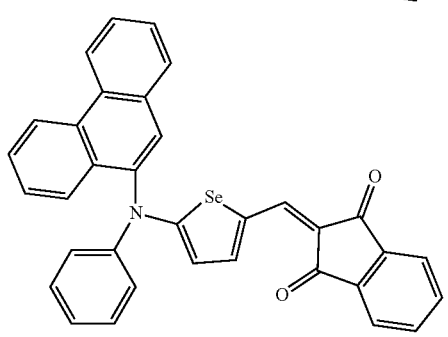
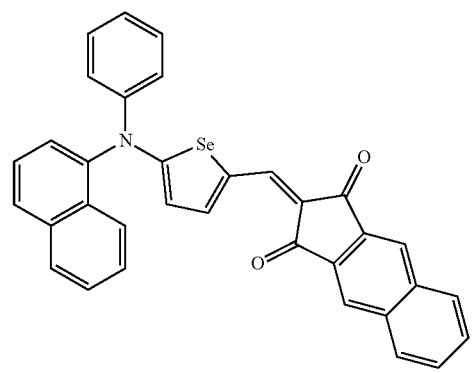
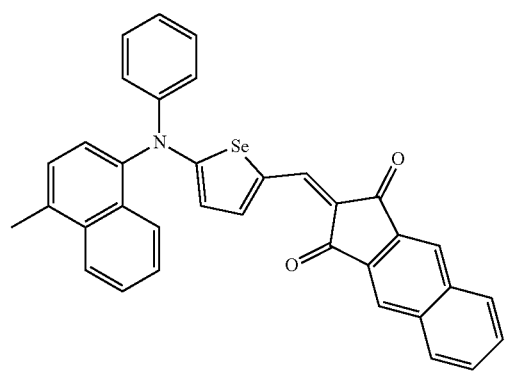
54
-continued
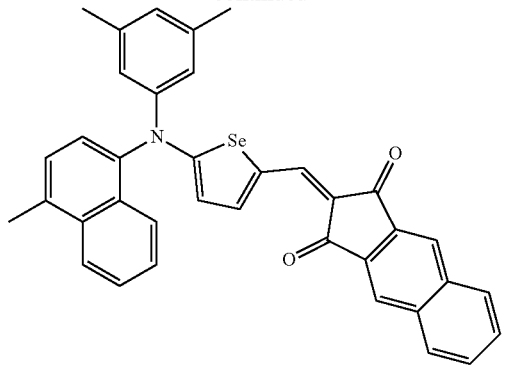
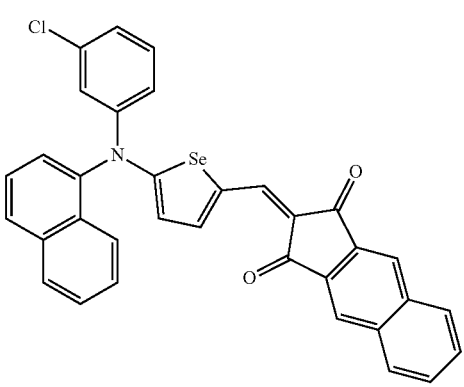
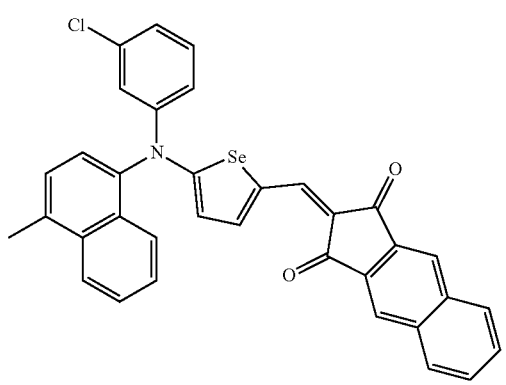
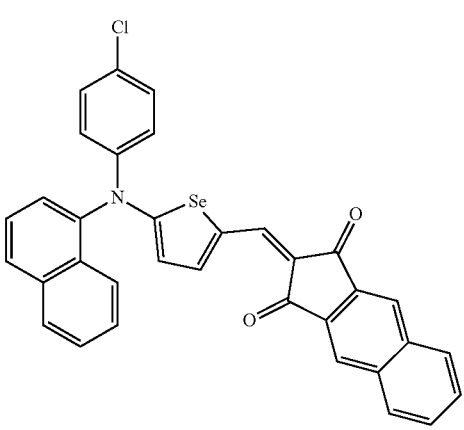

55
-continued
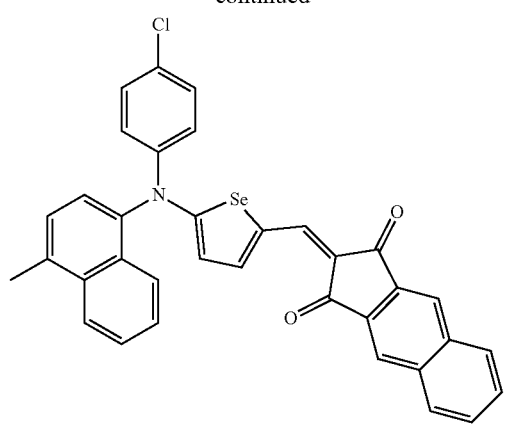
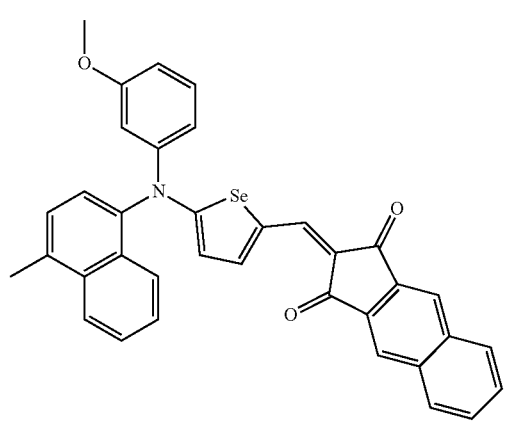
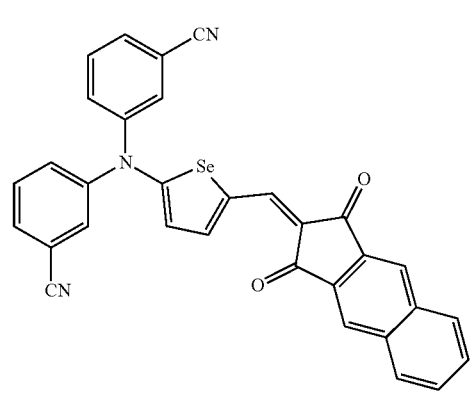
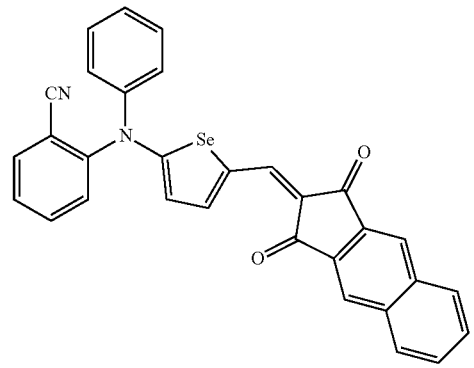
56
-continued
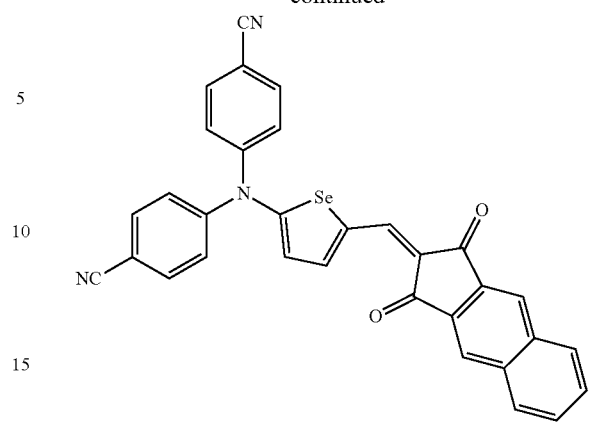
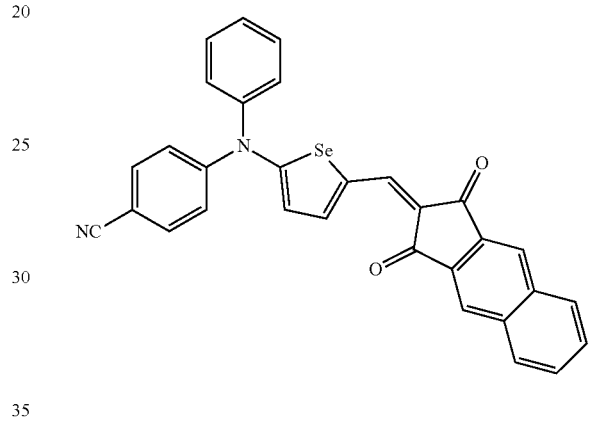
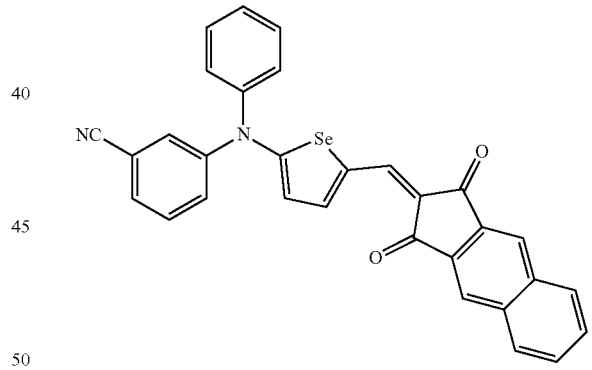
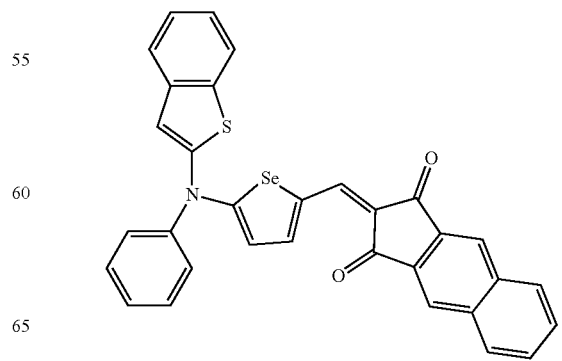

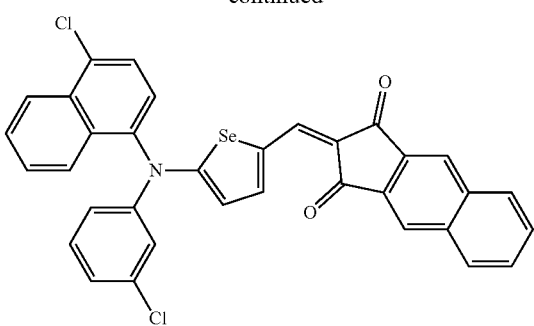
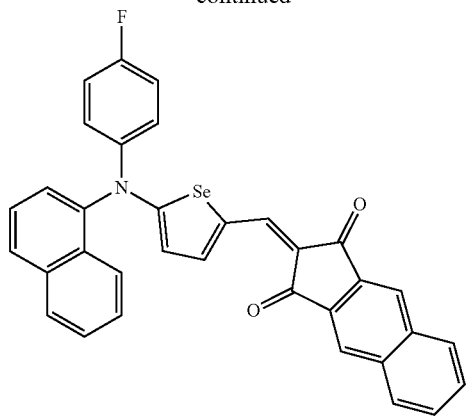
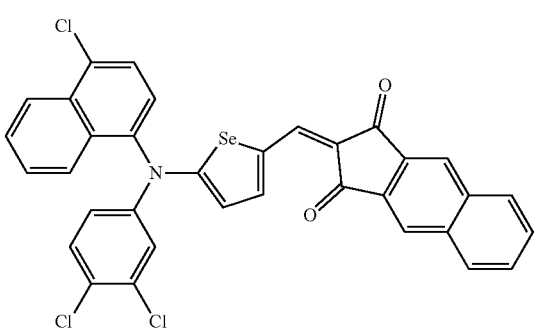
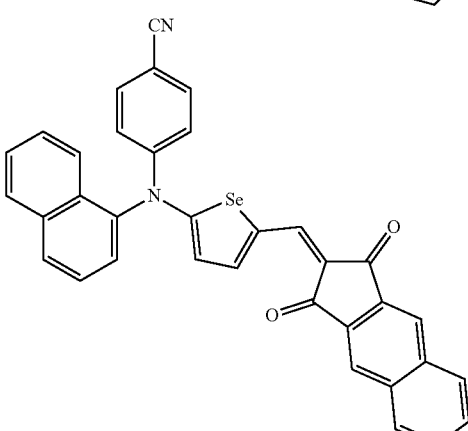
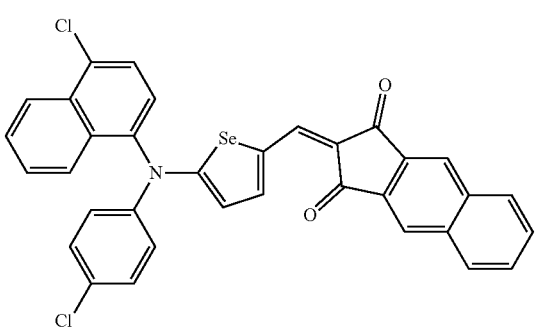
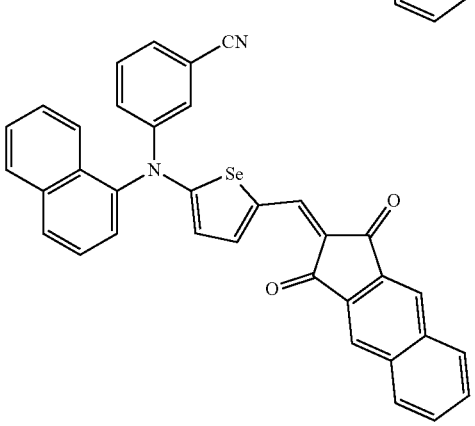
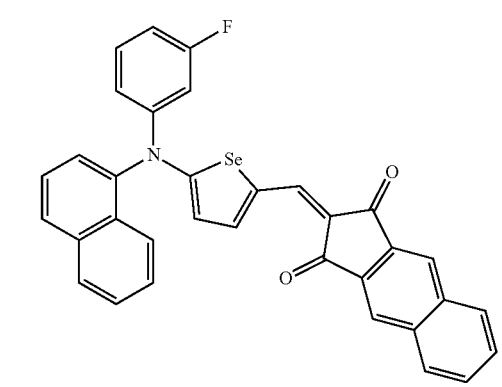
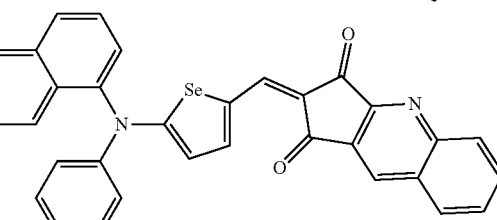
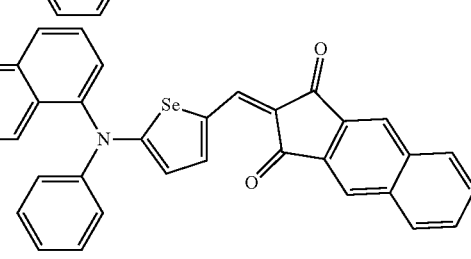

-continued
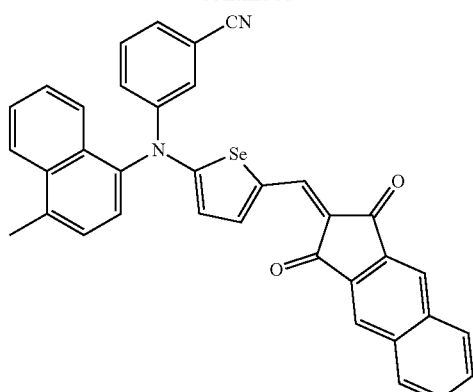
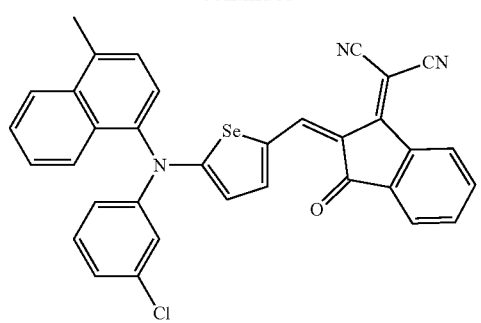
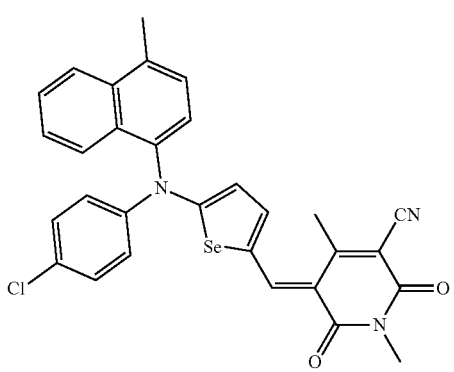
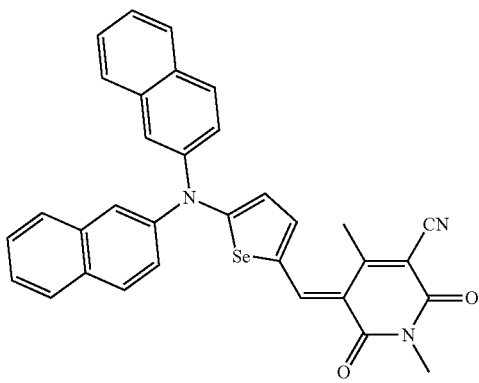
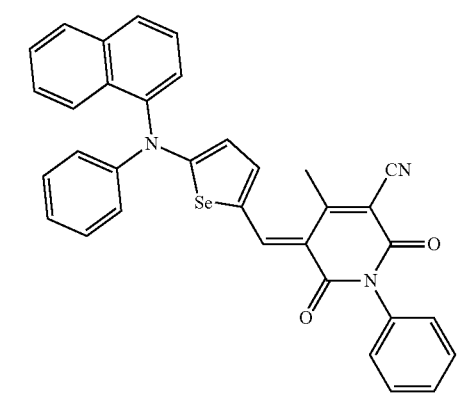

61
-continued
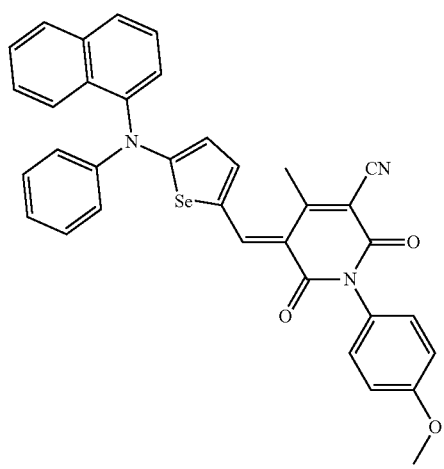
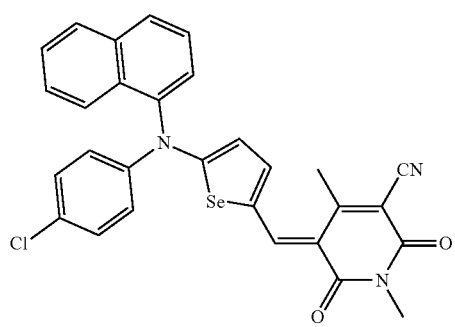
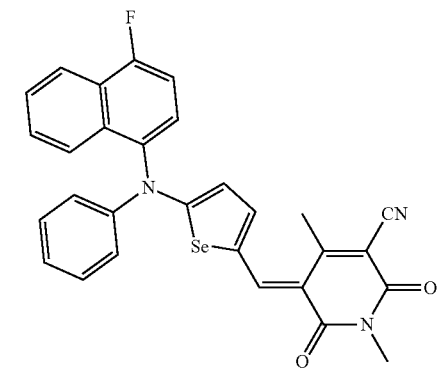
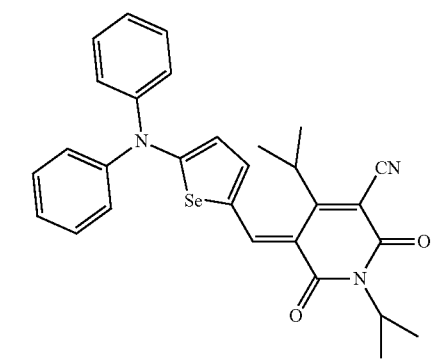
62
-continued
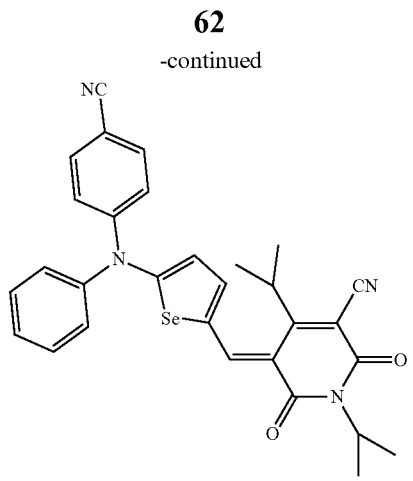
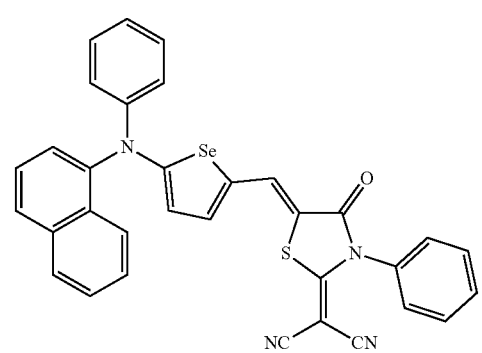
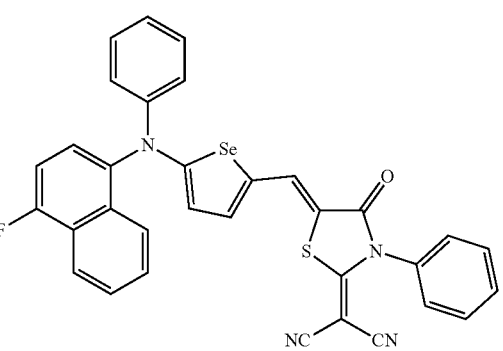
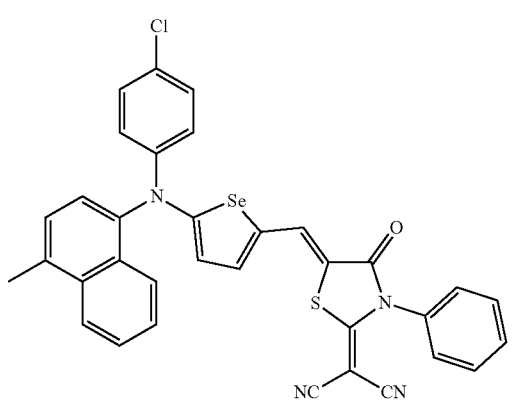

-continued
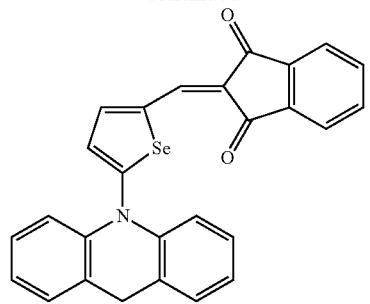
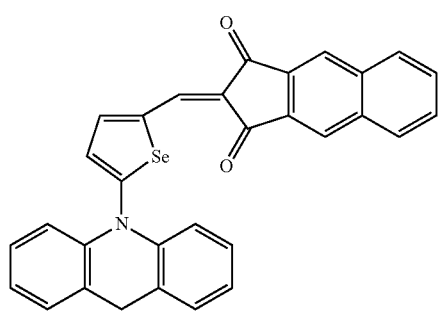
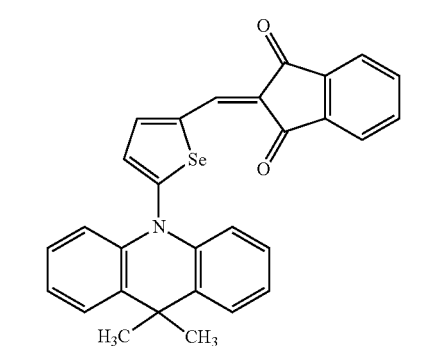
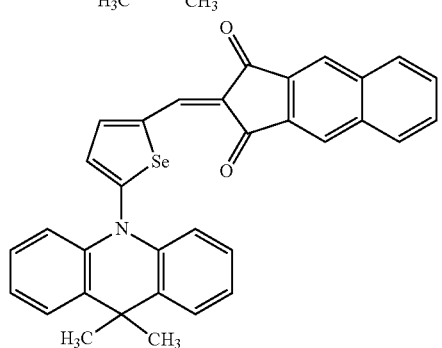
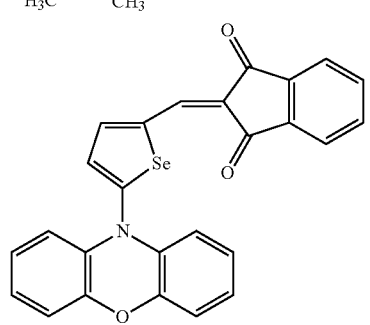
-continued
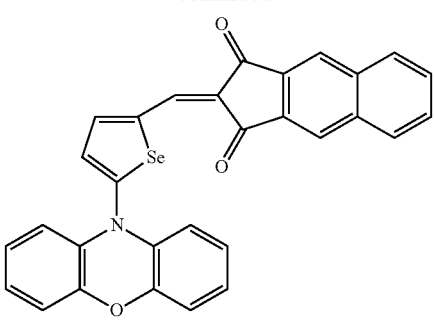
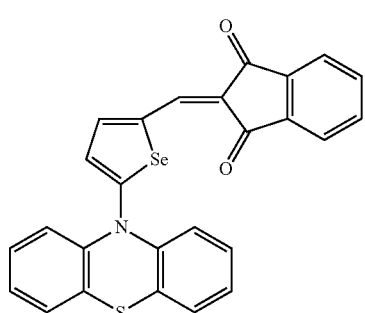
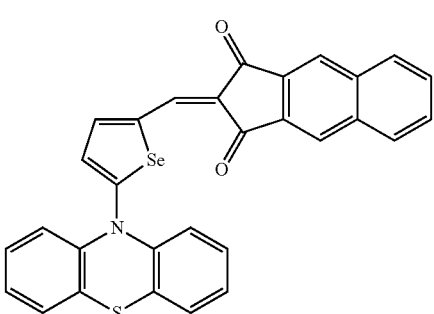
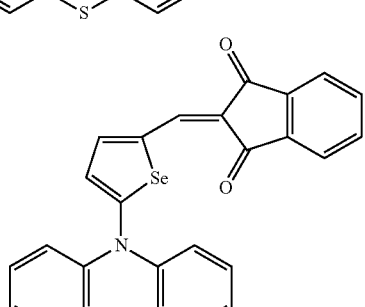
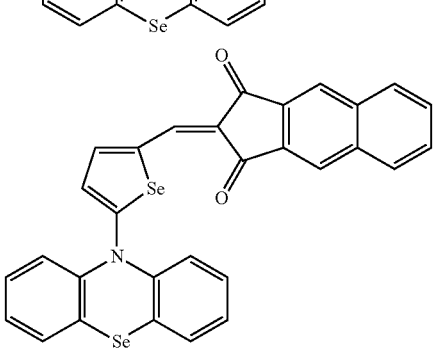

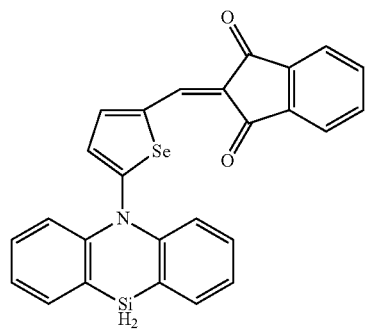
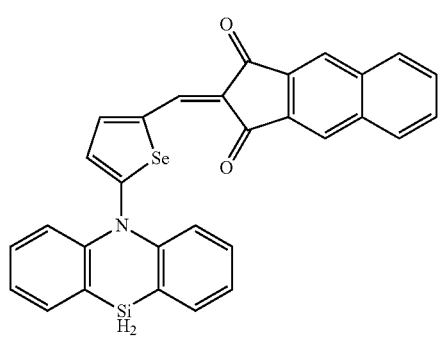
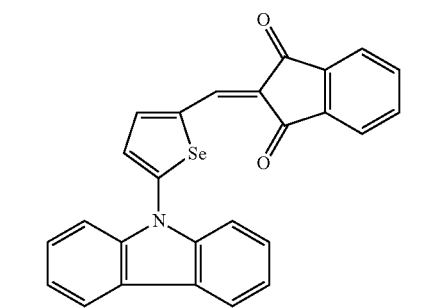
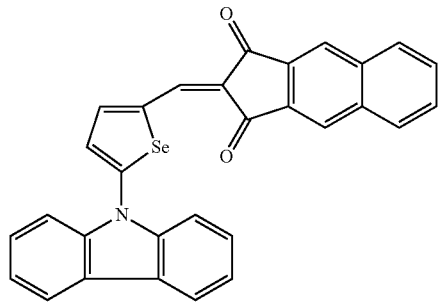
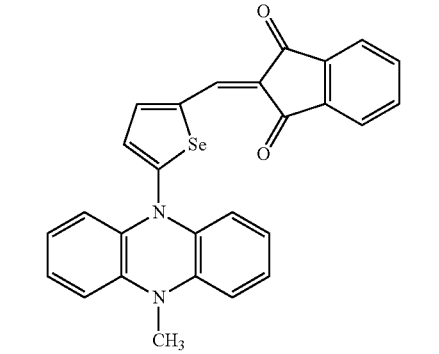
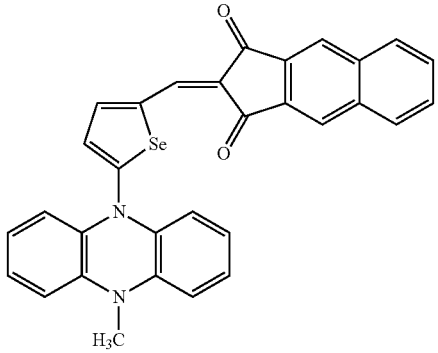
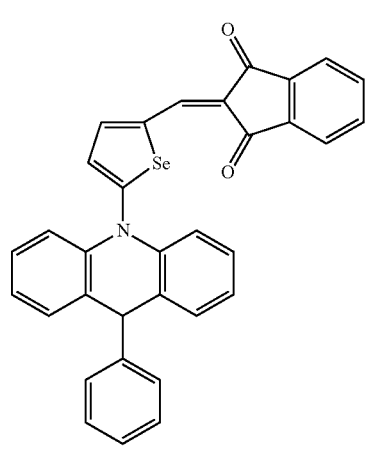
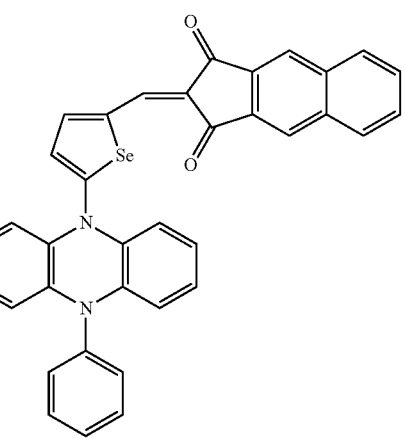
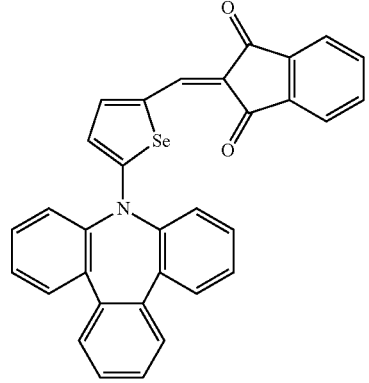

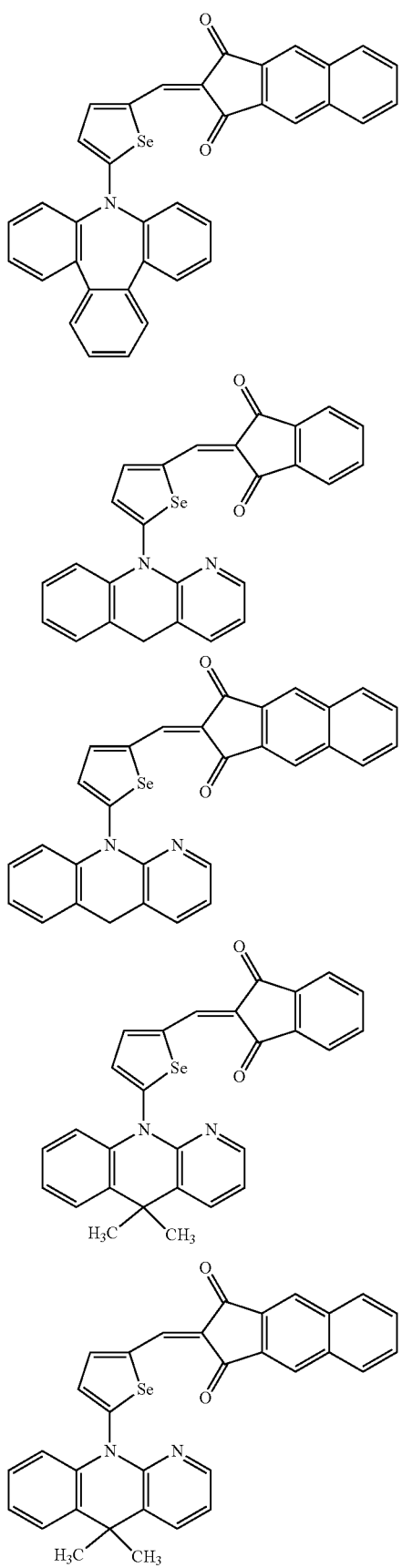
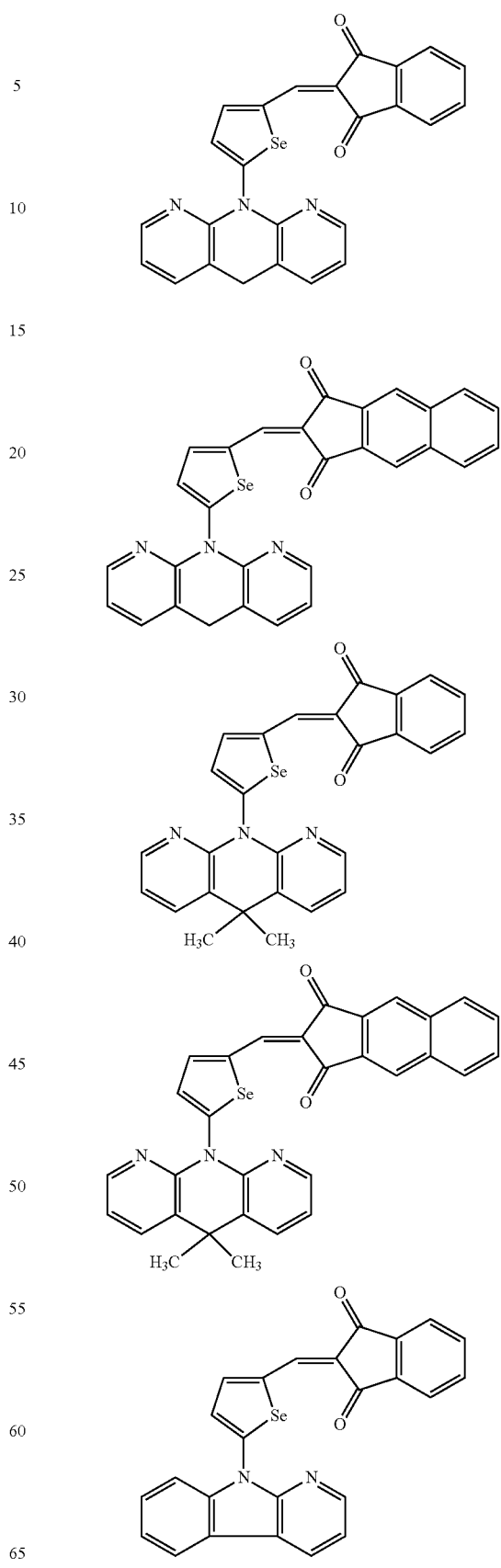

69
-continued
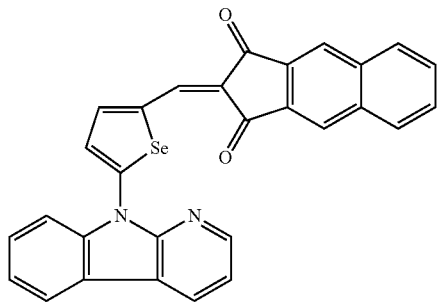
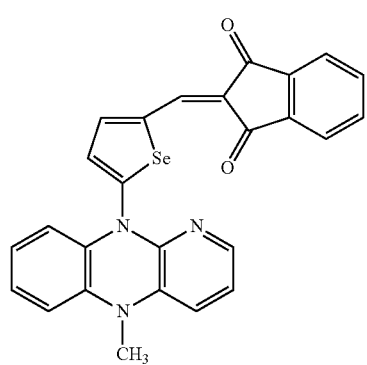
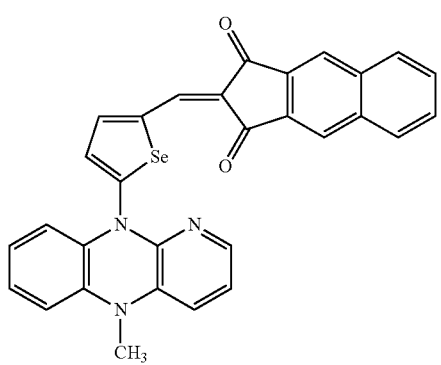
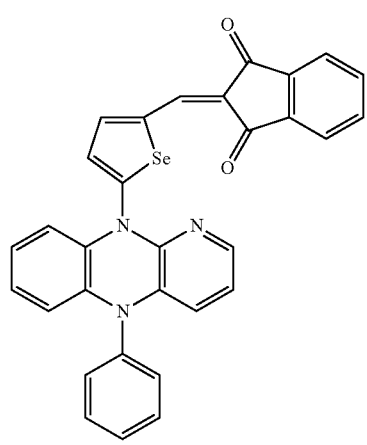
70
-continued
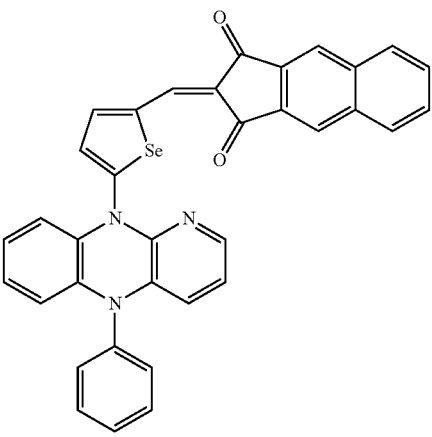
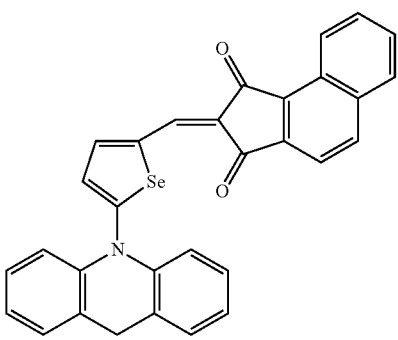
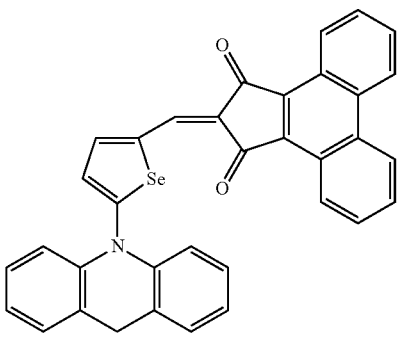 [SMILES: O=C1C(=Cc2ccc(-n3c4ccccc4c4ccccc43)[se]2)C(=O)c2c1c1ccccc1c1ccccc21]
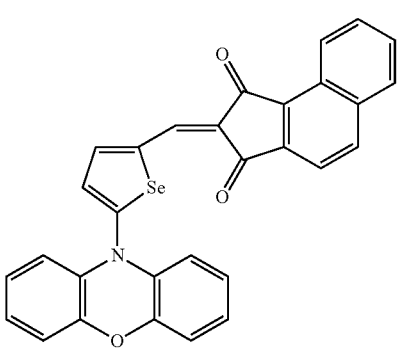

71
-continued

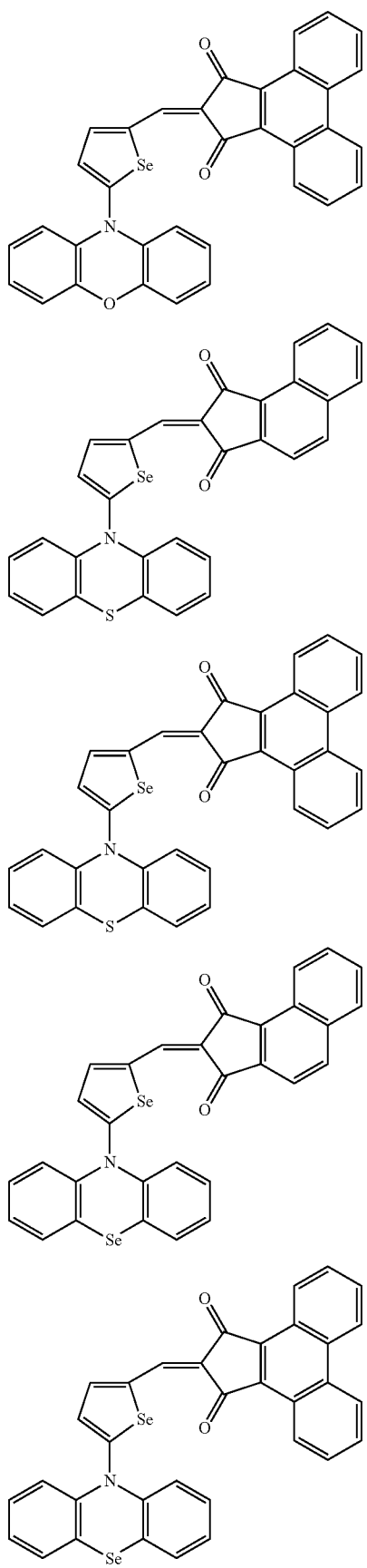

72
-continued

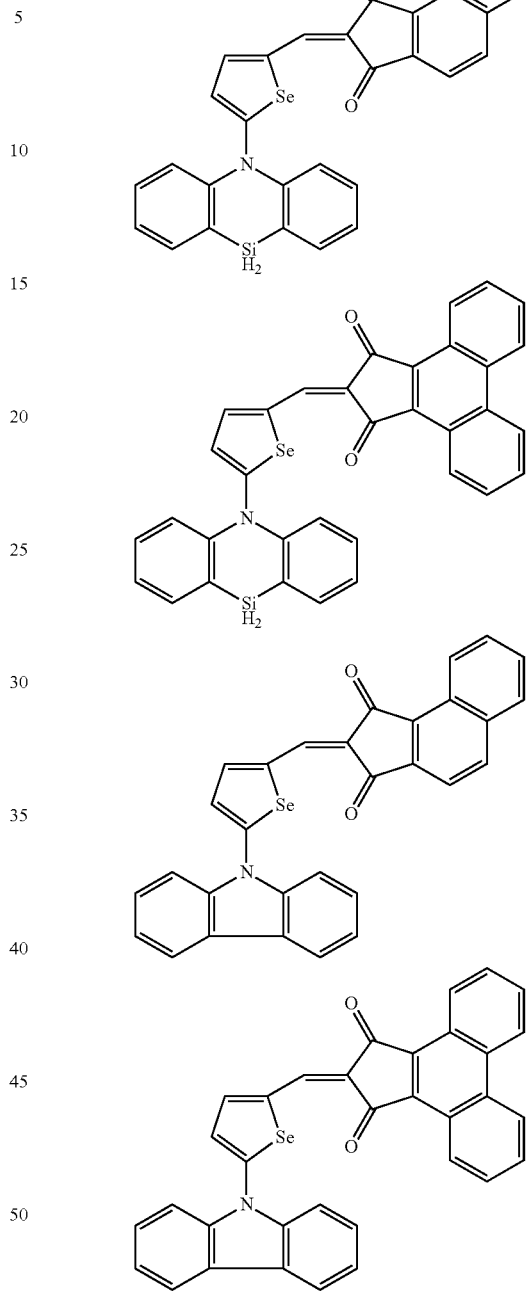

In Group 1, hydrogen of each aromatic ring is replaced by a substituent selected from a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, and a combination thereof, and $R^{16}$, $R^{17}$, $R^{18}$, $R^{20}$, and $R^f$ are independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C4 to C30 heteroaryl group, a halogen, a cyano group, a cyano-containing group, or a combination thereof.

The photoelectric conversion layer 30 may further include a p-type layer and/or an n-type layer (not shown) that are disposed on a lower and/or upper surface of the first photoelectric conversion layer 31 and the second photoelectric conversion layer 32.

The photoelectric device 100 may further include an anti-reflection layer 42 on one surface of the first electrode 10 or the second electrode 20.

The anti-reflection layer 42 is at a light incidence side of the photoelectric device 100 and lowers reflectance of light of incident light and thereby light absorbance is further improved.

For example, when light enters from the first electrode 10, the anti-reflection layer may be disposed on the first electrode 10 while when light enters from the second electrode 20, the anti-reflection layer may be disposed under the second electrode 20.

The anti-reflection layer may include, for example a material having a refractive index of about 1.6 to about 2.5, and may include for example at least one of a metal oxide, a metal sulfide, and an organic material having a refractive index within the ranges.

The anti-reflection layer may include, for example a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as zinc sulfide; or an organic material such as an amine derivative, but is not limited thereto.

In the photoelectric device 100, when light enters from the first electrode 10 or the second electrode 20 and the photoelectric conversion layer 30 absorbs light in a particular (or, alternatively, predetermined) wavelength spectrum of light, excitons may be produced from the inside.

The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Hereinafter, a photoelectric device according to some example embodiments is described.

Figure 2:
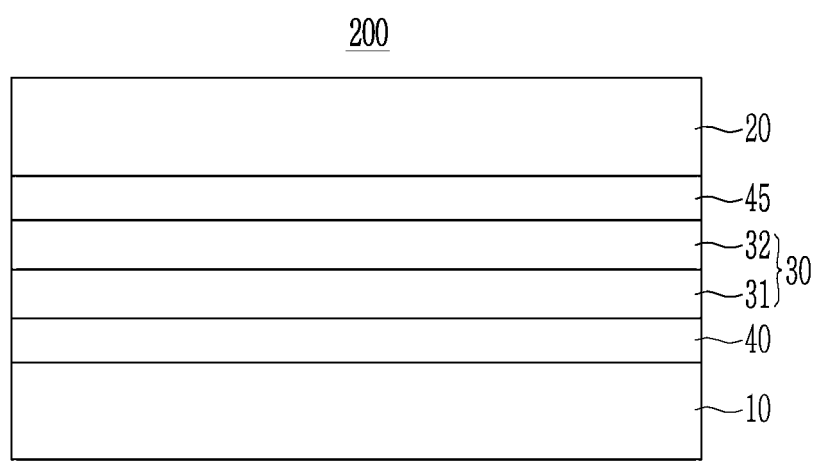
FIG. 2 is a cross-sectional view showing an organic photoelectric device according to some example embodiments.

FIG. 2 is a cross-sectional view showing a photoelectric device according to some example embodiments.

Referring to FIG. 2, the photoelectric device 200 according to some example embodiments includes a first electrode 10 and a second electrode 20 and a photoelectric conversion layer 30 including a first photoelectric conversion layer 31 and a second photoelectric conversion layer 32 disposed between the first electrode 10 and the second electrode 20, like some example embodiments The first electrode 10, the second electrode 20, and the photoelectric conversion layer 30 are the same as described above.

However, the photoelectric device 200 according to some example embodiments further includes each charge auxiliary layer 40 and 45 between the first electrode 10 and the photoelectric conversion layer 30 and the second electrode 20 and the photoelectric conversion layer 30, unlike some example embodiments. As shown in FIG. 2, a photoelectric device 200 may include a charge auxiliary layer (e.g., 40, 45) at least one of: between the first electrode 10 and the first photoelectric conversion layer 31, or between the second electrode 20 and the second photoelectric conversion layer 32. Such a charge auxiliary layer (e.g., 40, 45) may be configured to not substantially absorb light in one or more particular visible wavelength spectra of light.

The charge auxiliary layers 40 and 45 may make holes and electrons separated in the photoelectric conversion layer 30 be transported easily to improve efficiency.

The charge auxiliary layers 40 and 45 may include at least one selected from a hole injection layer for facilitating hole injection, a hole transport layer for facilitating hole transport, an electron blocking layer for reducing and/or preventing electron transport, an electron injection layer for facilitating electron injection, an electron transport layer for facilitating electron transport, and a hole blocking layer for reducing and/or preventing hole transport.

The charge auxiliary layers 40 and 45 may include for example an organic material, an inorganic material, or an organic/inorganic material.

The organic material may be an organic material having hole or electron characteristics and the inorganic material may be for example a metal oxide such as a molybdenum oxide, a tungsten oxide, or a nickel oxide.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

At least one of the charge auxiliary layers 40 and 45 may not absorb light in a visible ray region substantially and may include for example a visible light non-absorbing material.

The visible light non-absorbing material may be for example a material that does not absorb light in a visible ray region substantially and may be for example visible light non-absorbing organic material.

The visible light non-absorbing material may be for example a charge buffer material, for example a hole buffer material or an electron buffer material, for example a hole injection material, a hole transport material, a hole blocking material, an electron injecting material, an electron transport material, or an electron blocking material.

For example, the visible light non-absorbing material may have an energy bandgap of greater than or equal to about 2.8 eV, for example greater than or equal to about 3.0 eV.

The visible light non-absorbing material may have for example an energy bandgap of about 2.8 eV to about 4.0 eV, for example about 3.0 eV to about 3.8 eV.

For example, the visible light non-absorbing material may have for example a HOMO energy level of about 5.4 eV to about 5.8 eV, for example about 5.50 eV to about 5.75 eV.

Herein, the HOMO energy level refers to an absolute value of the HOMO energy level when a vacuum level is 0 eV.

For example, the visible light non-absorbing material may be a compound represented by Chemical Formula 2A or 2B, but is not limited thereto.

[Chemical Formula 2A]

[Chemical Formula 2B]

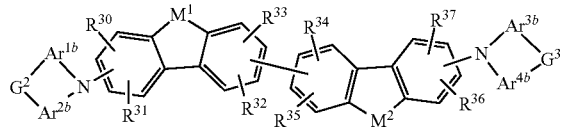

In Chemical Formula 2A or 2B, $M^1$ and $M^2$ are independently $CR''R^o$, $SiR^pR^q$, $NR^r$, O, S, Se, or Te, $Ar^{1b}$, $Ar^{2b}$, $Ar^{3b}$, and $Ar^{4b}$ are independently a substituted or unsubstituted C6 to C30 aryl group or a substituted or unsubstituted C3 to C30 heteroaryl group, $G^2$ and $G^3$ are independently a single bond, —$(CR^sR^t)_{n3}$—, —O—, —S—, —Se—, —N=, —$NR^u$—, —$SiR'R^w$—, or —$GeR^xR^y$—, wherein n3 is 1 or 2, and $R^{30}$ to $R^{37}$ and $R^n$ to $R^y$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

For example, the visible light non-absorbing material may be a compound represented by Chemical Formula 2A-1 or 2B-1, but is not limited thereto.

[Chemical Formula 2A-1]

[Chemical Formula 2B-1]

In Chemical Formula 2A-1 or 2B-1, $M^1$, $M^2$, $G^2$, $G^3$, and $R^{30}$ to $R^{37}$ are the same as described above, and $R^{38}$ to $R^{45}$ are independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the visible light non-absorbing material may be a compound represented by Chemical Formula 2A-1a or 2B-1a, but is not limited thereto.

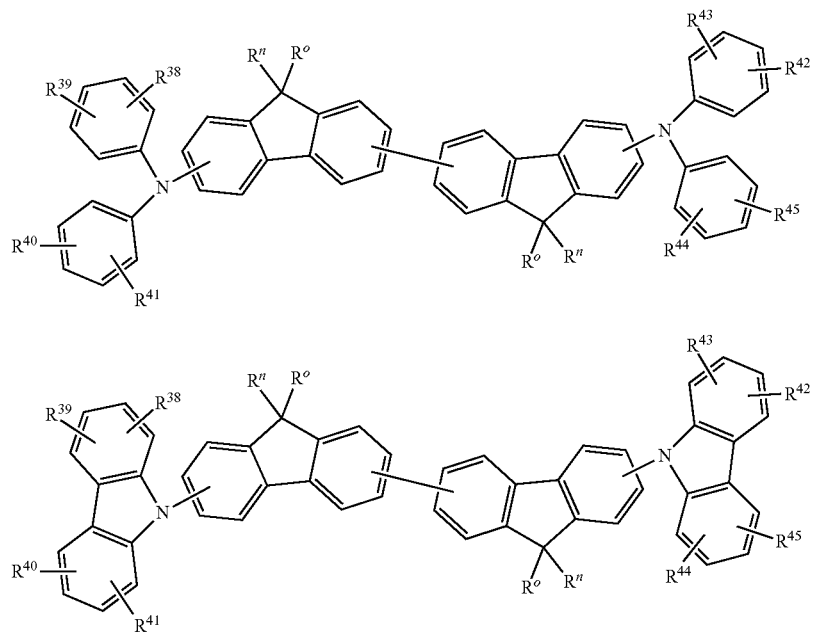

[Chemical Formula 2A-1a]

[Chemical Formula 2B-1a]

In Chemical Formula 2A-1a or 2B-1a, $R^{38}$ to $R^{45}$ and $R^o$ and $R^n$ are the same as described above.

Each thickness of the charge auxiliary layers 40 and 45 may be for example about 1 nm to about 20 nm.

Either one of the charge auxiliary layers 40 and 45 may be omitted.

The photoelectric device may be applied to an image sensor, a photodetector, a photosensor, and an organic light emitting diode (OLED), and the like, but is not limited thereto.

The photoelectric device may be for example applied to an image sensor.

Hereinafter, an example of an image sensor including the photoelectric device is described referring to drawings.

As an example of an image sensor, an organic CMOS image sensor is described.

Figure 3:
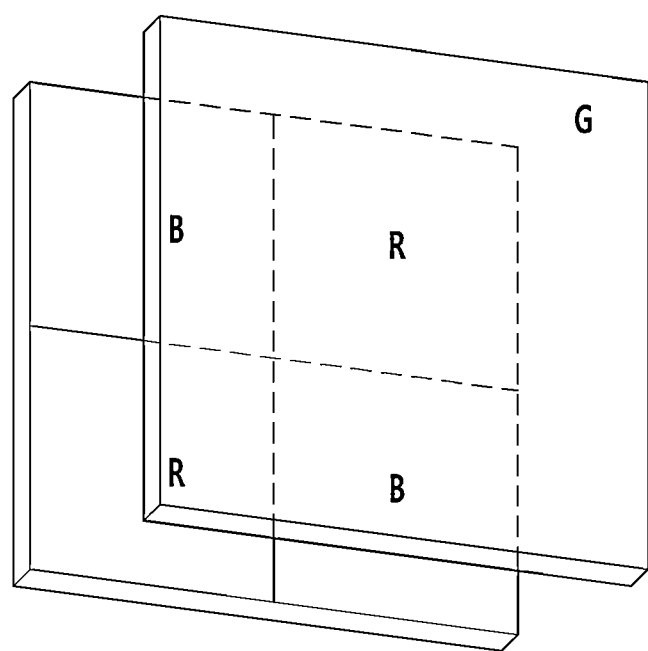
FIG. 3 is a schematic top plan view showing an organic CMOS image sensor according to some example embodiments.
Figure 4:
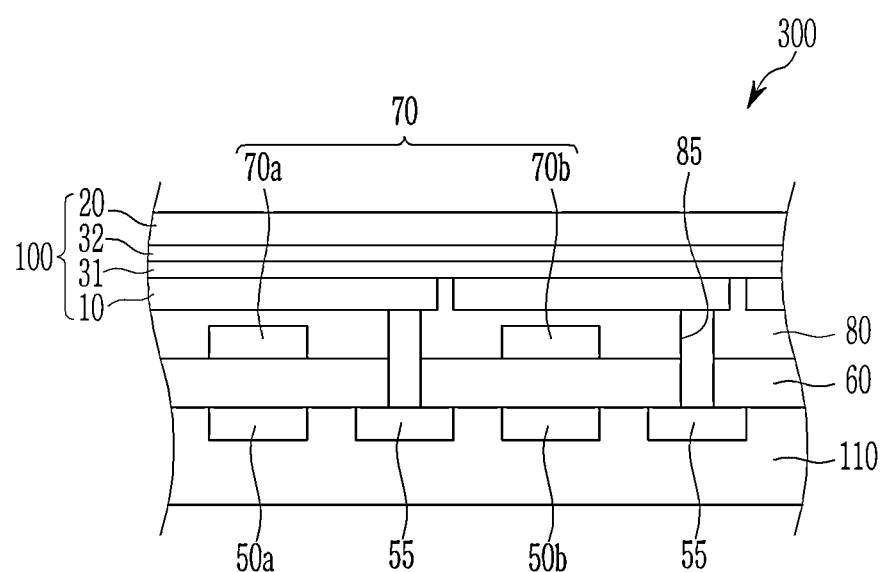
FIG. 4 is a cross-sectional view showing one example of the organic CMOS image sensor of FIG. 3.

FIG. 3 is a schematic top plan view of an organic CMOS image sensor according to some example embodiments and FIG. 4 is a cross-sectional view showing one example of the organic CMOS image sensor of FIG. 3.

Referring to FIGS. 3 and 4, an organic CMOS image sensor 300 according to some example embodiments includes a semiconductor substrate 110 integrated with photo-sensing devices 50a and 50b, a transmission transistor (not shown) and a charge storage 55, a lower insulation layer 60, a color filter layer 70, an upper insulation layer 80, and a photoelectric device 100.

The semiconductor substrate 110 may be a silicon substrate, and is integrated with the photo-sensing devices 50a and 50b, the transmission transistor (not shown), and the charge storage 55.

The photo-sensing devices 50a and 50b may be photodiodes.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

The photo-sensing devices 50a and 50b sense light, the information sensed by the photo-sensing devices may be transferred by the transmission transistor, the charge storage 55 is electrically connected to the photoelectric device 100 that will be described later, and the information of the charge storage 55 may be transferred by the transmission transistor.

A metal wire (not shown) and a pad (not shown) are formed on the semiconductor substrate 110.

In order to decrease signal delay, the metal wire and pad may be made of a metal having low resistivity, for example, aluminum (Al), copper (Cu), silver (Ag), and alloys thereof, but are not limited thereto.

Further, it is not limited to the structure, and the metal wire and pad may be disposed under the photo-sensing device 50a and 50b.

The lower insulation layer 60 is formed on the metal wire and the pad.

The lower insulation layer 60 may be made of an inorganic insulating material such as a silicon oxide and/or a silicon nitride, or a low dielectric constant (low K) material such as SiC, SiCOH, SiCO, and SiOF.

The lower insulation layer 60 has a trench exposing the charge storage 55.

The trench may be filled with fillers.

A color filter layer 70 is formed on the lower insulation layer 60.

The color filter layer 70 includes a blue filter 70a formed in a blue pixel and a red filter 70b in a red pixel.

In some example embodiments, a green filter is not included, but a green filter may be further included.

The upper insulation layer 80 is formed on the color filter layer 70.

The upper insulation layer 80 eliminates a step caused by the color filter layer 70 and smoothens the surface.

The upper insulation layer 80 and the lower insulation layer 60 may include a contact hole (not shown) exposing a pad, and a through-hole 85 exposing the charge storage 55 of the green pixel.

The photoelectric device 100 is formed on the upper insulation layer 80.

The photoelectric device 100 includes the first electrode 10; the photoelectric conversion layer 30 including the first photoelectric conversion layer 31 and the second photoelectric conversion layer 32; and the second electrode 20 as described above.

In the drawing, the first electrode 10, the photoelectric conversion layer 30, and the second electrode 20 are sequentially stacked (e.g., one of the elements is "on" another one of the elements), but this disclosure is not limited thereto, and for example they may be stacked in an order of the second electrode 20, the photoelectric conversion layer 30, and the first electrode 10. As referred to herein, an element that is "on" another element may be directly or indirectly on the other element, above or below the other element, some combination thereof, or the like.

The first electrode 10 and the second electrode 20 may be all light-transmitting electrodes and the photoelectric conversion layer 30 is the same as described above.

The photoelectric conversion layer 30 may for example selectively absorb light in a green wavelength spectrum of light and may replace a color filter of a green pixel.

Light in a green wavelength spectrum of light of light that enters from the second electrode 20 is mainly absorbed by the photoelectric conversion layer 30 and photoelectrically converted and light in a remaining wavelength spectrum of light is transmitted through the first electrode 10 and is sensed by the photo-sensing devices 50a and 50b.

Focusing lens (not shown) may be further formed on the photoelectric device 100.

The focusing lens may control a direction of incident light and gather the light in one region.

The focusing lens may have a shape of, for example, a cylinder or a hemisphere, but is not limited thereto.

As described above, the photoelectric device 100 has a stack structure thereby a size of an image sensor may be reduced to realize a down-sized image sensor.

In addition, as described above, optical properties, electrical properties, and thermal properties required for the image sensor may be satisfied by including the photoelectric device 100 including the photoelectric conversion layer 30 having optical properties, electrical characteristics and high heat resistance.

FIG. 4 exemplarily shows a structure that the photoelectric device of FIG. 1 is stacked, but the photoelectric device of FIG. 2 may be equally applied thereto.

Figure 5:
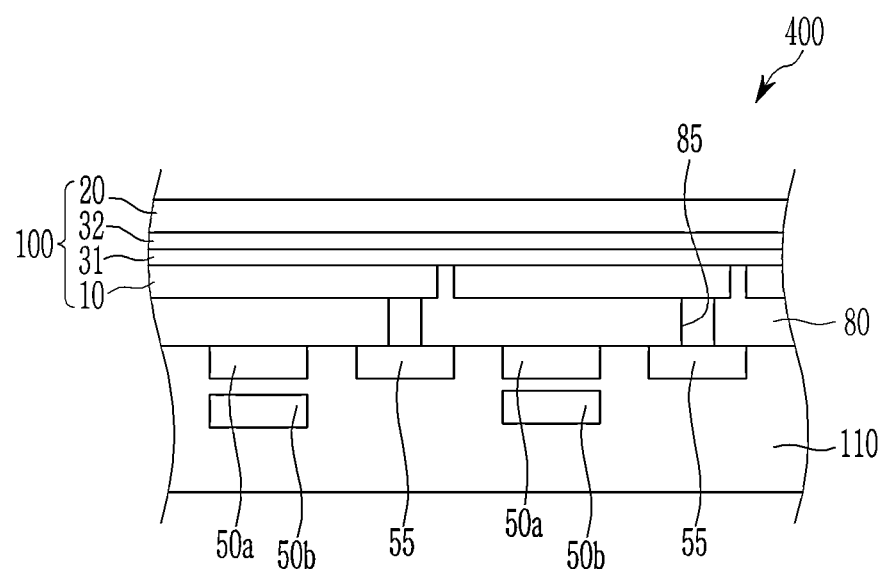
FIG. 5 is a cross-sectional view showing another example of the organic CMOS image sensor.

FIG. 5 is a cross-sectional view showing another example of the organic CMOS image sensor.

The organic CMOS image sensor 400 according to some example embodiments includes a semiconductor substrate 110 integrated with photo-sensing devices 50a and 50b, a transmission transistor (not shown), and a charge storage 55, an upper insulation layer 80 having a through-hole 85, and a photoelectric device 100, like some example embodiments.

However, in the organic CMOS image sensor 400 according to some example embodiments unlike some example embodiments, the photo-sensing devices 50a and 50b are stacked in a vertical direction, but the color filter layer 70 is omitted.

The photo-sensing devices 50a and 50b are electrically connected to charge storage (not shown) and may be transferred by the transmission transistor.

The photo-sensing devices 50a and 50b may selectively absorb light in each wavelength spectrum of light depending on a stacking depth.

Focusing lens (not shown) may be further formed on the photoelectric device 100.

The focusing lens may control a direction of incident light and gather the light in one region.

The focusing lens may have a shape of, for example, a cylinder or a hemisphere, but is not limited thereto.

As described above, the photoelectric device configured to selectively absorb light in a green wavelength spectrum of light has a stack structure and the red photo-sensing device and the blue photo-sensing device are stacked and thus the size of an image sensor may be reduced to realize a down-sized image sensor.

FIG. 5 exemplarily shows a structure that the photoelectric device of FIG. 1 is stacked, but the photoelectric device of FIG. 2 may be equally applied thereto.

Figure 6:
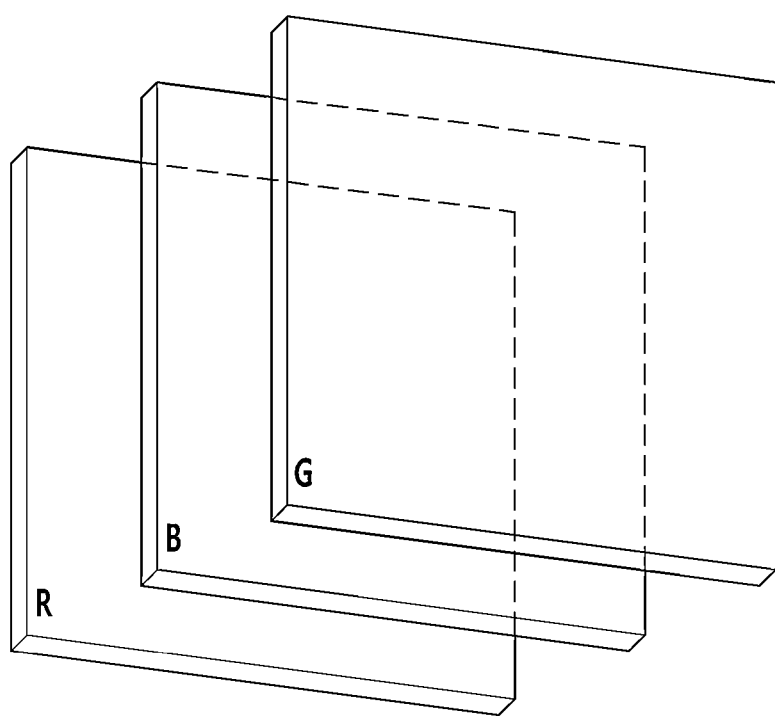
FIG. 6 is a schematic top plan view showing an organic CMOS image sensor according to some example embodiments.
Figure 7:
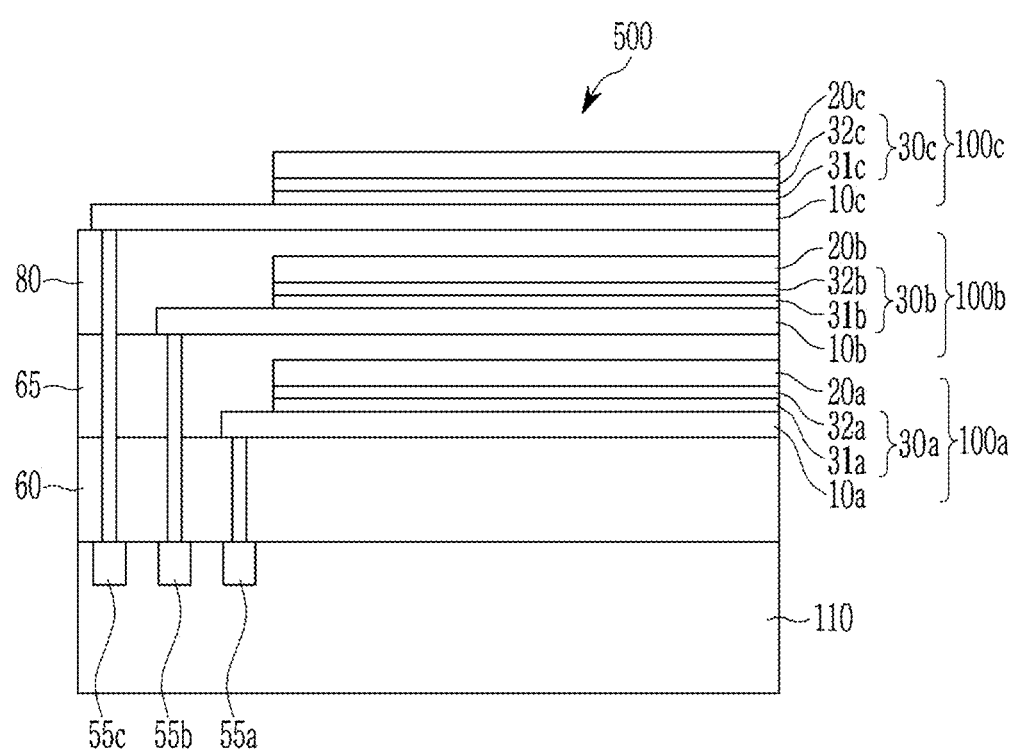
FIG. 7 is a cross-sectional view showing the organic CMOS image sensor of FIG. 6.

FIG. 6 is a schematic top plan view of an organic CMOS image sensor according to some example embodiments and FIG. 7 is a cross-sectional view of the organic CMOS image sensor of FIG. 6.

The organic CMOS image sensor 500 according to some example embodiments includes a green photoelectric device configured to selectively absorb light in a green wavelength spectrum of light, a blue photoelectric device configured to selectively absorb light in a blue wavelength spectrum of light, and a red photoelectric device configured to selectively absorb light in a green wavelength spectrum of light, and they are stacked.

The organic CMOS image sensor 500 according to some example embodiments includes a semiconductor substrate 110, a lower insulation layer 60, an intermediate insulation layer 65, an upper insulation layer 80, a first photoelectric device 100a, a second photoelectric device 100b, and a third photoelectric device 100c.

The semiconductor substrate 110 may be a silicon substrate, and is integrated with the transmission transistor (not shown) and the charge storages 55a, 55b, and 55c.

A metal wire (not shown) and a pad (not shown) are formed on the semiconductor substrate 110, and the lower insulation layer 60 is formed on the metal wire and the pad.

The first photoelectric device 100a is formed on the lower insulation layer 60.

The first photoelectric device 100a includes a first electrode 10a and a second electrode 20a facing each other and a photoelectric conversion layer 30a between the first electrode 10a and the second electrode 20a.

The first electrode 10a, the second electrode 20a, and the photoelectric conversion layer 30a are the same as described above and the photoelectric conversion layer 30a may selectively absorb light in one of red, blue, and green wavelength spectrum of lights.

For example, the first photoelectric device 100a may be a red photoelectric device.

In the drawing, the first electrode 10a, the photoelectric conversion layer 30a, and the second electrode 20a are sequentially stacked, but this disclosure is not limited thereto, and for example they may be stacked in an order of the second electrode 20a, the photoelectric conversion layer 30a, and the first electrode 10a.

An intermediate insulation layer 65 is formed on the first photoelectric device 100a.

The second photoelectric device 100b is formed on the intermediate insulation layer 65.

The second photoelectric device 100b includes a first electrode 10b and a second electrode 20b facing each other and a light-absorption layer 30b (e.g., photoelectric conversion layer 30b) between the first electrode 10b and the second electrode 20b.

The first electrode 10b, the second electrode 20b, and the photoelectric conversion layer 30b may be described above and the photoelectric conversion layer 30b may selectively absorb light in one of red, blue, and green wavelength spectrum of lights.

For example, the second photoelectric device 100b may be a blue photoelectric device.

In the drawing, the first electrode 10b, the photoelectric conversion layer 30b, and the second electrode 20b are sequentially stacked, but this disclosure is not limited thereto, and for example they may be stacked in an order of the second electrode 20b, the photoelectric conversion layer 30b, and the first electrode 10b.

The upper insulation layer 80 is formed on the second photoelectric device 100b.

The lower insulation layer 60, the intermediate insulation layer 65, and the upper insulation layer 80 have a plurality of through-holes exposing the charge storages 55a, 55b, and 55c.

The third photoelectric device 100c is formed on the upper insulation layer 80.

The third photoelectric device 100c includes a first electrode 10c and a second electrode 20c facing each other and a photoelectric conversion layer 30c between the first electrode 10c and the second electrode 20c.

The first electrode 10c, the second electrode 20c, and the photoelectric conversion layer 30c are the same as described above and the first and second photoelectric conversion layers 30c may selectively absorb light in one of red, blue, and green wavelength spectrum of lights.

For example, the third photoelectric device 100c may be a green photoelectric device and the photoelectric device 100 may be applied.

In the drawing, the first electrode 10c, the photoelectric conversion layer 30c, and the second electrode 20c are sequentially stacked, but this disclosure is not limited thereto, and for example they may be stacked in an order of the second electrode 20c, the photoelectric conversion layer 30c, and the first electrode 10c.

Focusing lens (not shown) may be further formed on the photoelectric device 100c.

The focusing lens may control a direction of incident light and gather the light in one region.

The focusing lens may have a shape of, for example, a cylinder or a hemisphere, but is not limited thereto.

In the drawing, as the first photoelectric device 100a, the second photoelectric device 100b, and the third photoelectric device 100c, the photoelectric device of FIG. 1 is exemplified but the photoelectric device of FIG. 2 may be applied in the same manner.

In the drawing, the first photoelectric device 100a, the second photoelectric device 100b, and the third photoelectric device 100c are sequentially stacked, but the present disclosure is not limited thereto, and they may be stacked in various orders.

As described above, the first photoelectric device 100a, the second photoelectric device 100b, and the third photoelectric device 100c have a stack structure, and thus the size of an image sensor may be reduced to realize a down-sized image sensor.

Figure 8:
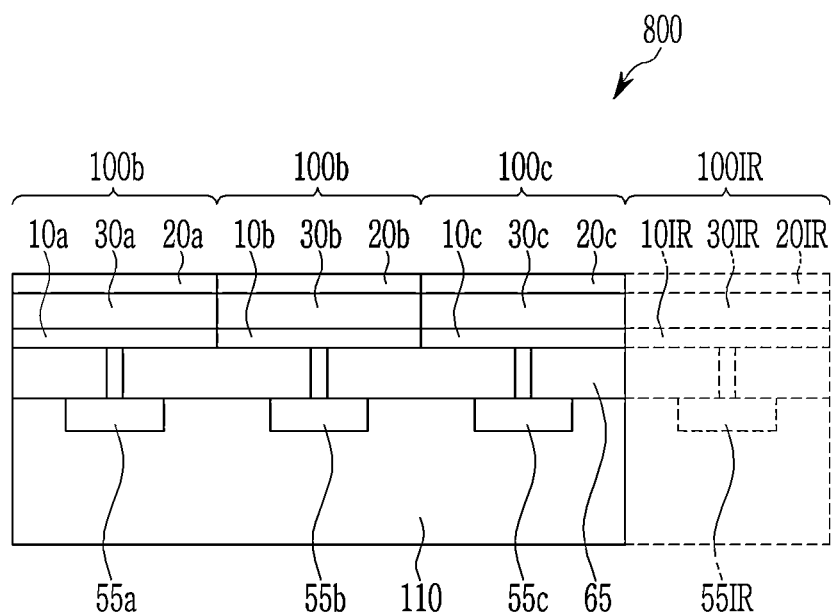
FIG. 8 is a schematic cross-sectional view showing an organic CMOS image sensor according to some example embodiments.

FIG. 8 is a schematic cross-sectional view showing an organic CMOS image sensor according to some example embodiments.

As shown with reference to FIG. 8, an organic CMOS image sensor 800 may include a plurality of photoelectric devices 100a, 100b, and 100c on a semiconductor substrate 110, where the plurality of photoelectric devices 100a, 100b, and 100c are configured to convert different ones of blue light, green light, or red light into electric signals, respectively. As further shown in FIG. 8, the organic CMOS image sensor 800 may further include an infrared/near-infrared photoelectric device 100IR.

Referring to FIG. 8, an organic CMOS image sensor 800 according to some example embodiments includes a semiconductor substrate 110 integrated with an a first charge storage 55a, a second charge storage 55b, a third charge storage 55c, optionally an infrared light/near infrared light charge storage 55IR, and a transmission transistor (not shown), an intermediate insulation layer 65, a first (e.g., blue) photoelectric device 100a, a second (e.g., green) photoelectric device 100b, a third (e.g., red) photoelectric device 100c, and optionally an infrared/near infrared photoelectric device 100IR.

The semiconductor substrate 110 may be a silicon substrate and may be integrated with the first charge storage 55a, the second charge storage 55b, the third charge storage 55c, optionally the infrared light/near infrared light charge storage 55IR, and the transmission transistor (not shown). The first charge storage 55a, the second charge storage 55a, and the third charge storage 55c may be respectively integrated in each of a blue pixel, a green pixel, and a red pixel.

Charges absorbed in the first photoelectric device 100a, the second photoelectric device 100b, and the third photoelectric device 100c, and optionally the infrared/near infrared photoelectric device 100IR, are collected in the first charge storage 55a, the second charge storage 55a, and the third charge storage 55c, and optionally the infrared light/near infrared light charge storage 55IR, which are electrically connected to each of the first photoelectric device 100a, the second photoelectric device 100b, and the third photoelectric device 100c, and optionally the infrared/near infrared photoelectric device 100IR.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but are not limited thereto.

The intermediate insulation layer 65 may be formed on the metal wires and pads. The intermediate insulation layer 65 may be made of an inorganic insulation material such as a silicon oxide and/or a silicon nitride, or a low dielectric constant (low K) material such as SiC, SiCOH, SiCO, and SiOF.

The first photoelectric device 100a, the second photoelectric device 100b, the third photoelectric device 100c, and the infrared/near infrared photoelectric device 100IR may be formed on the intermediate insulation layer 65. The first photoelectric device 100a includes a first electrode 10a, a second electrode 20a, and a photoelectric conversion layer 30a selectively absorbing light in a first (e.g., blue) wavelength spectrum of light, the second photoelectric device 100b includes a first electrode 10b, a second electrode 20b and a photoelectric conversion layer 30b selectively absorbing light in a second (e.g., green) wavelength spectrum of light, the third photoelectric device 100c includes a first electrode 10c, a second electrode 20c, and a photoelectric conversion layer 30c selectively absorbing light in a third (e.g., red) wavelength spectrum of light, and the infrared/near infrared photoelectric device 100IR includes a first electrode 10IR, a second electrode 20IR, and a photoelectric conversion layer 30IR selectively absorbing light in an infrared/near infrared wavelength spectrum of light.

The first electrodes 10a, 10b, 10c, and 10IR and the second electrodes 20a, 20b, 20c, and 20IR may be light-transmitting electrodes and may be made of, for example, a transparent conductor such as indium tin oxide (ITO), indium zinc oxide (IZO), zinc oxide (ZnO), tin oxide (SnO), aluminum tin oxide (AlTO), and fluorine-doped tin oxide (FTO), or may be a metal thin layer having a thin thickness of several nanometers or several tens of nanometers or a metal thin layer having a thin thickness of several nanometers to several tens of nanometers doped with a metal oxide.

The photoelectric conversion layers 30a, 30b, 30c, and 30IR may include a p-type semiconductor material and an n-type semiconductor material. The photoelectric conversion layer 30a of the first photoelectric device 100a may include a p-type semiconductor material selectively absorbing light in a first (e.g., blue) wavelength spectrum of light and an n-type semiconductor material selectively absorbing light in a first (e.g., blue) wavelength spectrum of light, the photoelectric conversion layer 30b of the second photoelectric device 100b may include a p-type semiconductor material selectively absorbing light in a second (e.g., green) wavelength spectrum of light and an n-type semiconductor material selectively absorbing light in a second (e.g., green) wavelength spectrum of light, the photoelectric conversion layer 30c of the third photoelectric device 100c may include a p-type semiconductor material selectively absorbing light in a third (e.g., red) wavelength spectrum of light and an n-type semiconductor material selectively absorbing light in a third (e.g., red) wavelength spectrum of light, and the photoelectric conversion layer 30IR of the infrared/near infrared photoelectric device 100IR may include a p-type semiconductor material selectively absorbing light in an infrared wavelength spectrum of light and an n-type semiconductor material selectively absorbing light in an infrared wavelength spectrum of light.

The infrared/near infrared photoelectric device 100IR may selectively absorb light in an infrared wavelength spectrum of greater than or equal to about 700 nm and less than or equal to about 1300 nm without absorption in a visible wavelength spectrum of light.

Figure 9:
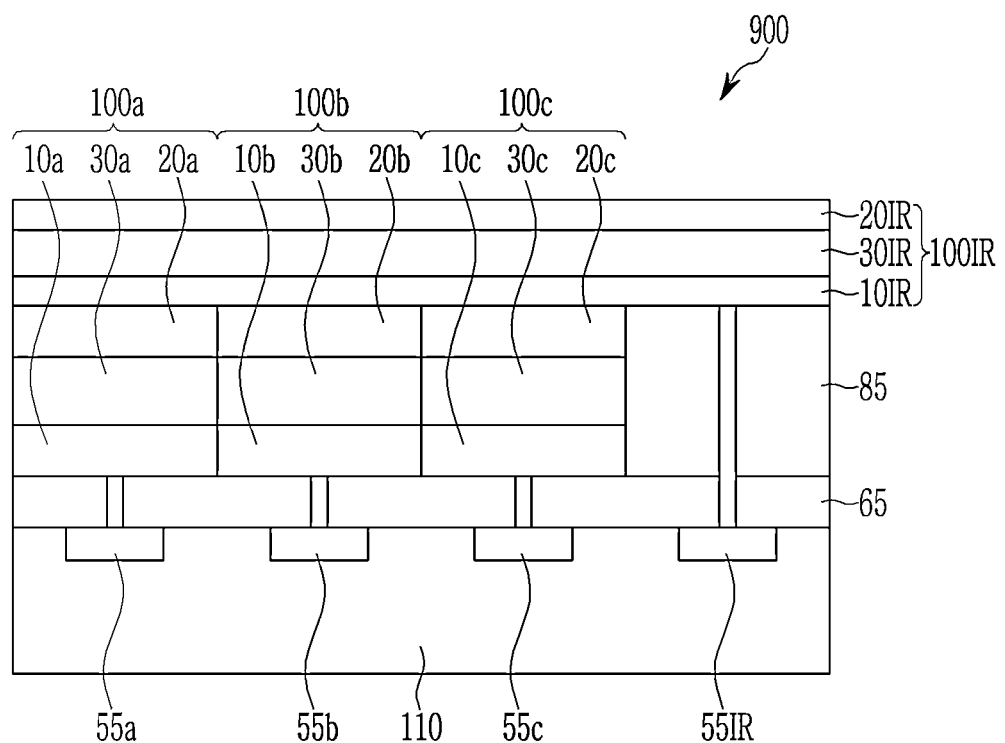
FIGS. 9 and 10 are schematic cross-sectional views of an organic CMOS image sensor according to some example embodiments.
Figure 10:
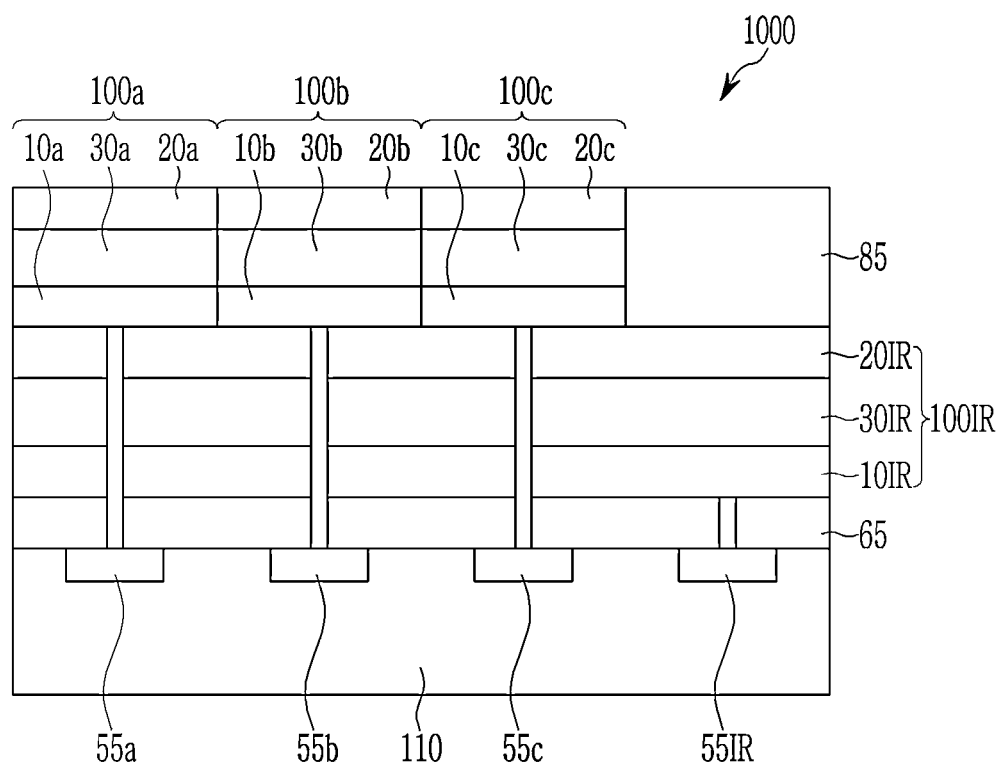

FIGS. 9 and 10 are schematic cross-sectional views of an organic CMOS image sensor according to some example embodiments.

Referring to FIG. 9, an organic CMOS image sensor 900 includes a semiconductor substrate 110 integrated with an infrared light/near infrared light charge storage 55IR, a first charge storage 55a, a second charge storage 55a, a third charge storage 55c, and a transmission transistor (not shown), an intermediate insulation layer 65, a first photoelectric device 100a, a second photoelectric device 100b, a third photoelectric device 100c, and an infrared/near infrared photoelectric device 100IR. The infrared/near infrared photoelectric device 100IR is formed on an entire surface of the first photoelectric device 100a, the second photoelectric device 100b, and the third photoelectric device 100c. Other structures are the same as the image sensor of FIG. 8.

In the structure of FIG. 9, the infrared/near infrared photoelectric device 100IR may be disposed on the intermediate insulation layer 65 and the first photoelectric device 100a, the second photoelectric device 100b, and the third photoelectric device 100c may be disposed thereon. An organic CMOS image sensor 1000 having such a structure is shown in FIG. 10.

The infrared/near infrared photoelectric device 100IR may selectively absorb light in an infrared wavelength spectrum of greater than or equal to about 700 nm and less than or equal to about 1300 nm without absorption in a visible wavelength spectrum of light and may improve efficiency due to a large absorption area.

Figure 11A:
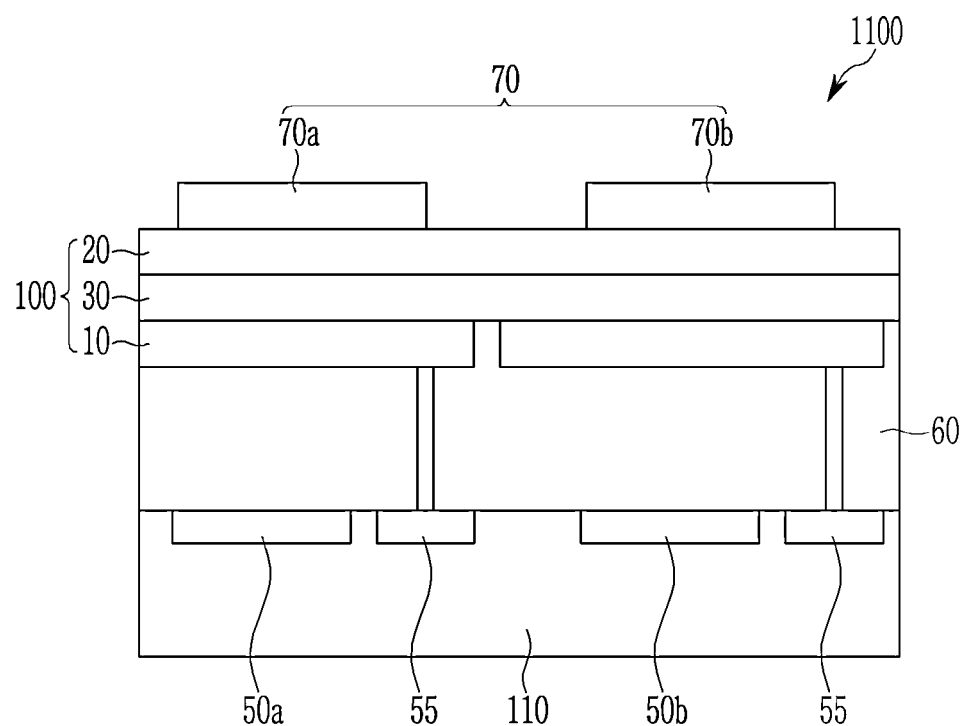
FIG. 11A is a schematic cross-sectional view of an organic CMOS image sensor according to some example embodiments.

FIG. 11A is a schematic cross-sectional view of an organic CMOS image sensor according to some example embodiments.

Referring to FIG. 11A, an organic CMOS image sensor 1100 according to some example embodiments includes a semiconductor substrate 110 integrated with photo-sensing devices 50a and 50b, a transmission transistor (not shown) and a charge storage 55, a lower insulation layer 60, a color filter layer 70, an upper insulation layer 80, and a photoelectric device 100. As shown in FIG. 11A, the photoelectric device 100 may be between the semiconductor substrate 110 and the color filter layer 70, such that the color filter layer 70 is distal from the photo-sensing device 50a and 50b in relation to the photoelectric device 100. Other structures are the same as the image sensor of FIG. 4. In some example embodiments, the color filter layer 70 may include color filters configured to filter a mixture of wavelength spectra of light (e.g., mixed colors). For example, in FIG. 11A, color filter 70a may be configured to filter cyan light and color filter 70b may be configured to filter yellow light, while photoelectric device 100 may be configured to filter green light in addition to sensing green light, while photo-sensing device 50a may be configured to detect ("sense") blue light and photo-sensing device 50b may be configured to detect red light.

Figure 11B:
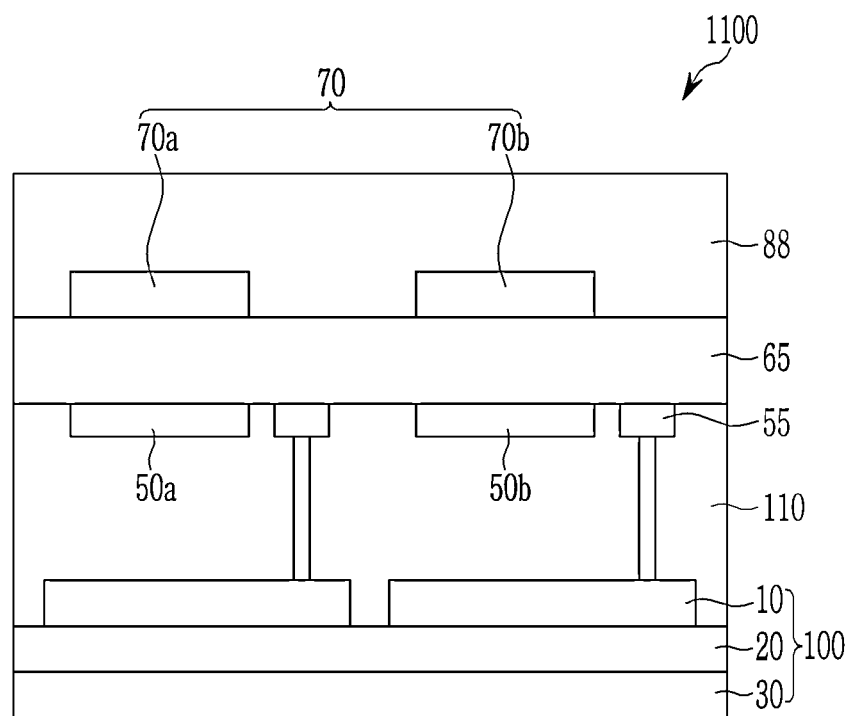
FIG. 11B is a schematic cross-sectional view of an organic CMOS image sensor according to some example embodiments.

FIG. 11B is a schematic cross-sectional view of an organic CMOS image sensor according to some example embodiments.

Referring to FIG. 11B, an organic CMOS image sensor 1100 according to some example embodiments includes a semiconductor substrate 110 integrated with photo-sensing devices 50a and 50b, a transmission transistor (not shown) and a charge storage 55, a lower insulation layer 65, a color filter layer 70, and an upper insulation layer 86 on the semiconductor substrate 110, and a photoelectric device 100 under the semiconductor substrate 110. As shown in FIG. 11A, the photoelectric device 100 may be on (e.g., above or beneath) the semiconductor substrate 110, such that the color filter layer 70 is distal from the photoelectric device 100 in relation to the photo-sensing devices 50a and 50b. Other structures are the same as the image sensor of FIG. 4.

Figure 12:
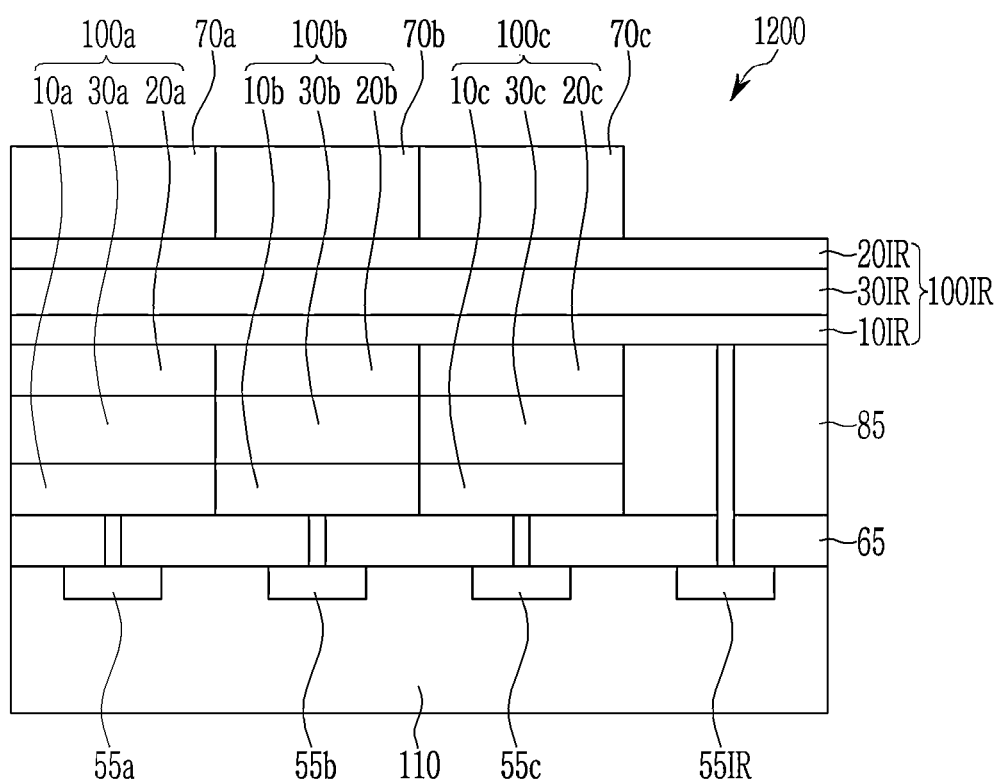
FIG. 12 is a schematic cross-sectional view of an organic CMOS image sensor according to some example embodiments.

FIG. 12 is a schematic cross-sectional view of an organic CMOS image sensor according to some example embodiments.

Referring to FIG. 12, an organic CMOS image sensor 1200 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first photoelectric device 100a, a second photoelectric device 100b, a third photoelectric device 100c, an infrared/near infrared photoelectric device 100IR, a first (e.g., blue) filter 70a, a second (e.g., green) filter 70b, and a third (e.g., red) filter 70c.

Figure 13:
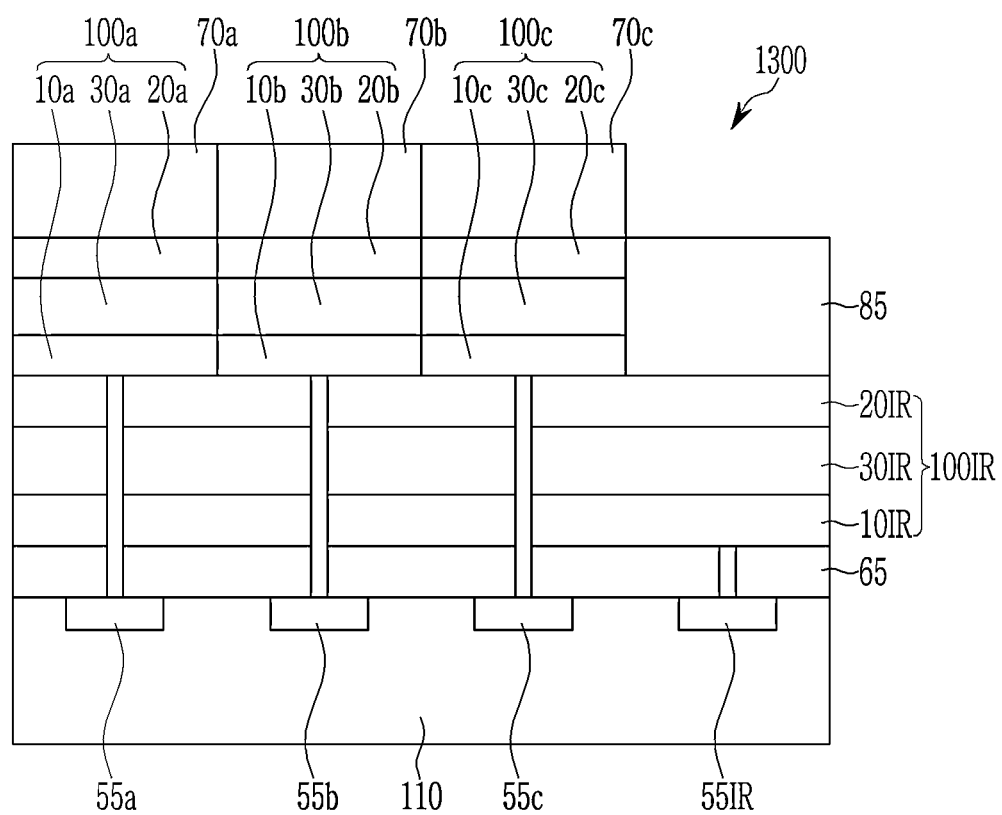
FIG. 13 is a schematic cross-sectional view of an organic CMOS image sensor according to some example embodiments.

FIG. 13 is a schematic cross-sectional view of an organic CMOS image sensor according to some example embodiments.

Referring to FIG. 13, an organic CMOS image sensor 1300 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first photoelectric device 100a, a second photoelectric device 100b, a third photoelectric device 100c, an infrared/near infrared photoelectric device 100IR, a first (e.g., blue) filter 70a, a second (e.g., green) filter 70b, and a third (e.g., red) filter 70c.

Figure 14:
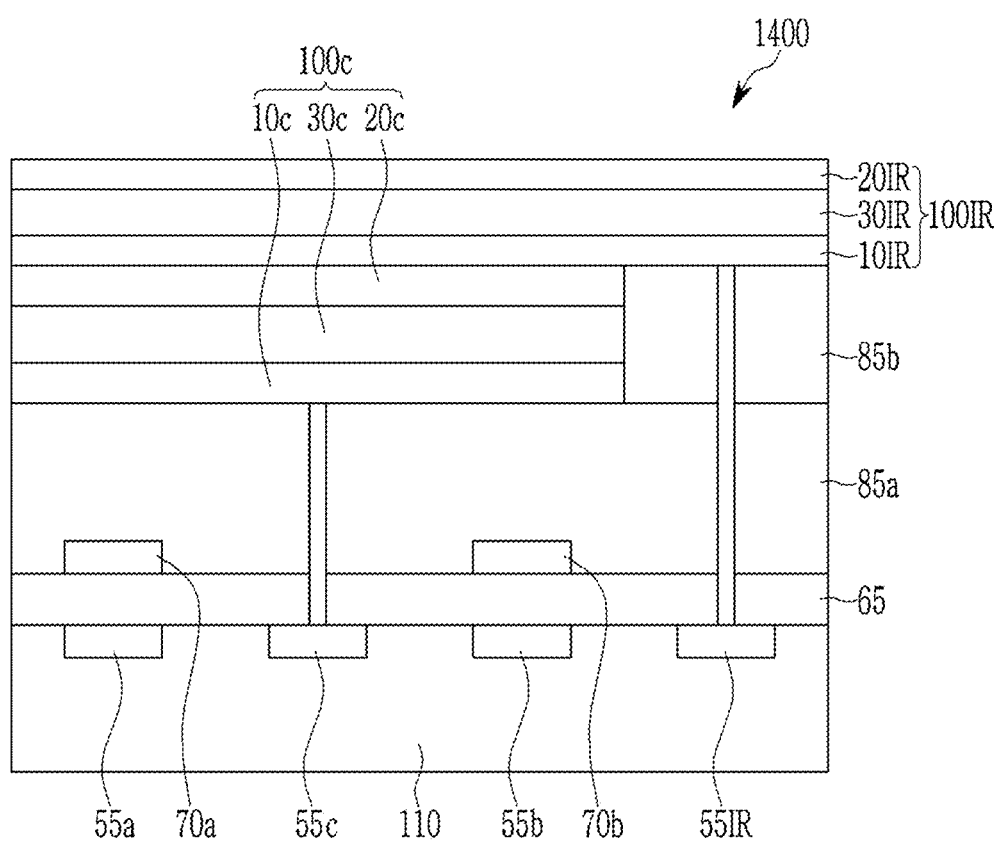
FIG. 14 is a schematic cross-sectional view of an organic CMOS image sensor according to some example embodiments.

FIG. 14 is a schematic cross-sectional view of an organic CMOS image sensor according to some example embodiments.

Referring to FIG. 14, an organic CMOS image sensor 1400 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first (e.g., blue) filter 70a; a second (e.g., red) filter 70b; a upper insulation layers 85a and 85b; a third (e.g., green) photoelectric device 100b; and an infrared/near infrared photoelectric device 100IR.

Figure 15:
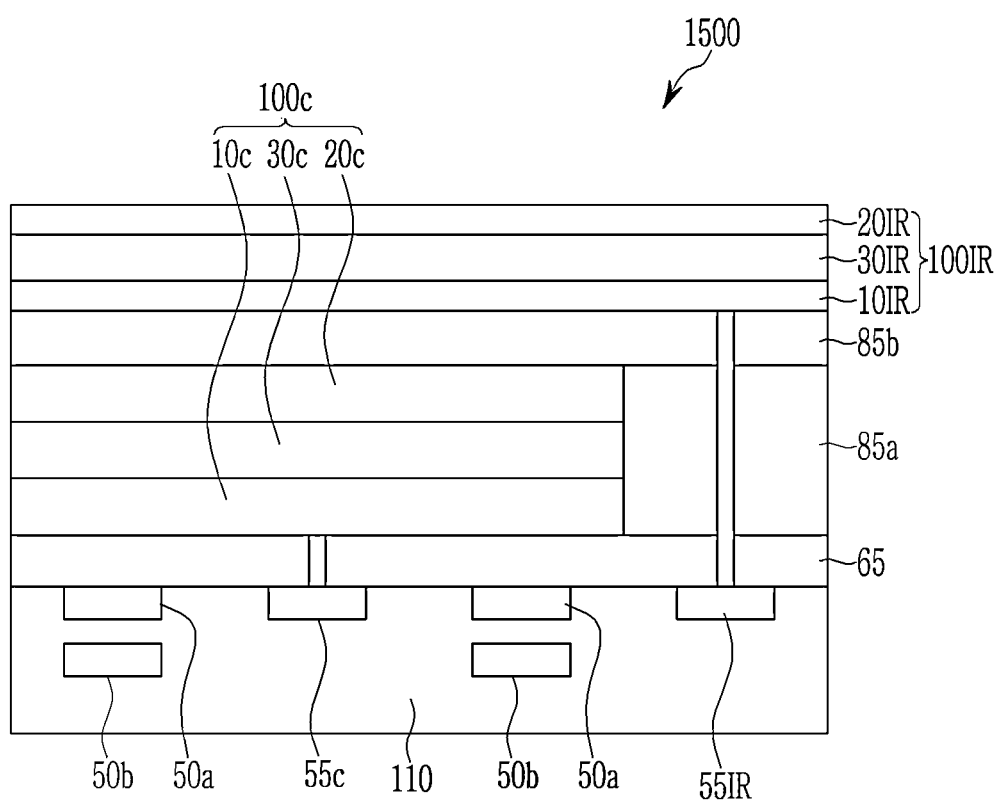
FIG. 15 is a schematic cross-sectional view of an organic CMOS image sensor according to some example embodiments.

FIG. 15 is a schematic cross-sectional view of an organic CMOS image sensor according to some example embodiments.

In the organic CMOS image sensor 1500 of FIG. 15, the first photo-sensing device 50a (e.g., a blue photodiode) and the second photo-sensing device 50b (e.g., a red photodiode) are stacked perpendicularly, differing from the organic CMOS image sensor 1400 of FIG. 14.

Figure 16:
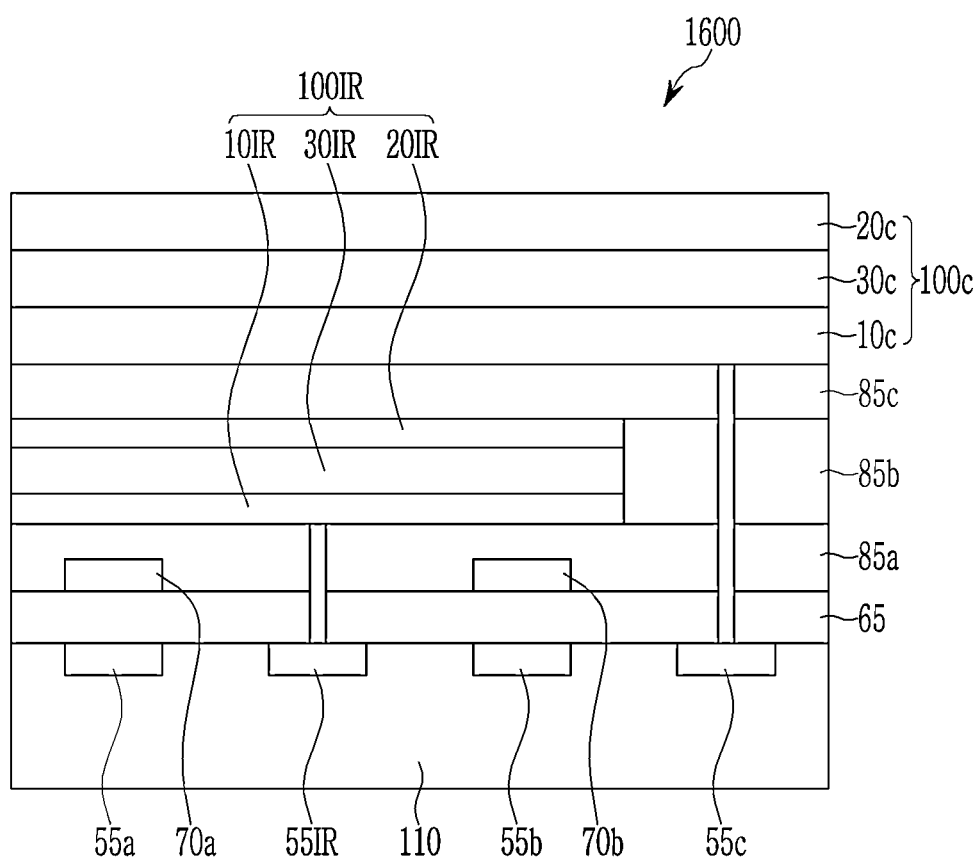
FIG. 16 is a schematic cross-sectional view of an organic CMOS image sensor according to some example embodiments.

FIG. 16 is a schematic cross-sectional view of an organic CMOS image sensor according to some example embodiments.

Referring to FIG. 16, an organic CMOS image sensor 1600 includes a semiconductor substrate 110 integrated with an infrared light/near infrared light charge storage 55IR, a first charge storage 55a, a second charge storage 55b, a third charge storage 55c and a transmission transistor (not shown); an intermediate insulation layer 65; a first (e.g., blue) filter 70a; a second (e.g., red) filter 70b; upper insulation layers 85a, 85b, and 85c; an infrared/near infrared photoelectric device 100IR; and a third (e.g., green) photoelectric device 100c.

Figure 17:
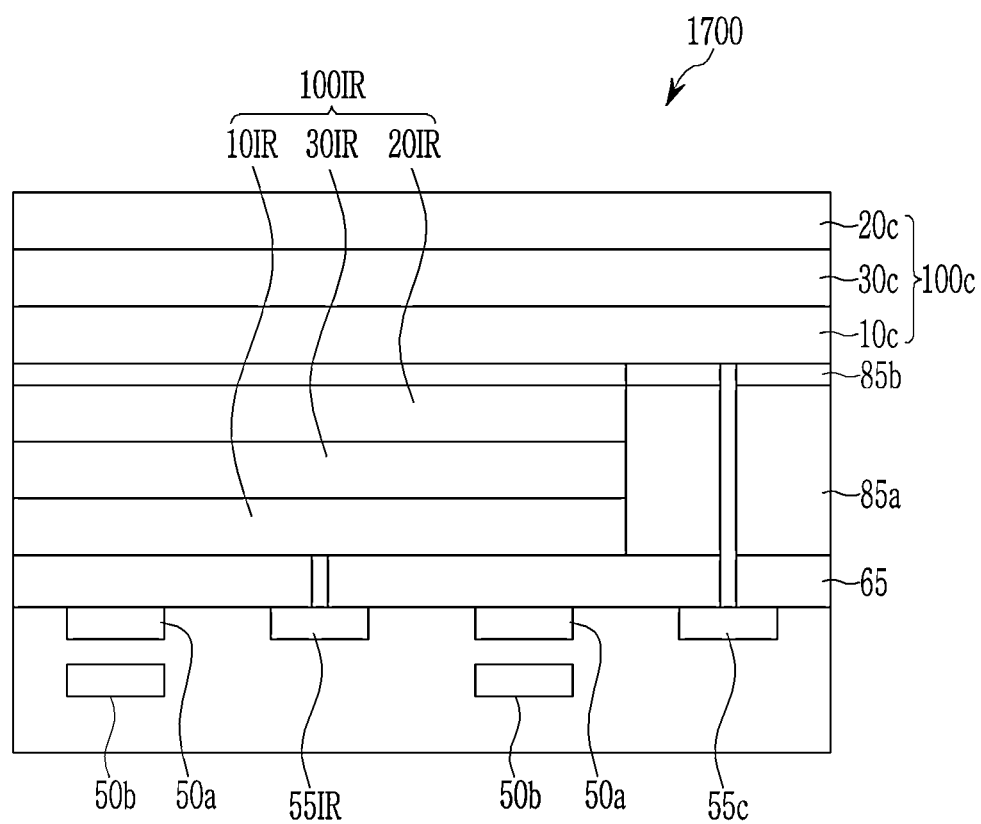
FIG. 17 is a schematic cross-sectional view of an organic CMOS image sensor according to some example embodiments.

FIG. 17 is a schematic cross-sectional view of an organic CMOS image sensor according to some example embodiments.

In the image sensor 1700 of FIG. 17, the first photo-sensing device 50a and the second photo-sensing device 50b are stacked perpendicularly, differing from the organic CMOS image sensor 1600 of FIG. 16.

Referring to at least FIGS. 3-17, one or more of the photoelectric devices included in any one of the image sensors illustrated in FIGS. 3-17 may be any of the example embodiments of photoelectric devices as described herein, including photoelectric devices including photoelectric conversion layers including any of the p-type semiconductors and any of the n-type semiconductors as described with regard to any of the example embodiments described herein.

The photoelectric device and the image sensor may be applied to various electronic devices, for example a mobile phone or a digital camera, but are not limited thereto.

Figure 18:
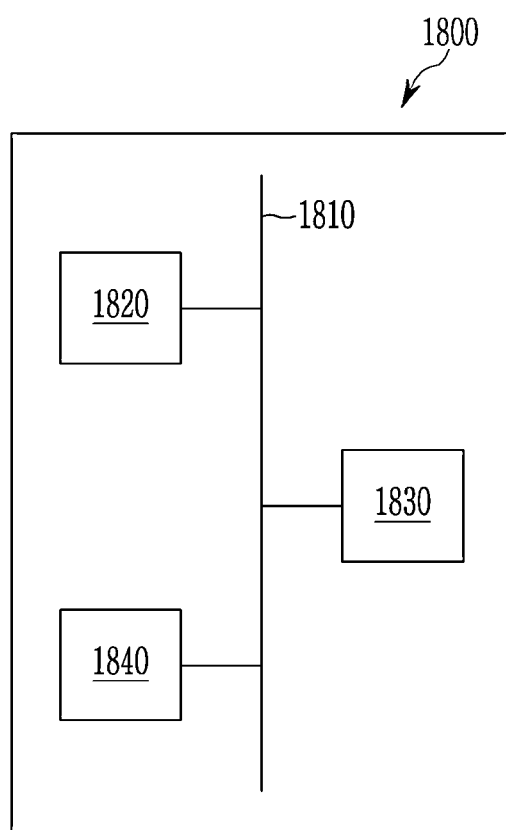
FIG. 18 is a schematic diagram of an electronic device 1800 according to some example embodiments.

FIG. 18 is a schematic diagram of an electronic device 1800 according to some example embodiments.

As shown in FIG. 18, an electronic device 1800 may include a processor 1820, a memory 1830, and an image sensor 1840 that are electrically coupled together via a bus 1810. The image sensor 1840 may be an image sensor of any of the example embodiments as described herein. The memory 1830, which may be a non-transitory computer readable medium, may store a program of instructions. The processor 1820 may execute the stored program of instructions to perform one or more functions. For example, the processor 1820 may be configured to process electric signals generated by the image sensor 1840. The processor 1820 may be configured to generate an output (e.g., an image to be displayed on a display interface) based on processing the electric signals.

Hereinafter, the embodiments are illustrated in more detail with reference to examples.

However, these examples are exemplary, and the present disclosure is not limited thereto.

SYNTHESIS EXAMPLES

Synthesis Example 1

[Chemical Formula A-1]

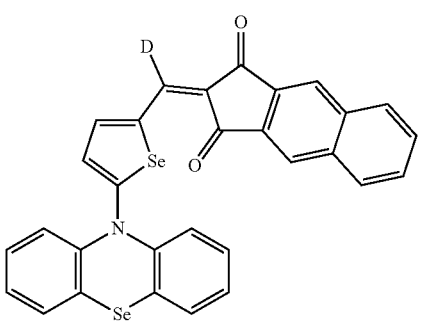

[Reaction Scheme 1]

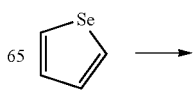

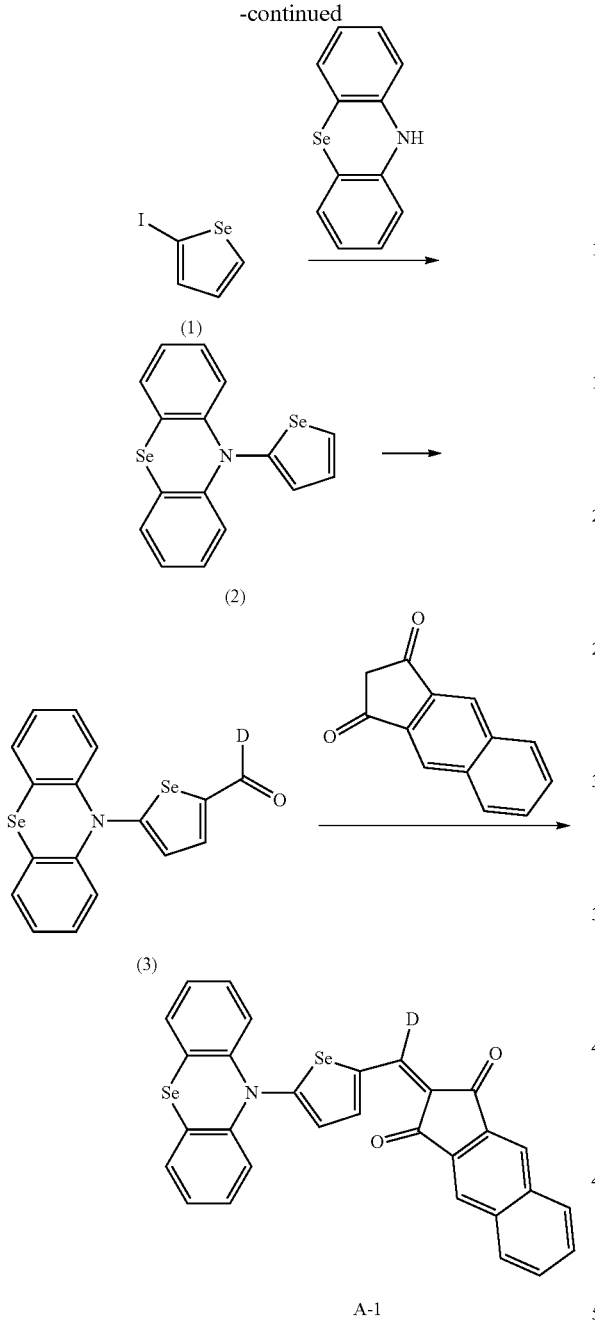

(1-iii) Synthesis of Compound (3)

2.2 ml of phosphoryl chloride is added in a dropwise fashion in 6.8 ml of N,N-dimethylformamide-d7 at −15° C., and the mixture is stirred at room temperature (24° C.) for 2 hours. The resultant is slowly added in a dropwise fashion to a mixture of 180 ml of dichloromethane and 6.84 g of Compound (3) at −15° C., and the mixture is stirred at room temperature for 30 minutes and concentrated under a reduced pressure. Subsequently, 100 ml of water is added thereto, a sodium hydroxide aqueous solution is added thereto until pH becomes 14, and the obtained mixture is stirred at room temperature (24° C.) for 2 hours. An organic layer extracted with ethyl acetate is washed with a sodium chloride aqueous solution and dried with anhydrous magnesium sulfate. A product obtained therefrom is separated and purified through silica gel column chromatography (a volume ratio of hexane:dichloromethane=3:2) to obtain 5.16 g of Compound (3) (Yield: 66%).

(1-iv) Synthesis of Compound A-1

2.00 g (4.96 mmol) of Compound (3) is suspended in ethanol, 1.46 g (7.44 mmol) of 1H-cyclopenta[b]naphthalene-1,3(2H)-dione is added, and the resultant is reacted at 50° C. for 2 hours to obtain 2.62 g of a compound represented by Chemical Formula A-1 (Yield: 66%).

Synthesis Example 2

[Chemical Formula A-2]

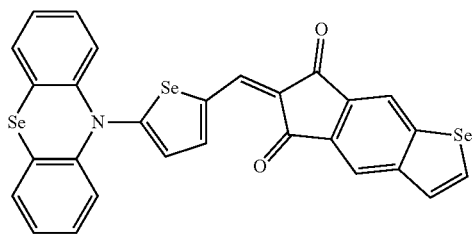

(1-i) Synthesis of Compound (1)

2-iodoselenophene is synthesized in a method described in Efficient Synthesis of 2-Iodo and 2-Dicyanomethyl Derivatives of Thiophene, Selenophene, Tellurophene and Thieno[3,2-b]thiophene, Takahashi, K.; Tarutani, S. Heterocycles 1996, 43, 1927-1935.

(1-ii) Synthesis of Compound (2)

13.6 g (52.8 mmol) of 2-iodoselenophene and 10.0 g (40.6 mmol) of 10H-phenoselenazine are heated and refluxed for 2 hours in 100 ml of anhydrous toluene under presence of 5 mol % of Pd(dba)$_2$, 5 mol % of P(tBu)$_3$, and 4.29 g (44.7 mmol) of NaOtBu. A product obtained therefrom is separated and purified through silica gel column chromatography (a volume ratio of toluene:hexane=1:4) to obtain 6.89 g of 10-(selenophen-2-yl)-10H-phenoselenazine (Yield: 45.2%).

[Reaction Scheme 2]

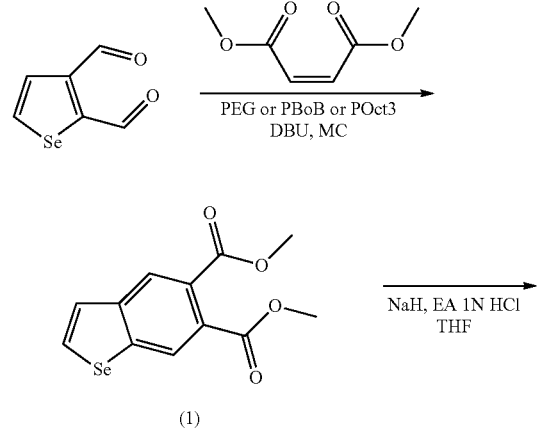

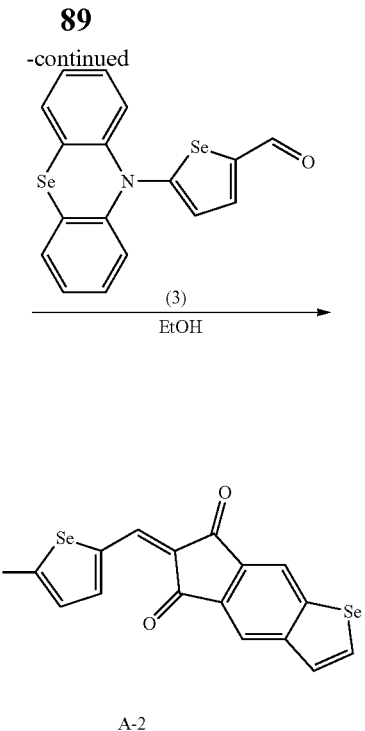

1. 2-Iodoselenophene 2-iodoselenophene is synthesized in a method described in Efficient Synthesis of 2-Iodo and 2-Dicyanomethyl Derivatives of Thiophene, Selenophene, Tellurophene and Thieno[3,2-b]thiophene, Takahashi, K.; Tarutani, S. Heterocycles 1996, 43, 1927-1935.

2. 10H-phenoselenazine 10H-phenoselenazine is purchased from Medigen Inc. (purity: 98% or greater).

Reference: Preparation and Some Reactions of Phenoxazine and Phenoselenazine, Paulette Miler, N. P. Buu-HI and R. RIPS, J. Org. Chem., 1959, 24 1, pp 37-39.

3. Synthesis of 10-(selenophen-2-yl)-10H-phenoselenazine 13.6 g (52.8 mmol) of 2-iodoselenophene and 10.0 g (40.6 mmol) of 10H-phenoselenazine are heated and refluxed for 2 hours at 120° C. in 100 ml of anhydrous toluene under presence of 5 mol % of Pd(dba)$_2$, 5 mol % of P(t-Bu)$_3$, and 4.29 g (44.7 mmol) of NaOtBu. A product obtained therefrom is separated and purified through silica gel column chromatography (a volume ratio of toluene:hexane=1:4) to obtain 6.89 g of 10-(selenophen-2-yl)-10H-phenoselenazine (Yield: 45.2%).

4. Synthesis of 5-(10H-phenoselenazin-10-yl)selenophene-2-carbaldehyde 2.2 ml of phosphoryl chloride is added in a dropwise fashion in 6.8 ml of N,N-dimethylformamide at −15° C., and the mixture is stirred at room temperature (24° C.) for 2 hours. The resultant is slowly added in a dropwise fashion to a mixture of 180 ml of dichloromethane and 6.84 g of 10-(selenophen-2-yl)-10H-phenoselenazine at −15° C., and the mixture is stirred at room temperature for 30 minutes and concentrated under a reduced pressure. Subsequently, 100 ml of water is added thereto, a sodium hydroxide aqueous solution is added thereto until pH becomes 14, and the obtained mixture is stirred at room temperature (24° C.) for 2 hours. An organic layer extracted with ethyl acetate is washed with a sodium chloride aqueous solution and dried with anhydrous magnesium sulfate. A product obtained therefrom is separated and purified through silica gel column chromatography (hexane:dichloromethane=3:2 volume ratio) to obtain 5.16 g of 5-(10H-phenoselenazin-10-yl)selenophene-2-carbaldehyde (Compound (3)) (Yield: 70%).

5. Synthesis of Compound A-2

2.5 g (6.20 mmol) of 5-(10H-phenoselenazin-10-yl)selenophene-2-carbaldehyde and 2.00 g (8.06 mmol) of 5H-indeno[5,6-b]selenophene-5,7(6H)-dione are transferred to 250 ml of a round flask and 80 ml of ethanol is added and the resultant is stirred at 60° C. for 4 hours. Subsequently, the resultant is cooled down to room temperature, 150 ml of n-hexane is added thereto, and the obtained mixture is stirred for 30 minutes. Next, a resultant therefrom is washed with n-hexane to obtain a crude product. Subsequently, the crude product is moved into a 2 L triangular flask, 450 ml of chloroform is added thereto, and the obtained mixture is heated at 70° C. stirred to dissolve the product. Then, 700 ml of n-hexane is slowly added thereto drop by drop, and the obtained mixture is cooled down to room temperature and filtered to obtain a product. The precipitation and purification are repeated up to purity of 99.9%. When the purification is complete, a product therefrom is vacuum-dried at 150° C. for 2 hours to remove residual hexane to obtain 3.02 g of (Z)-6-((5-(10H-phenoselenazin-10-yl)selenophen-2-yl)methylene)-5H-indeno[5,6-b]selenophene-5,7(6H)-dione (Compound A-2). In some example embodiments, the product may be baked during the sublimation purification at 150° C. for greater than or equal to 2 hours.

A yield is 83%.

Synthesis Example 3

[Chemical Formula A-3]

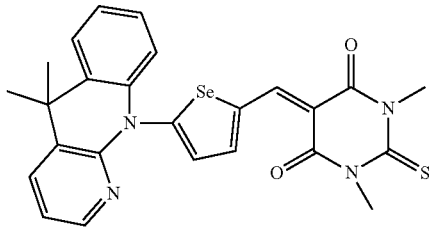

[Reaction Scheme 3]

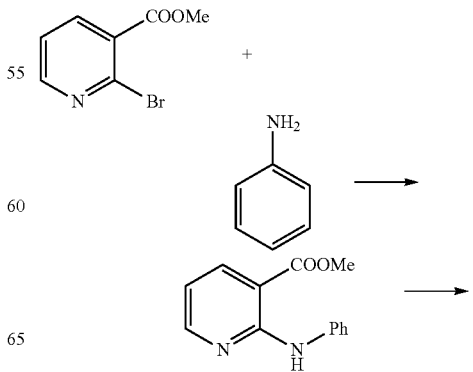

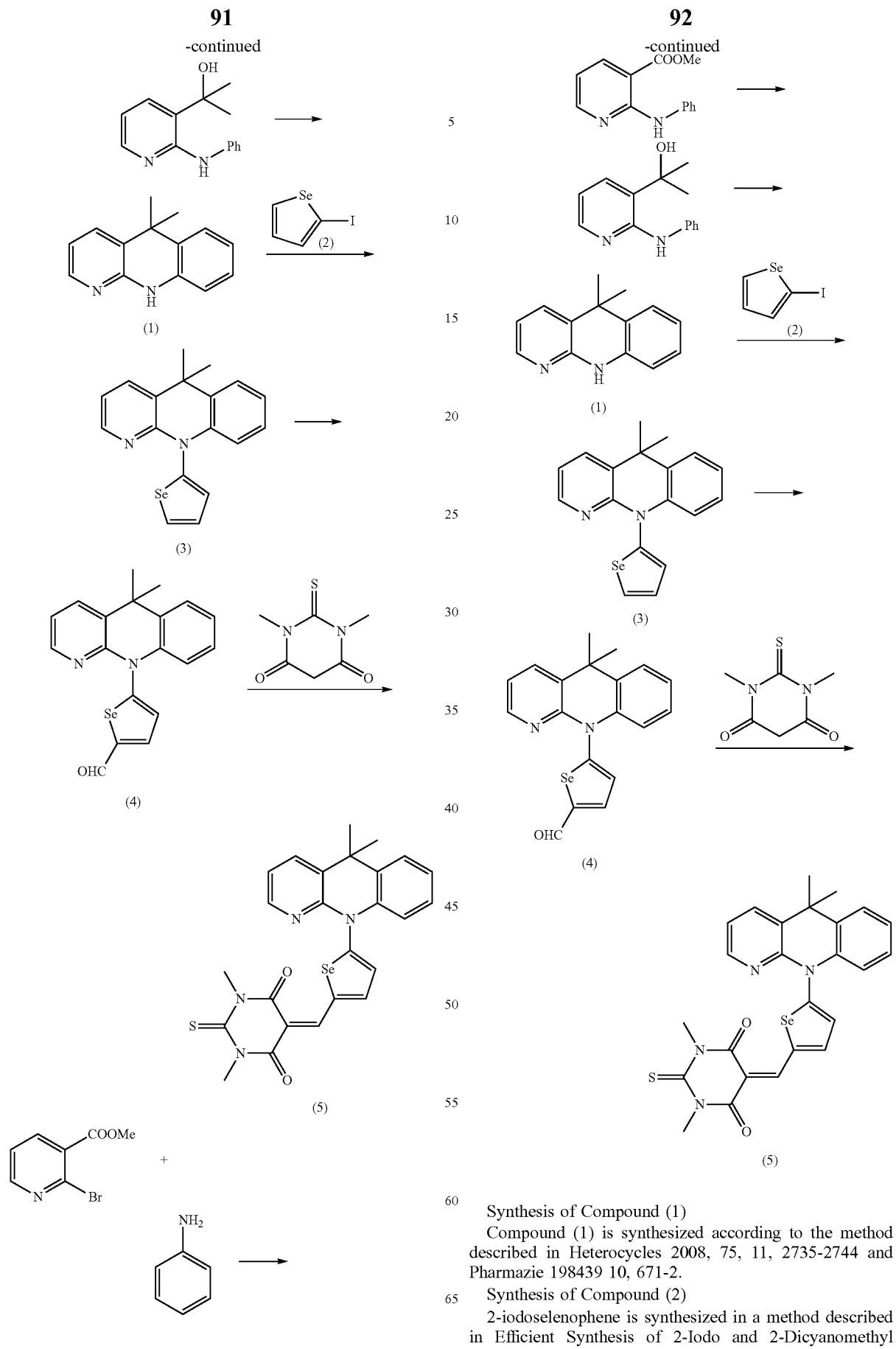
Synthesis of Compound (1)
Compound (1) is synthesized according to the method described in Heterocycles 2008, 75, 11, 2735-2744 and Pharmazie 198439 10, 671-2.
Synthesis of Compound (2)
2-iodoselenophene is synthesized in a method described in Efficient Synthesis of 2-Iodo and 2-Dicyanomethyl Derivatives of Thiophene, Selenophene, Tellurophene and Thieno[3,2-b]thiophene, Takahashi, K.; Tarutani, S. Heterocycles 1996, 43, 1927-1935.

Synthesis of Compound (3)

1 g (3.89 mmol) of 2-iodoselenophene and 0.74 g (3.54 mmol) of Compound (1) are heated and refluxed for 2 hours in 6 ml of anhydrous toluene under presence of 5 mol % of Pd(dba)$_2$, 5 mol % of P(tBu)$_3$, and 0.37 g (3.89 mmol) of NaOtBu. A product obtained therefrom was separated and purified through silica gel column chromatography (a volume ratio: toluene:hexane=1:4) to obtain 0.78 g of Compound (3) (Yield=65%).

Synthesis of Compound (4)

0.16 ml of phosphoryl chloride is added in a dropwise fashion to 0.5 ml of N,N-dimethylformamide at −15° C., and the mixture is stirred at room temperature (24° C.) for 2 hours. The resultant is slowly added in a dropwise fashion to 10 ml of dichloromethane and 0.46 g (1.54 mmol) of Compound 3 at −15° C., and the obtained mixture is stirred at room temperature for 30 minutes and concentrated under a reduced pressure. Subsequently, 5 ml of water was added thereto, a sodium hydroxide aqueous solution is added thereto until pH becomes 14, and the resulting mixture is stirred at room temperature (24° C.) for 2 hours. An organic layer extracted with ethyl acetate is washed with an aqueous sodium chloride solution and dried by adding anhydrous magnesium sulfate thereto. A product obtained therefrom is separated and purified through silica gel column chromatography (a volume ratio of hexane:dichloromethane=3:2) to obtain 0.48 g of Compound (4) (Yield: 85%).

Synthesis of Compound (5) Represented by Chemical Formula A-3

0.40 g (1.09 mmol) of Compound (4) is suspended in ethanol, 0.23 g (1.3 mmol) of 1,3-dimethyl-2-thiobarbituric acid synthesized according to a method described in J. Pharmacol, 1944, 82, 292, p. 4417 is added thereto, and the mixture is reacted at 50° C. for 2 hours to obtain 0.51 g of a compound represented by Chemical Formula A-3 (Yield: 95%). The compound is sublimated and purified up to purity of 99.5%.

Manufacture of Photoelectric Device

Example 1

A 150 nm-thick anode is formed by sputtering ITO on a glass substrate and a 5 nm-thick electron auxiliary layer is formed by depositing compound represented by Chemical Formula A thereon. Subsequently, on the electron auxiliary layer, a 50 nm-thick first photoelectric conversion layer is formed by codepositing the compound obtained in Synthesis Example 1 (first p-type semiconductor 33) and C60 (first n-type semiconductor 35) in a volume ratio of 1.3:1. Then, a 50 nm-thick second photoelectric conversion layer is formed by codepositing the compound of Synthesis Example 3 (second p-type semiconductor 37) and C60 (second n-type semiconductor 39) in a volume ratio of 2:1. Then, on the second photoelectric conversion layer, a 7 nm-thick cathode is formed by sputtering ITO. On the cathode, a 50 nm-thick anti-reflection layer is formed by depositing aluminum oxide (Al$_2$O$_3$), and a glass plate is used for sealing to manufacture a photoelectric device.

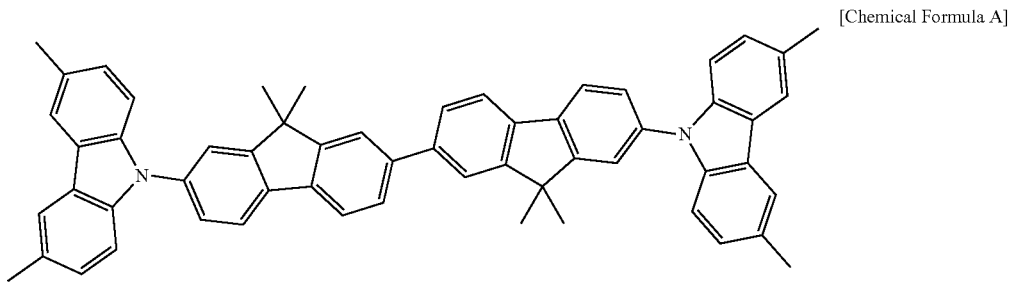

[Chemical Formula A]

Example 2

A photoelectric device is manufactured according to the same method as Example 1 except that the first photoelectric conversion layer has a thickness of 30 nm and the second photoelectric conversion layer has a thickness of 70 nm.

Example 3

A photoelectric device is manufactured according to the same method as Example 1 except that the first photoelectric conversion layer has a thickness of 10 nm and the second photoelectric conversion layer has a thickness of 90 nm.

Comparative Example 1

A 150 nm-thick anode is formed by sputtering ITO on a glass substrate and a 5 nm-thick electron auxiliary layer is formed by depositing compound represented by Chemical Formula A thereon. Subsequently, on the electron auxiliary layer, a 100 nm-thick single photoelectric conversion layer is formed by codepositing the compound obtained in Synthesis Example 1 (p-type semiconductor) and C60 (n-type semiconductor) in a volume ratio of 1.3:1. Then, on the photoelectric conversion layer, a 7 nm-thick cathode is formed by sputtering ITO. On the cathode, a 50 nm-thick anti-reflection layer is formed by depositing aluminum oxide (Al$_2$O$_3$), and a glass plate is used for sealing to manufacture a photoelectric device.

Example 4

A 150 nm-thick anode is formed by sputtering ITO on a glass substrate and a 5 nm-thick electron auxiliary layer is formed by depositing Compound represented by Chemical Formula A thereon. Subsequently, on the electron auxiliary layer, a 50 nm-thick first photoelectric conversion layer is formed by codepositing the compound obtained in Synthesis Example 2 (first p-type semiconductor) and C60 (first n-type semiconductor) in a volume ratio of 1:1. Then, a 50 nm-thick second photoelectric conversion layer is formed by codepositing the compound of Synthesis Example 3 (second p-type semiconductor) and C60 (second n-type semiconductor) in a volume ratio of 2:1. Then, on the second photoelectric conversion layer, a 7 nm-thick cathode is formed by sputtering ITO. On the cathode, a 50 nm-thick anti-reflection layer is formed by depositing aluminum oxide ($Al_2O_3$), and a glass plate is used for sealing to manufacture a photoelectric device.

Example 5

A photoelectric device is manufactured according to the same method as Example 4 except that the first photoelectric conversion layer has a thickness of 30 nm and the second photoelectric conversion layer has a thickness of 60 nm.

Example 6

A photoelectric device is manufactured according to the same method as Example 4 except that the first photoelectric conversion layer has a thickness of 10 nm and the second photoelectric conversion layer has a thickness of 90 nm.

Comparative Example 2

A 150 nm-thick anode is formed by sputtering ITO on a glass substrate and a 5 nm-thick electron auxiliary layer is formed by depositing compound represented by Chemical Formula A thereon. Subsequently, on the electron auxiliary layer, a 100 nm-thick single photoelectric conversion layer is formed by codepositing the compound obtained in Synthesis Example 2 (p-type semiconductor) and C60 (n-type semiconductor) in a volume ratio of 1.1:1. Then, on the photoelectric conversion layer, a 7 nm-thick cathode is formed by sputtering ITO. On the cathode, a 50 nm-thick anti-reflection layer is formed by depositing aluminum oxide ($Al_2O_3$), and a glass plate is used for sealing to manufacture a photoelectric device.

Comparative Example 3

A 150 nm-thick anode is formed by sputtering ITO on a glass substrate and a 5 nm-thick electron auxiliary layer is formed by depositing compound represented by Chemical Formula A thereon. Subsequently, on the electron auxiliary layer, a 100 nm-thick single photoelectric conversion layer is formed by codepositing the compound obtained in Synthesis Example 3 (p-type semiconductor) and C60 (n-type semiconductor) in a volume ratio of 2:1. Then, on the photoelectric conversion layer, a 7 nm-thick cathode is formed by sputtering ITO. On the cathode, a 50 nm-thick anti-reflection layer is formed by depositing aluminum oxide ($Al_2O_3$), and a glass plate is used for sealing to manufacture a photoelectric device.

Evaluation I

Optical properties of the photoelectric device according to Examples 1 to 6 and Comparative Examples 1 and 2 are evaluated.

The results are shown in Table 1 and 2.

TABLE 1

|  | $\lambda_{max}$ (nm) | FWHM (nm) |
| --- | --- | --- |
| Example 1 | 550 | 119 |
| Example 2 | 545 | 113 |
| Example 3 | 545 | 112 |
| Comparative Example 1 | 550 | 120 |

TABLE 2

|  | $\lambda_{max}$ (nm) | FWHM (nm) |
| --- | --- | --- |
| Example 4 | 540 | 117 |
| Example 5 | 540 | 106 |
| Example 6 | 535 | 106 |
| Comparative Example 2 | 540 | 120 |

Referring to Table 1, the photoelectric devices according to Examples 1 to 3 exhibit narrow light-absorption full widths at half maximum (FWHM) compared with the photoelectric device according to Comparative Example 1, and from the results, the photoelectric devices according to Examples 1 to 3 have wavelength selectivity compared with the photoelectric device according to Comparative Example 1.

Likewise, referring to Table 2, the photoelectric devices according to Examples 4 to 6 exhibit narrow light-absorption full widths at half maximum (FWHM) compared with the photoelectric device according to Comparative Example 2, and from the results, the photoelectric devices according to Examples 4 to 6 have wavelength selectivity compared with the photoelectric device according to Comparative Example 2.

Evaluation II

External quantum efficiency (EQE) of the photoelectric devices according to Examples 1 to 6 and Comparative Examples 1 and 2 are evaluated.

The external quantum efficiency (EQE) is evaluated at 3V at a peak absorption wavelength ($\lambda_{max}$) and at a wavelength of 450 nm using an Incident Photon to Current Efficiency (IPCE) method.

The results are shown in Tables 3 and 4.

TABLE 3

|  | $\lambda_{max}$ (nm) | $EQE_{\lambda max}$ (%) | $EQE_{450\,nm}$ (%) | $EQE_{max}/EQE_{450\,nm}$ |
| --- | --- | --- | --- | --- |
| Example 1 | 550 | 65 | 17 | 3.82 |
| Example 2 | 545 | 63 | 16 | 3.94 |
| Example 3 | 545 | 63 | 17 | 3.71 |
| Comparative Example 1 | 550 | 65 | 20 | 3.25 |

TABLE 4

|  | $\lambda_{max}$ (nm) | $EQE_{\lambda max}$ (%) | $EQE_{450\,nm}$ (%) | $EQE_{max}/EQE_{450\,nm}$ |
| --- | --- | --- | --- | --- |
| Example 4 | 540 | 65 | 20 | 3.25 |
| Example 5 | 540 | 63 | 19 | 3.32 |
| Example 6 | 535 | 63 | 18 | 3.50 |
| Comparative Example 2 | 540 | 67 | 29 | 2.31 |

Referring to Table 3, the photoelectric devices according to Examples 1 to 3 exhibit high external quantum efficiency at a peak absorption wavelength ($\lambda_{max}$) and low external quantum efficiency at a wavelength of 450 nm compared with the photoelectric device according to Comparative Example 1, and from the results, the photoelectric devices according to Examples 1 to 3 have wavelength selectivity compared with the photoelectric device according to Comparative Example 1.

Likewise, referring to Table 4, the photoelectric devices according to Examples 4 to 6 exhibit high external quantum efficiency at a peak absorption wavelength ($\lambda_{max}$) and low external quantum efficiency at a wavelength of 450 nm compared with the photoelectric device according to Comparative Example 2, and from the results, the photoelectric devices according to Examples 4 to 6 have wavelength selectivity compared with the photoelectric device according to Comparative Example 2.

Evaluation III

Thermal resistance properties of the photoelectric devices according to Examples 1 to 6 and Comparative Examples 1 and 2 are evaluated.

The thermal resistance properties are confirmed from variation ratios of the external quantum efficiency (EQE) after placing the photoelectric devices according to Examples 1 to 6 and Comparative Example 3 at 170° C. for 3 hours.

The results are shown in Table 5.

TABLE 5

|  | ΔEQE (%) |
| --- | --- |
| Example 1 | 3.5 |
| Example 2 | 3.3 |
| Example 3 | 4 |
| Example 4 | 3.8 |
| Example 5 | 1.9 |
| Example 6 | 3.2 |
| Comparative Example 3 | 25 |

Referring to Table 5, the photoelectric devices according to Examples 1 to 6 exhibit small changes of the external quantum efficiency after placing them at a high temperature compared with the photoelectric device according to Comparative Example 3.

Evaluation IV

Image sensors including the photoelectric devices according to Examples and Comparative Examples having structure shown in FIGS. 3 and 4 are designed and optical cross-talk of each image sensor is measured.

The optical cross-talk is evaluated by dividing a visible ray wavelength spectrum of light into three regions of greater than or equal to about 400 nm and less than about 440 nm (blue), about 520 nm to 560 nm (green), and greater than about 630 nm and less than or equal to about 670 nm and then, evaluating how much other light conversion devices in each region are optically interfered.

That is, optical cross-talk in a green wavelength spectrum of light is indicated by a relative integral of sensitivity curves of the blue photoelectric device and the red photoelectric device in 520 nm to 560 nm when an integral of sensitivity curve of the green photoelectric device in 520 nm to 560 nm is 100.

As the optical cross-talk is smaller, cross-talk of the image sensors are lowered and color mixing in a green wavelength spectrum of light is decreased.

The results are shown in Table 6.

TABLE 6

|  | C.T (%) |
| --- | --- |
| Example 3 | 12.3 |
| Example 6 | 12.0 |
| Comparative Example 1 | 20.2 |
| Comparative Example 2 | 15.0 |

Referring to Table 6, the image sensors including photoelectric devices according to Examples exhibit smaller optical cross-talk compared with the image sensors including the photoelectric device according to Comparative Examples.

Evaluation V

Image sensors including the photoelectric devices according to Examples and Comparative Examples having structure shown in FIGS. 3 and 4 are designed and color differences of each image sensor are measured.

The color difference of the image sensor is evaluated in the following method.

A RGB raw signal obtained from the image sensor is image-processed to reduce a difference from a real color.

The image processing includes a white balance process of unifying intensity of the RGB raw signal and a color correction process of reducing a color difference between an actual color of Macbeth chart (24 colors) and a primary color obtained from the image sensor.

The color correction process expresses a color by converting the RGB raw signal measured from the image sensor through a color correction matrix (CCM), and color characteristics of the image sensor may be evaluated by digitalizing a color difference of the converted color from the actual color of the Macbeth chart.

The color difference indicates a difference from an actual color in the Macbeth chart, and as the color difference is smaller, a color may be closer to the actual color.

The results are shown in Table 7.

TABLE 7

|  | Color difference (ΔEab) |
| --- | --- |
| Example 3 | 2.7 |
| Example 6 | 2.7 |
| Comparative Example 1 | 4.3 |
| Comparative Example 3 | 3.0 |

Referring to Table 7, image sensors including the photoelectric device according to Examples exhibit smaller color difference compared with image sensors including the photoelectric device according to Comparative Examples.

From the results, it is expected that the image sensors including the photoelectric device according to some example embodiments will show improved color reproducibility compared with the image sensors including the photoelectric device according to Comparative Examples.

While this disclosure has been described in connection with what is presently considered to be at least some of the practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A photoelectric device, comprising:
a first electrode;
a second electrode; and
a first photoelectric conversion layer and a second photoelectric conversion layer between the first electrode and the second electrode,
wherein the first photoelectric conversion layer includes a first p-type semiconductor and a first n-type semiconductor to form a first heterojunction,
wherein the second photoelectric conversion layer includes a second p-type semiconductor and a second n-type semiconductor to form a second heterojunction, and wherein the first photoelectric conversion layer is associated with a first peak absorption wavelength ($\lambda_{max1}$), the second photoelectric conversion layer is associated with a second peak absorption wavelength ($\lambda_{max2}$), both of the first peak absorption wavelength and the second peak absorption wavelength are included in a common wavelength spectrum of light, the common wavelength spectrum of light being one wavelength spectrum of light of about 410 nm to about 480 nm, about 510 nm to about 560 nm, about 620 nm to about 670 nm, or about 780 nm to about 1200 nm.

2. The photoelectric device of claim 1, wherein a light-absorption full width at half maximum (FWHM) of the second photoelectric conversion layer is narrower than an FWHM of the first photoelectric conversion layer.

3. The photoelectric device of claim 2, wherein
the FWHM of the second photoelectric conversion layer is less than or equal to about 110 nm, and
the FWHM of the first photoelectric conversion layer is greater than or equal to about 100 nm.

4. The photoelectric device of claim 2, wherein an FWHM of the second p-type semiconductor is narrower than an FWHM of the first p-type semiconductor.

5. The photoelectric device of claim 1, wherein an extinction coefficient at the second peak absorption wavelength ($\lambda_{max2}$) is greater than an extinction coefficient at the first peak absorption wavelength ($\lambda_{max1}$).

6. The photoelectric device of claim 5, wherein the extinction coefficient at the second peak absorption wavelength ($\lambda_{max2}$) is greater than or equal to about $6.5 \times 10^4$ cm$^{-1}$.

7. The photoelectric device of claim 1, wherein external quantum efficiency at the second peak absorption wavelength ($\lambda_{max2}$) is greater than external quantum efficiency at the first peak absorption wavelength ($\lambda_{max1}$).

8. The photoelectric device of claim 7, wherein external quantum efficiency at the second peak absorption wavelength ($\lambda_{max2}$) is greater than or equal to about 60%.

9. The photoelectric device of claim 1, wherein
the common wavelength spectrum of light is in a wavelength spectrum of light of about 510 nm to about 560 nm.

10. The photoelectric device of claim 9, wherein external quantum efficiency at a peak absorption wavelength and external quantum efficiency at 450 nm of the first photoelectric conversion layer and the second photoelectric conversion layer satisfy Relationship Equation 1, $$EQE(2)_{\lambda max2}/EQE(2)_{450\,nm} > EQE(1)_{\lambda max1}/EQE(1)_{450\,nm}$$ [Relationship Equation 1]

wherein, in Relationship Equation 1,
$EQE(2)_{\lambda max2}$ is external quantum efficiency at the second peak absorption wavelength ($\lambda_{max2}$),
$EQE(2)_{450\,nm}$ is external quantum efficiency at a wavelength of 450 nm of the second photoelectric conversion layer,
$EQE(1)_{\lambda max1}$ is external quantum efficiency at the first peak absorption wavelength ($\lambda_{max1}$), and
$EQE(1)_{450\,nm}$ is external quantum efficiency at a wavelength of 450 nm of the first photoelectric conversion layer.

11. The photoelectric device of claim 9, wherein the second peak absorption wavelength ($\lambda_{max2}$) is in a wavelength spectrum of light of about 530 nm to about 550 nm.

12. The photoelectric device of claim 1, wherein a melting point of the first p-type semiconductor is higher than a melting point of the second p-type semiconductor.

13. The photoelectric device of claim 1, wherein charge mobility of the first photoelectric conversion layer is higher than charge mobility of the second photoelectric conversion layer.

14. The photoelectric device of claim 1, wherein a HOMO energy level of the first photoelectric conversion layer is shallower than a HOMO energy level of the second photoelectric conversion layer.

15. The photoelectric device of claim 1, wherein
each of a HOMO energy level of the first photoelectric conversion layer and a HOMO energy level of the second photoelectric conversion layer is about 5.30 eV to about 5.80 eV, and
the HOMO energy level of the first photoelectric conversion layer is shallower than the HOMO energy level of the second photoelectric conversion layer by about 0.02 eV.

16. The photoelectric device of claim 1, wherein the first n-type semiconductor and the second n-type semiconductor are the same.

17. The photoelectric device of claim 1, wherein the first n-type semiconductor and the second n-type semiconductor each separately include fullerene or a fullerene derivative.

18. The photoelectric device of claim 1, wherein the second photoelectric conversion layer is disposed to be nearer to a light receiving side than the first photoelectric conversion layer.

19. The photoelectric device of claim 1, wherein a thickness of the second photoelectric conversion layer is equal to or greater than a thickness of the first photoelectric conversion layer.

20. An image sensor comprising the photoelectric device of claim 1.

21. An electronic device comprising the photoelectric device of claim 1.

* * * * *